United States Patent [19]
Kent

[11] Patent Number: 5,986,224
[45] Date of Patent: Nov. 16, 1999

[54] ACOUSTIC CONDITION SENSOR EMPLOYING A PLURALITY OF MUTUALLY NON-ORTHOGONAL WAVES

[75] Inventor: Joel Kent, Fremont, Calif.

[73] Assignee: Elo TouchSystems, Inc., Fremont, Calif.

[21] Appl. No.: 09/220,302

[22] Filed: Dec. 23, 1998

Related U.S. Application Data

[60] Division of application No. 08/695,716, Aug. 12, 1996, Pat. No. 5,854,450, which is a continuation-in-part of application No. 08/424,216, Apr. 19, 1995, Pat. No. 5,591,945.

[51] Int. Cl.⁶ .................................................. G08C 21/00
[52] U.S. Cl. ..................................... 178/18.04; 178/18.01; 178/18.03
[58] Field of Search .............................. 178/18.01, 18.03, 178/18.04, 19.02; 345/173, 177; 367/907

[56] References Cited

U.S. PATENT DOCUMENTS

| | | | |
|---|---|---|---|
| 4,642,423 | 2/1987 | Adler | 178/18.01 |
| 4,644,100 | 2/1987 | Brenner et al. | 178/18.03 |
| 4,746,914 | 5/1988 | Adler | 345/177 |
| 5,072,427 | 12/1991 | Knowles | 178/18.04 |
| 5,129,262 | 7/1992 | White et al. | 345/177 |
| 5,451,723 | 9/1995 | Huang et al. | 178/18.04 |

*Primary Examiner*—Vijay Shankar
*Attorney, Agent, or Firm*—Milde, Hoffberg & Macklin, LLP

[57] ABSTRACT

A touch sensor, having an acoustic wave transmissive medium having a surface and a touch sensitive portion of the surface, a transducer system for emitting acoustic energy into the medium, and a receiver system for receiving the acoustic energy from the substrate as at least two distinct sets of waves, a portion of each of which overlap temporally at the receiver system or overlap physically by propagating in the touch sensitive portion along axes which are substantially non-orthogonal, the receiver system determining a position or a waveform perturbing characteristic of a touch on the touch sensitive portion. The receiver may be an amplitude detector or be sensitive to a phase-amplitude characteristic of the received acoustic waves.

19 Claims, 36 Drawing Sheets

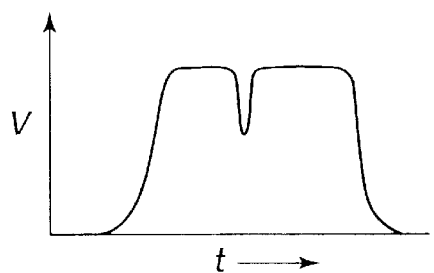
Fig. 9A
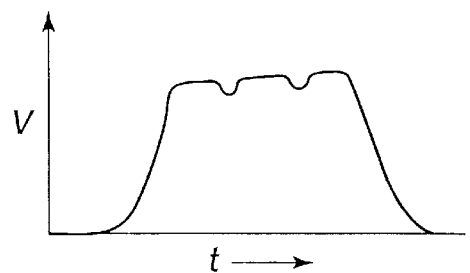
Fig. 9B
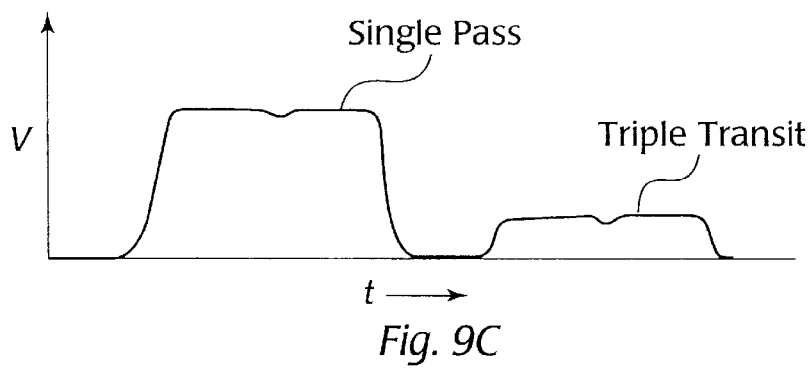
Fig. 9C
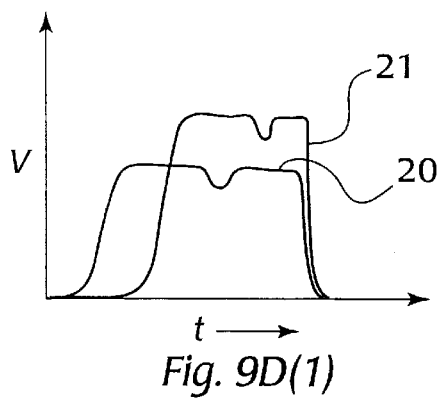
Fig. 9D(1)
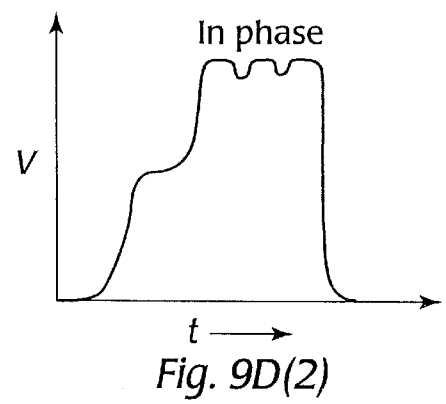
Fig. 9D(2)
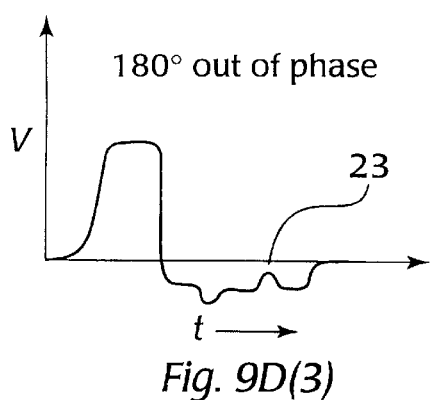
Fig. 9D(3)
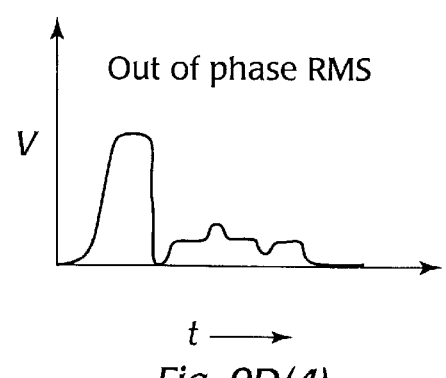
Fig. 9D(4)

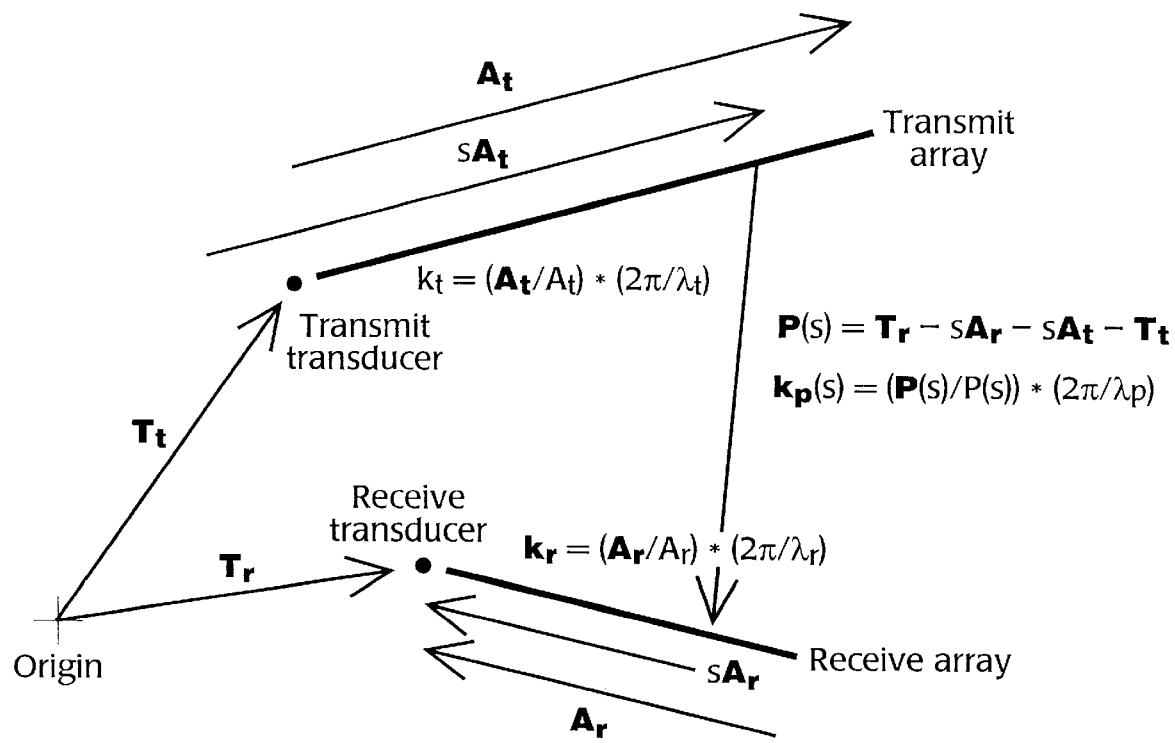
Fig. 10 - Planar coordinate subsystem

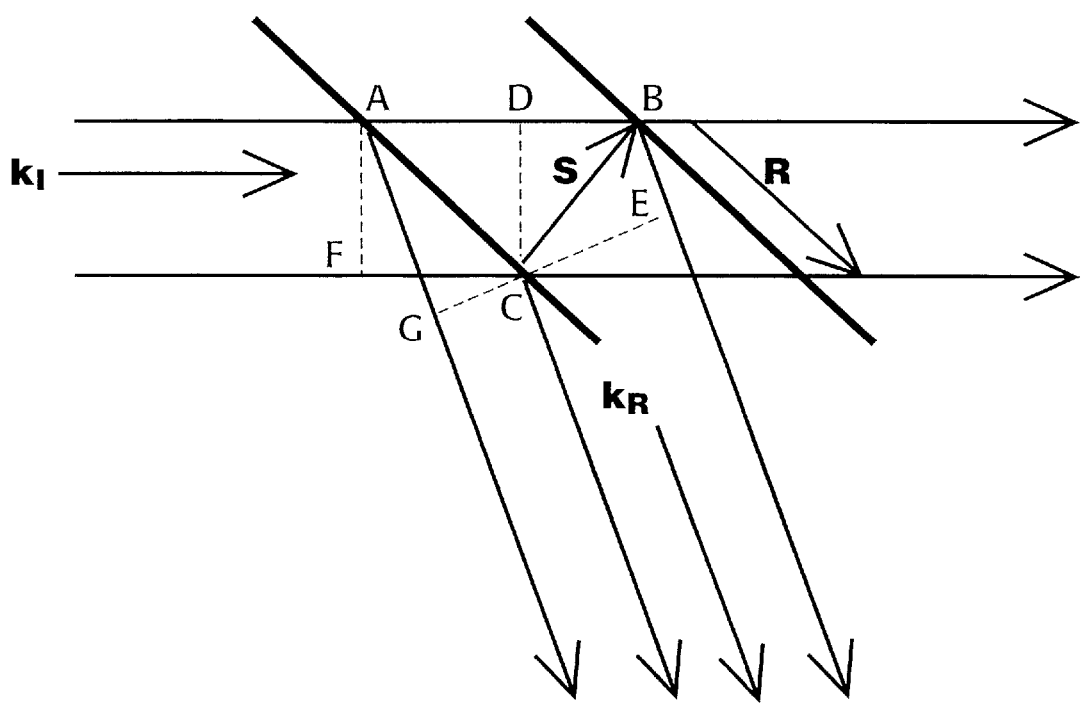
Fig. 11 - Array reflector spacing and orientation

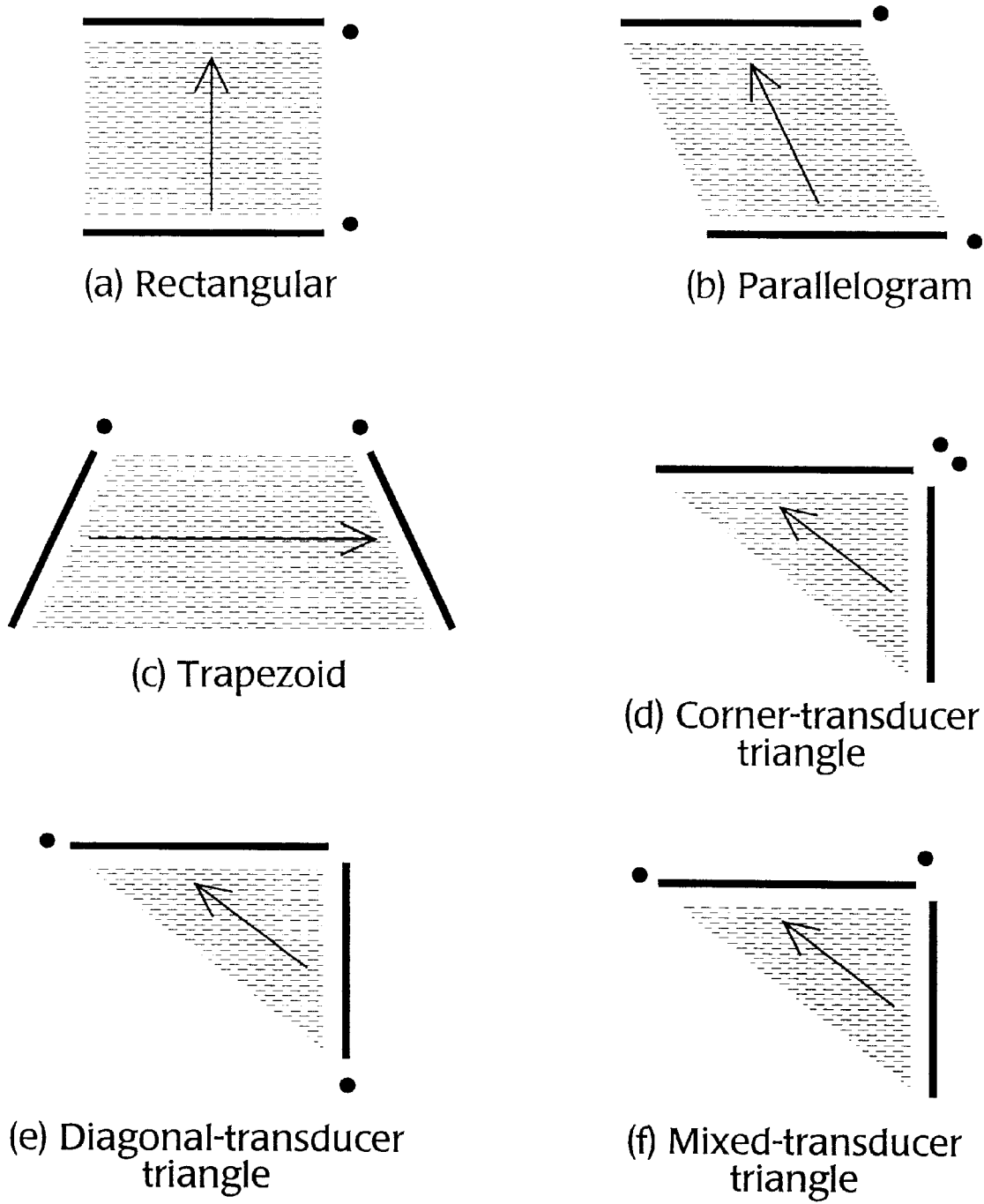
Fig. 12 - Example touch region geometries

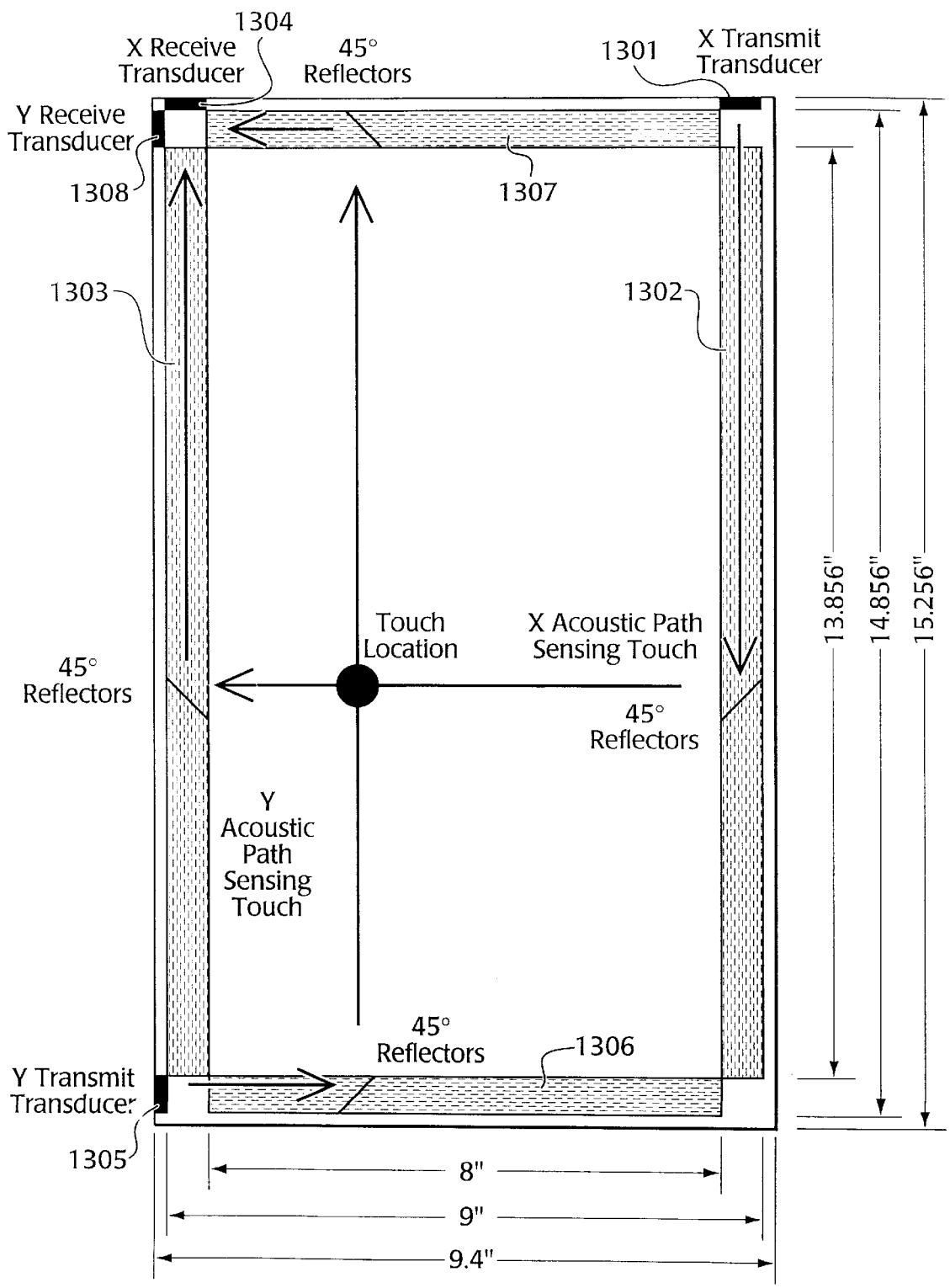
Figure 13 - X, Y, 30° Sensor: (a) X & Y Subsystems

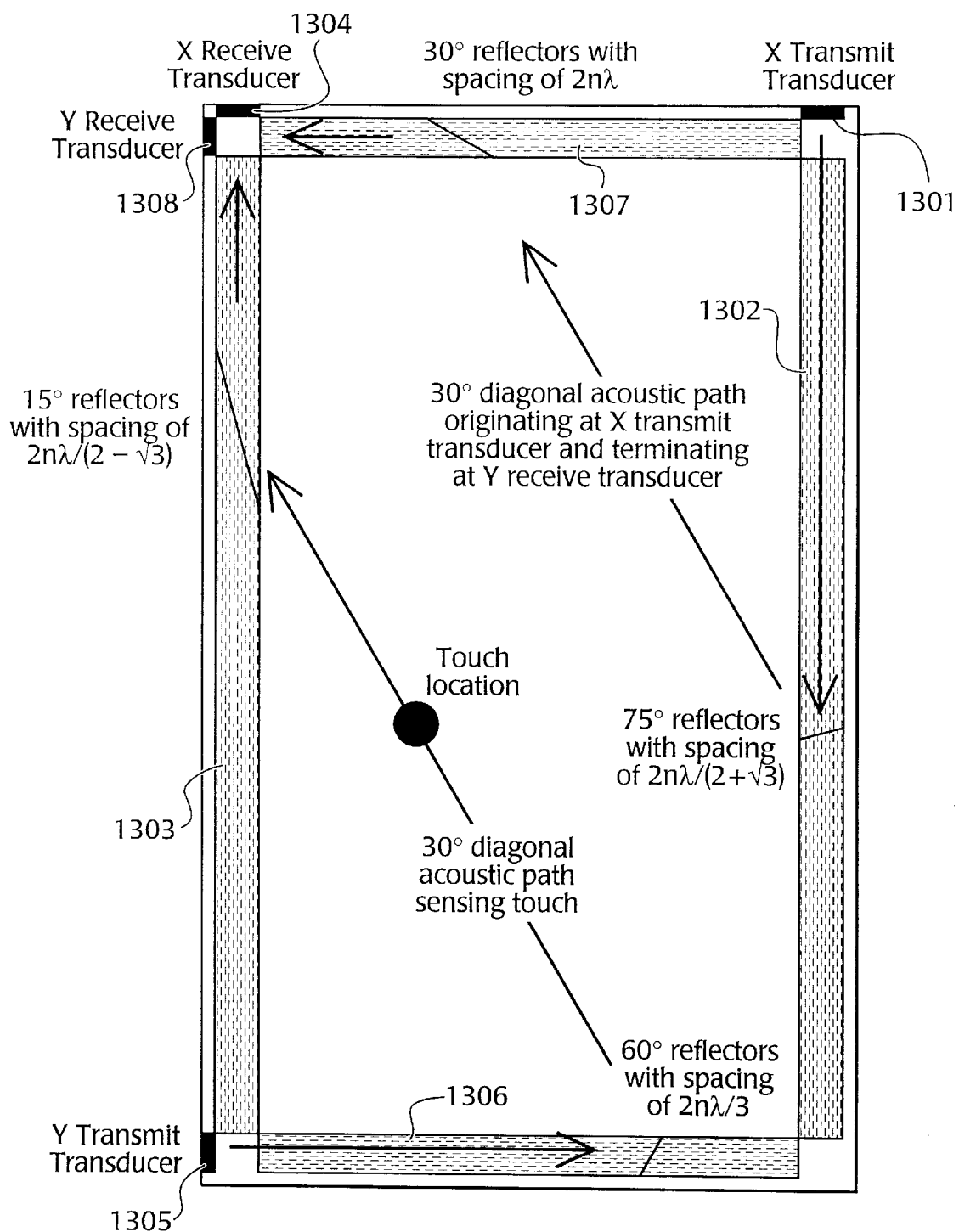
Figure 13 - X, Y, 30° Sensor: (b) Diagonal Subsystems

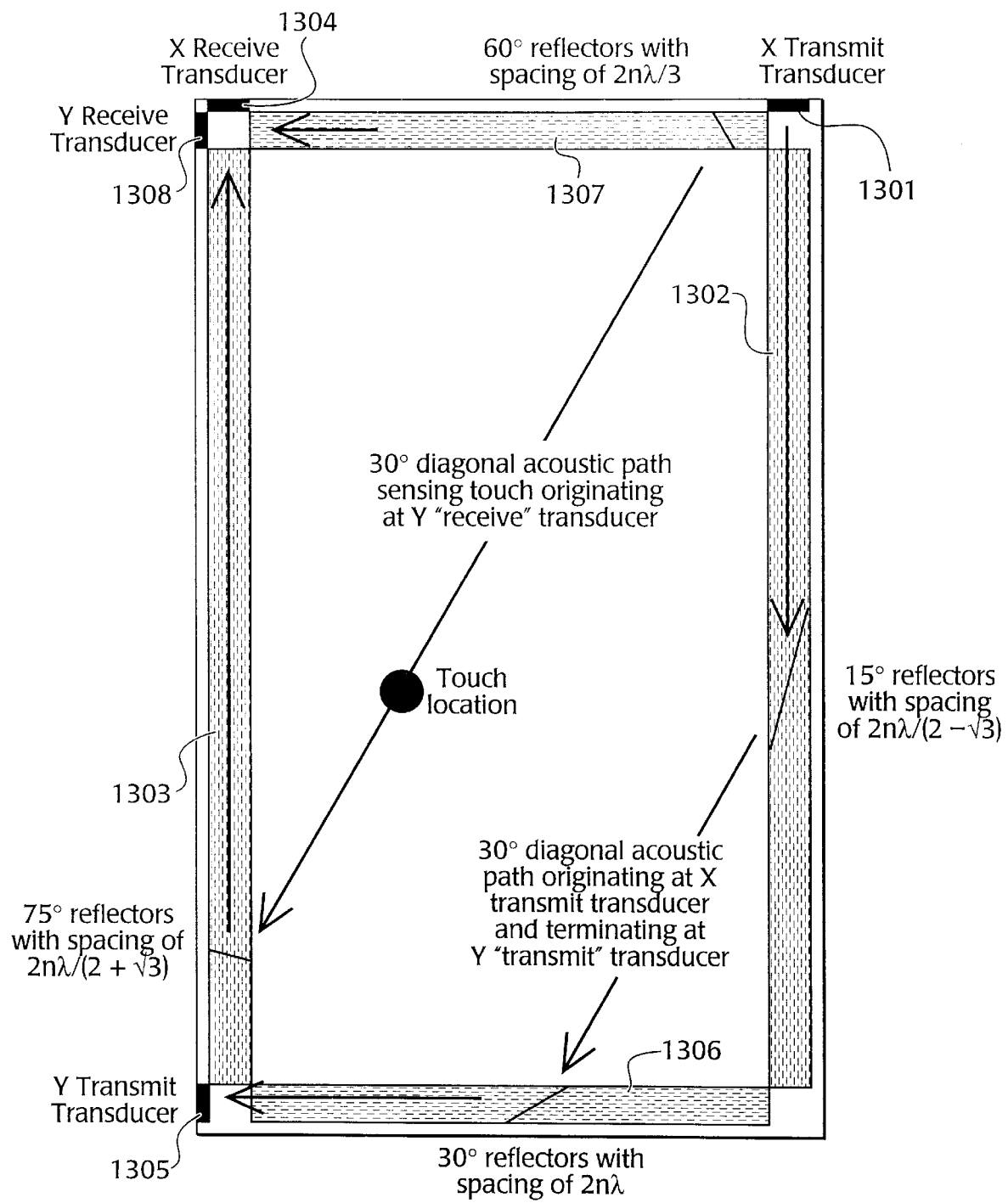
*Figure 14 - V Subsystem of X,Y,U,V Sensor*

Fig. 15 - Nonrectangular sensor
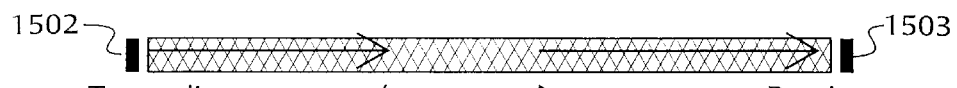
(a) Reflective array detail
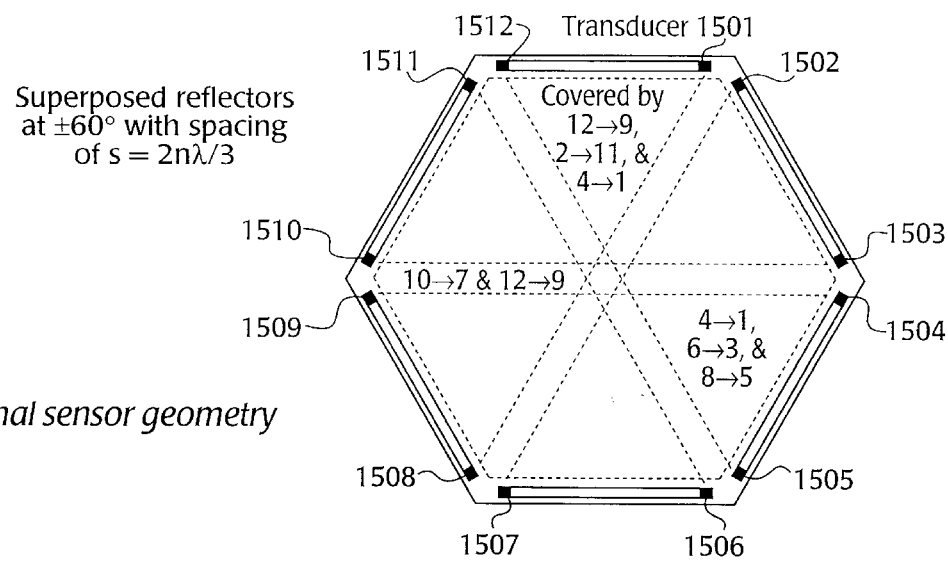
(b) Hexagonal sensor geometry
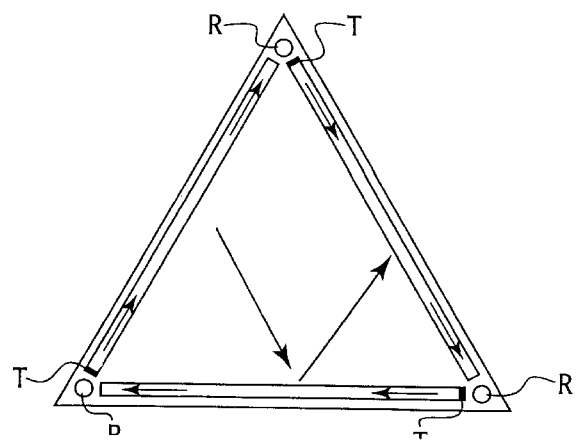
(c) Triangular sensor geometry Fig. 16 - Large rectangular sensor
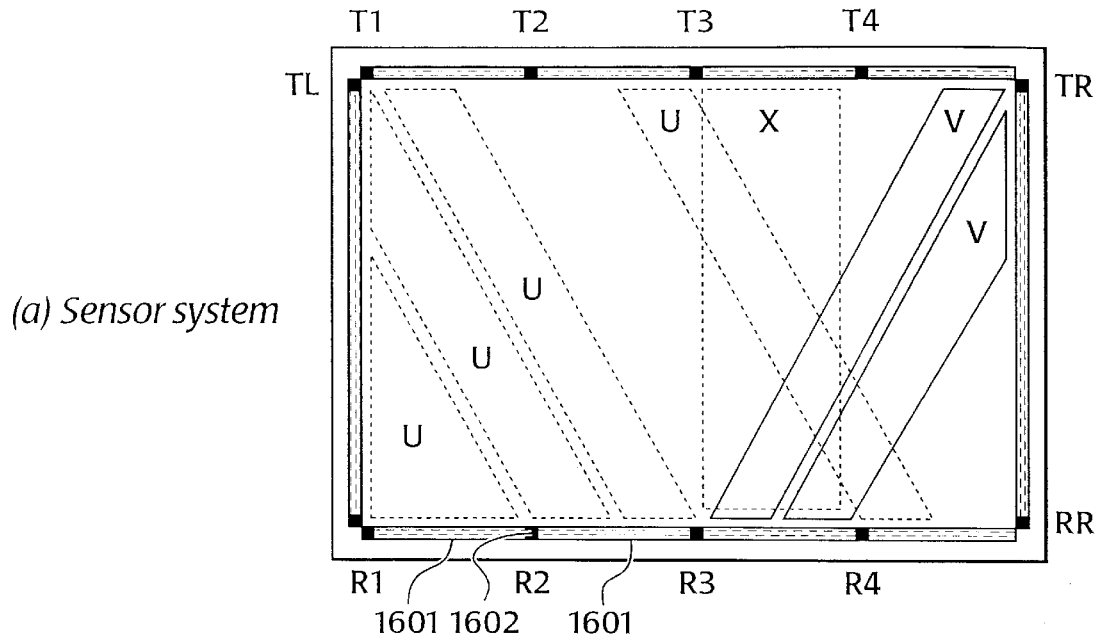
(a) Sensor system
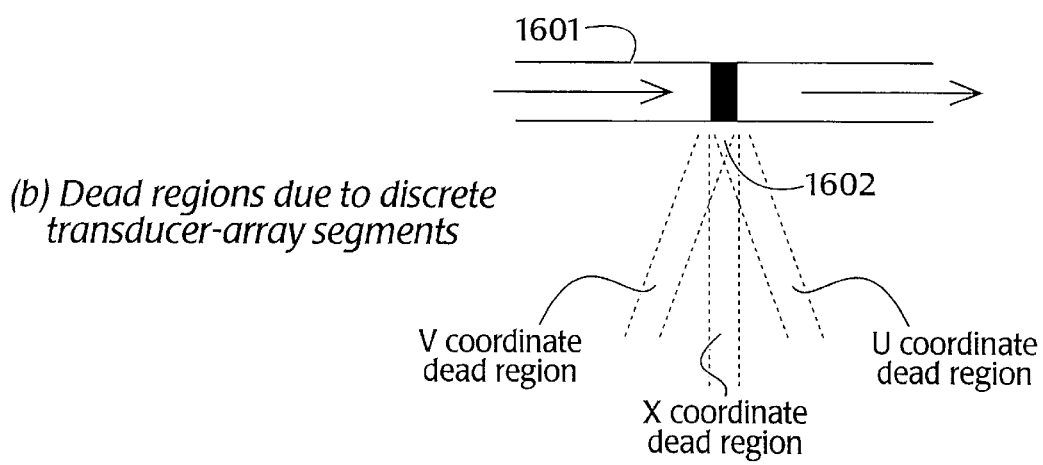
(b) Dead regions due to discrete transducer-array segments
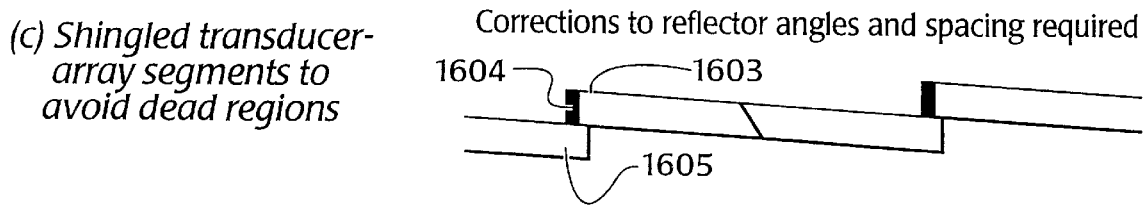
(c) Shingled transducer-array segments to avoid dead regions
Corrections to reflector angles and spacing required

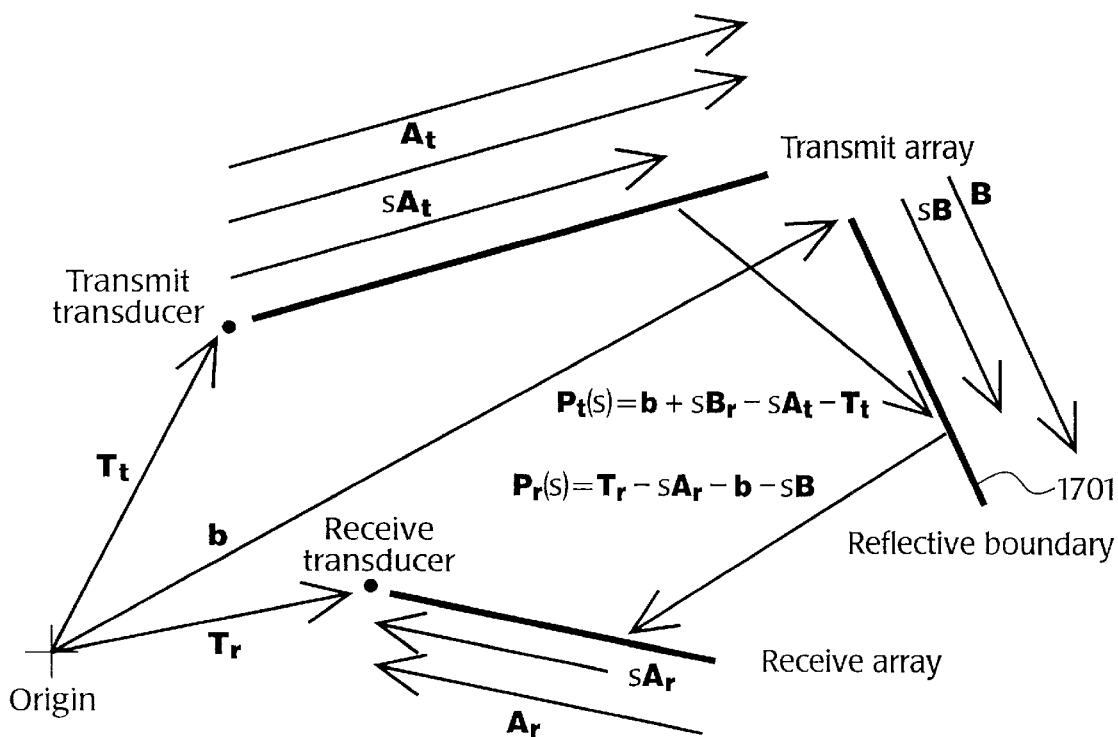
Fig. 17 - Coordinate subsystem wih scattering
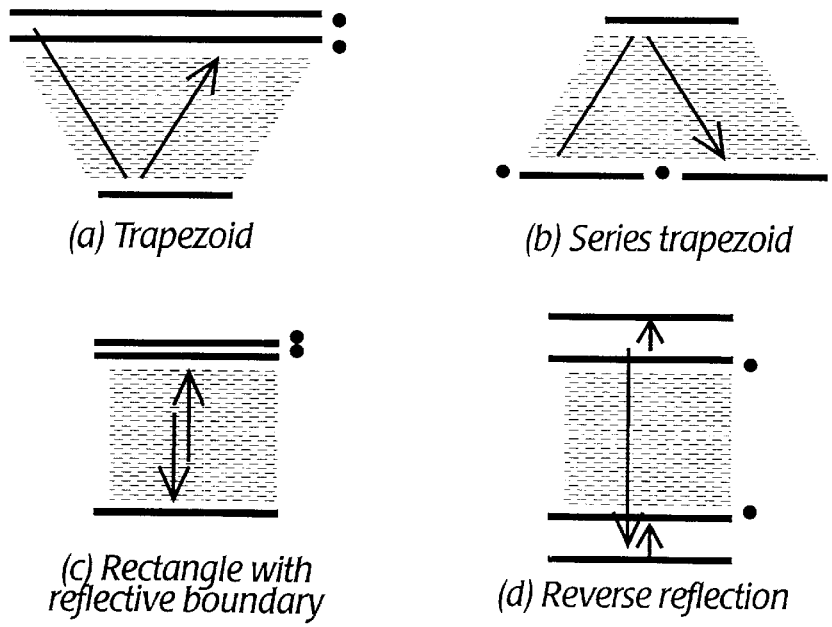
(a) Trapezoid
(b) Series trapezoid
(c) Rectangle with reflective boundary
(d) Reverse reflection
Fig. 18 - Example touch region boundaries Fig. 19 - Example cylindrical sensor
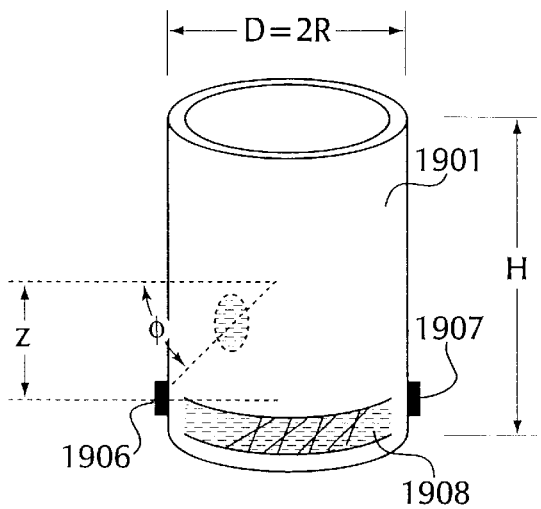
(a) Isometric view
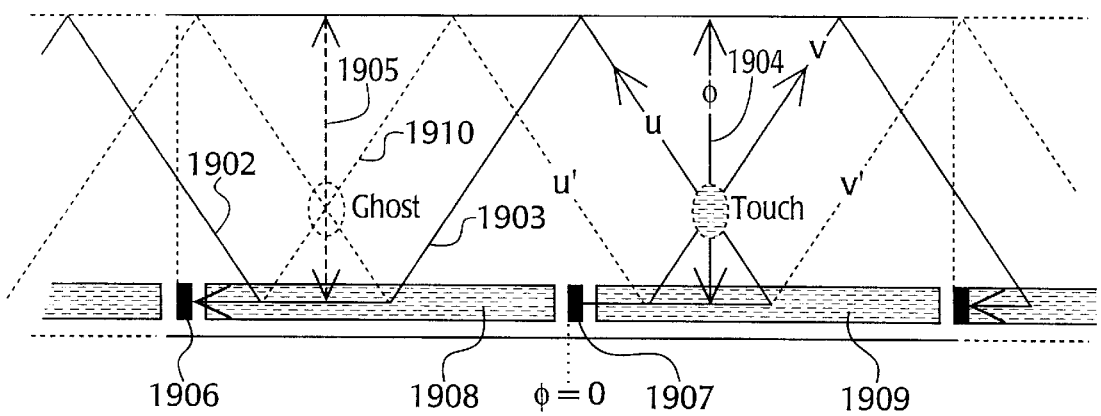
(b) "Planar" sensor with periodic extensions Fig. 20 - Sensor subsystem on non-planar surface
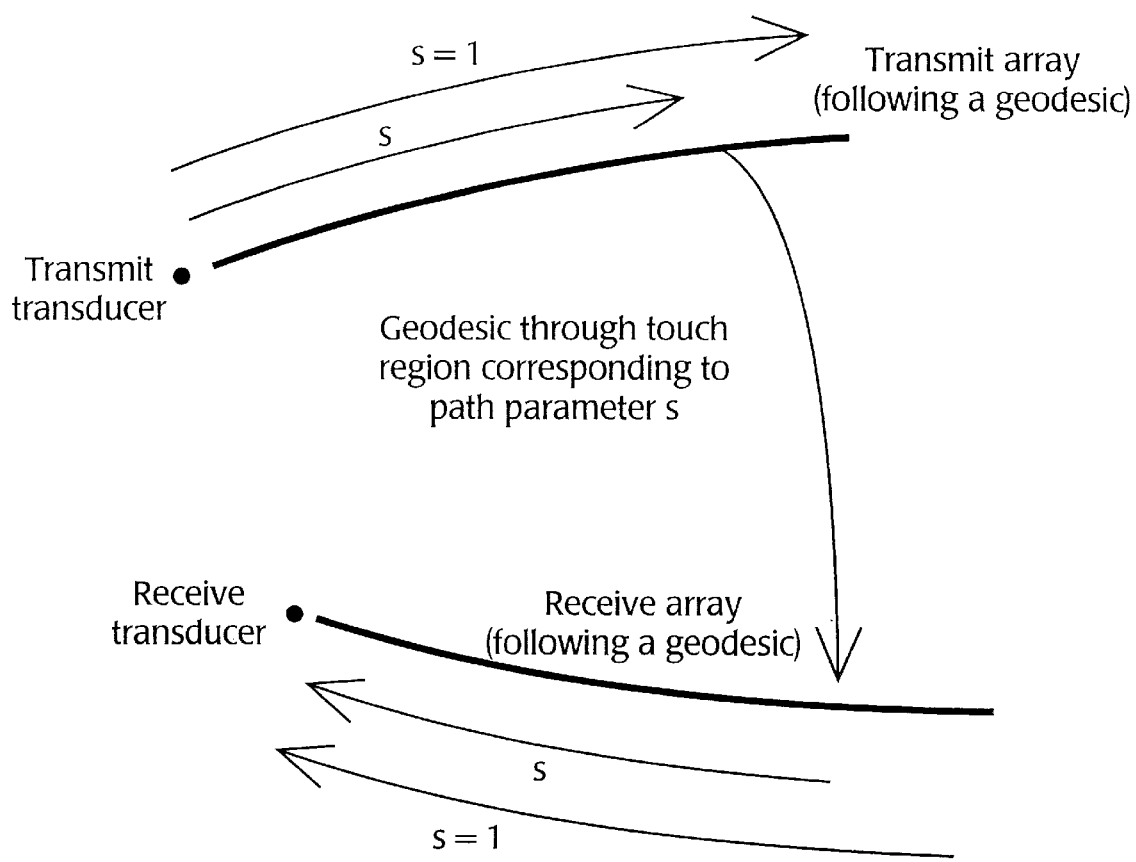

*Fig. 21 - Spherical cap sensor*
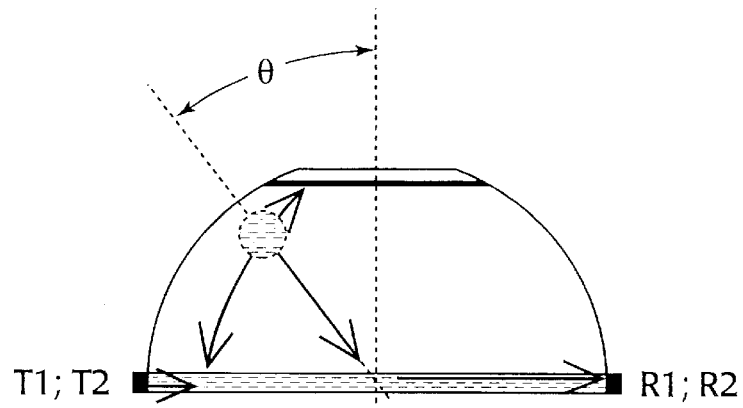
Two arrays on equator with superimposed $45° - \theta/2$, $45°$, $45° + \theta/2$ reflectors
*(a) Side view*
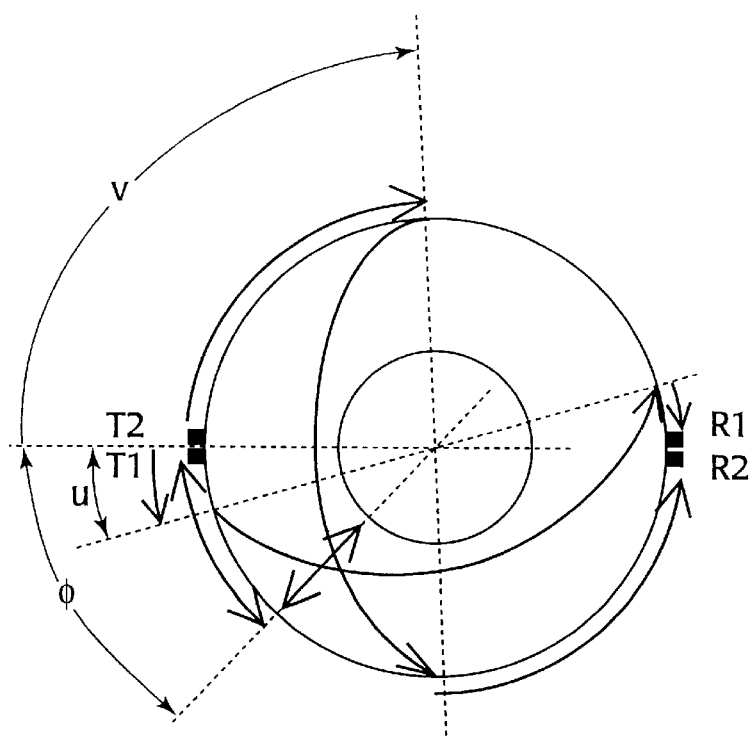
*(b) Top view*

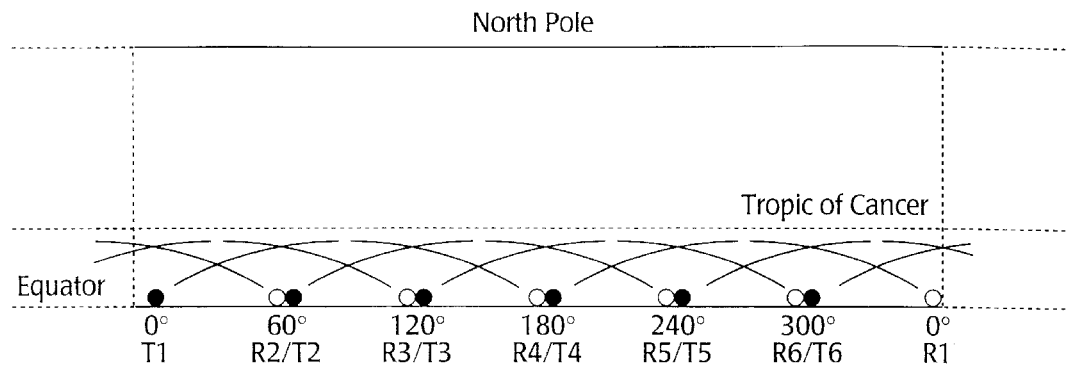
Fig. 21 (c) Alternate spherical layout, flat-map projection of arrays and transducers
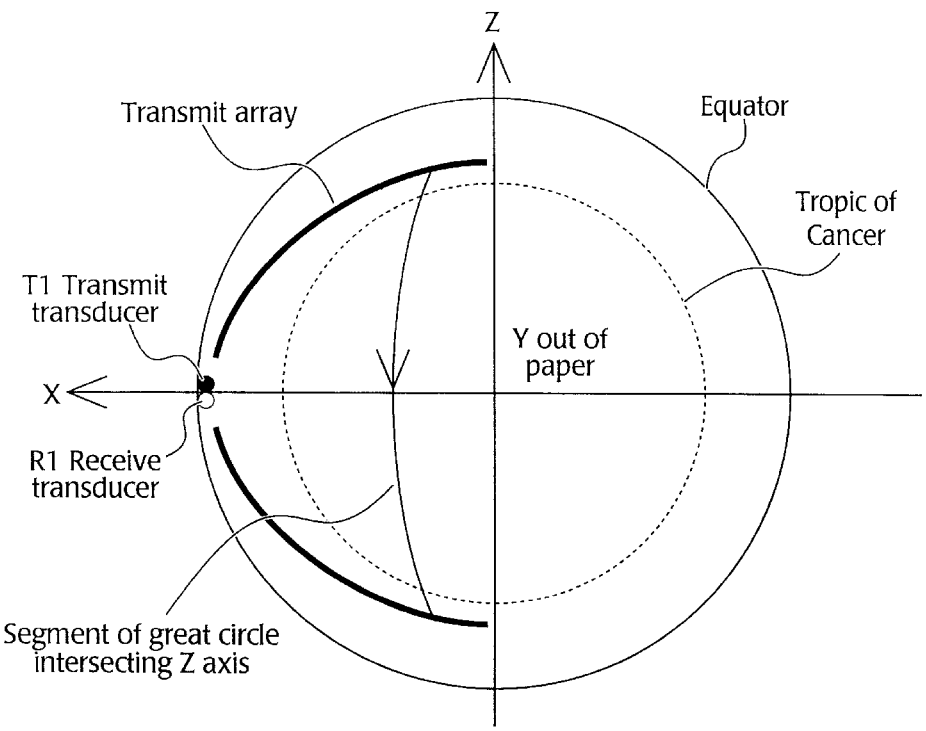
Fig. 21 (d) Top view of first sensor subsystem of alternate spherical sensor layout Fig. 22 - Basin sensor
(a) Isometric view
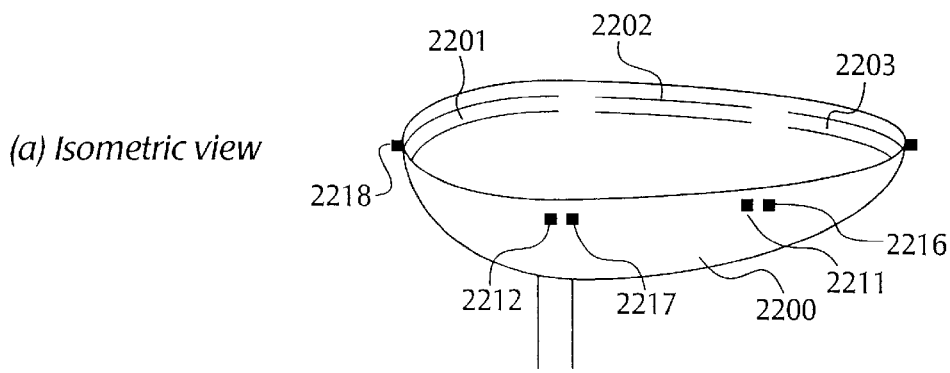
(b) Plan view
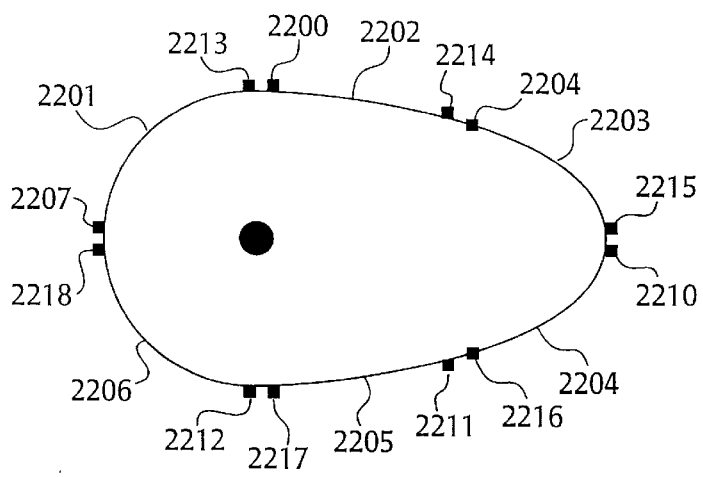
(c) Half-hemisphere sensor
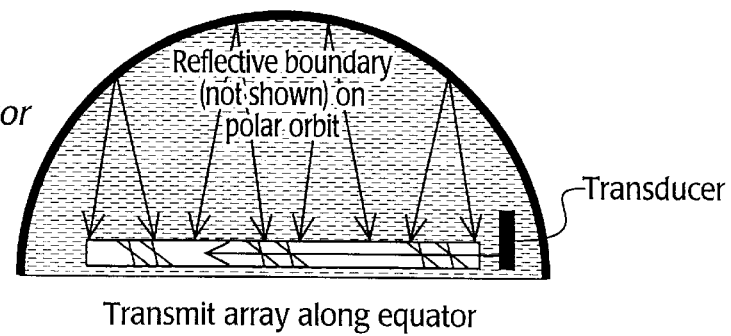
Transmit array along equator

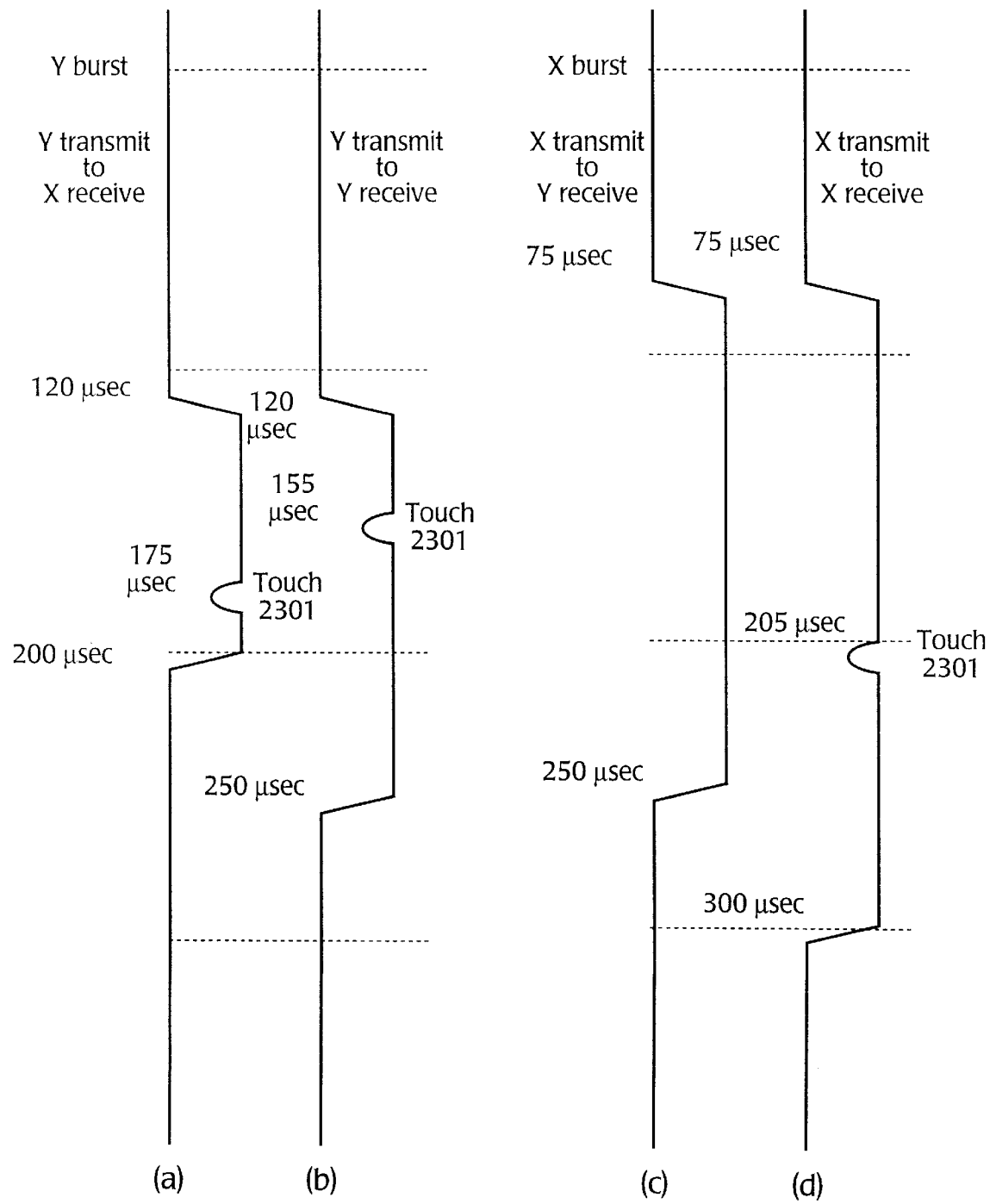
Fig. 23 - Example signals of sensor in Fig. 13

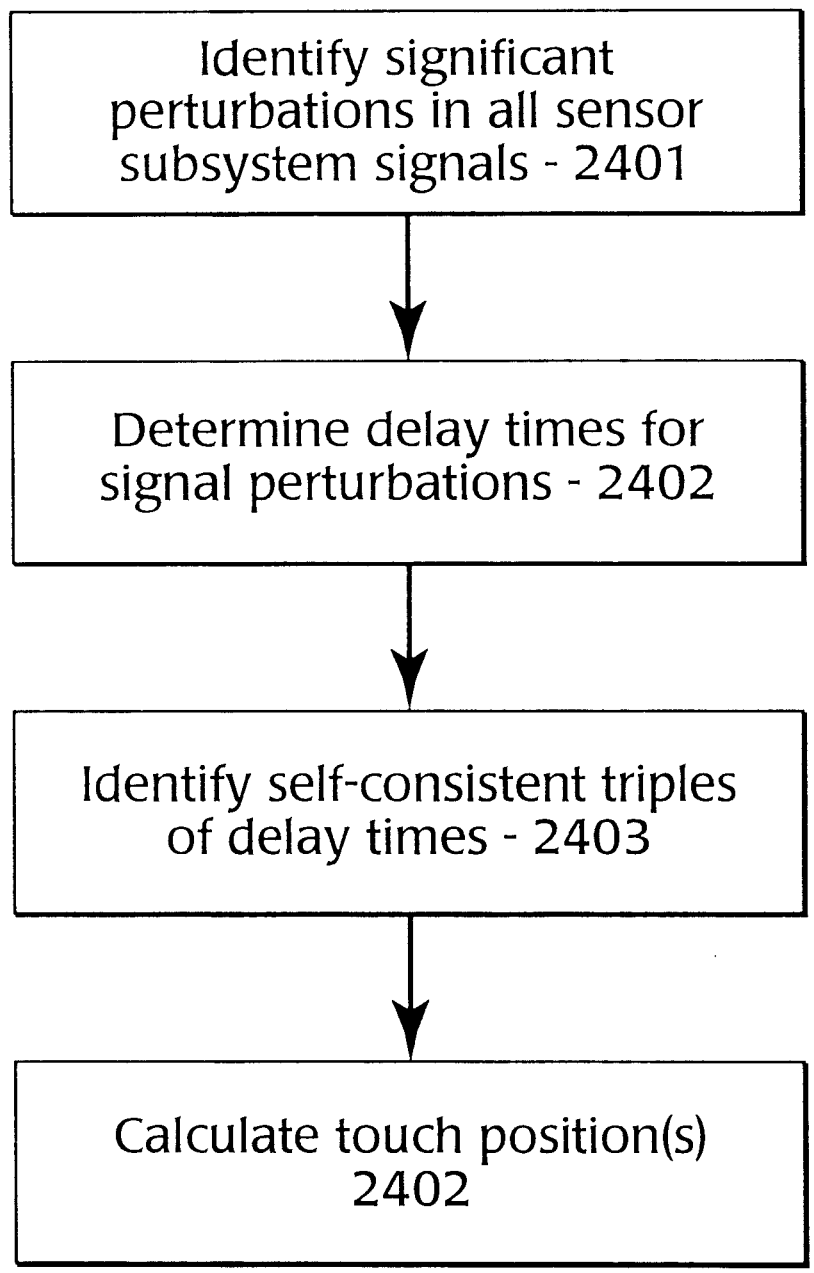
Fig. 24 (a) - Redundancy-check algorithm

Multiple-Touch/Redundancy-Check Algorithm Flow Chart

Equation 1: Predicted dip time = $(1/V) * \{[\sqrt{(H^2 + W^2)} + W - H]/W\} * (X - W - (W/H)*Y)$
Equation 2: Predicted dip time = $(1/V) * \{[\sqrt{(H^2 + W^2)} + H - W]/W\} * (X + W - (W/H)*Y)$

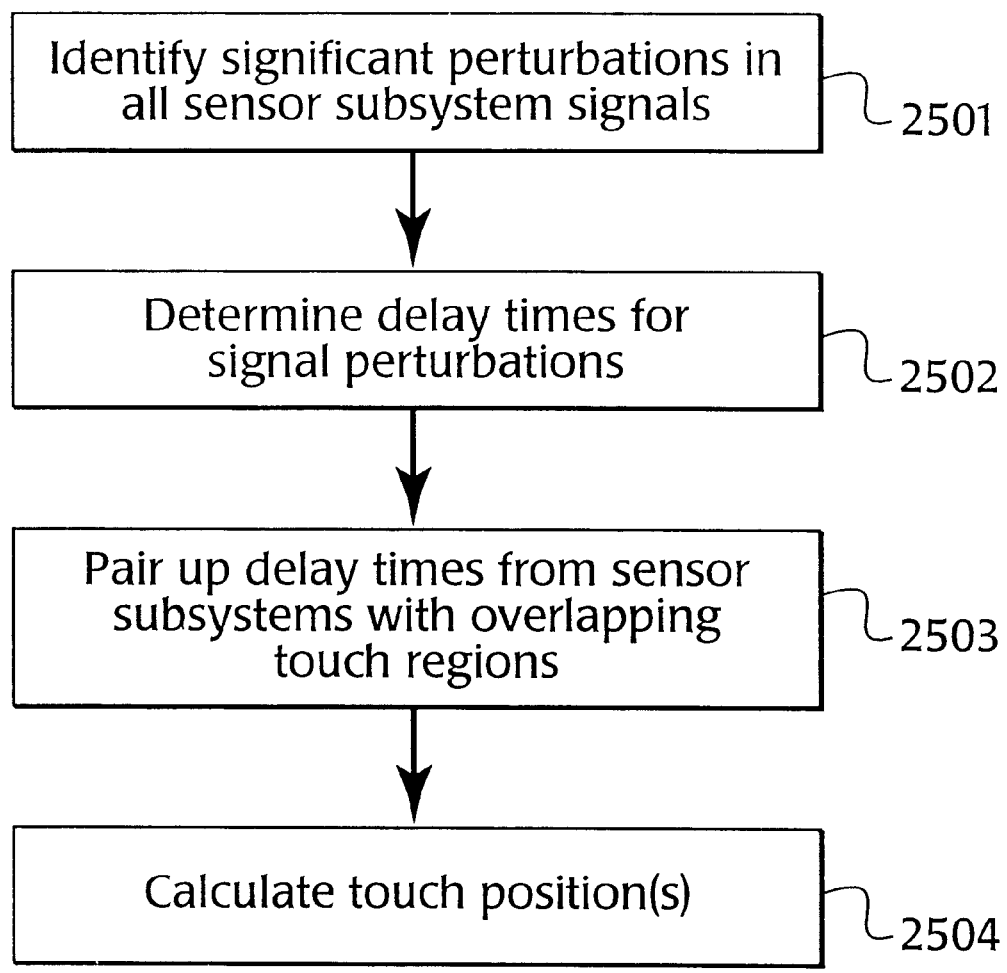
Fig. 25(a) - Anti-shadowing algorithm

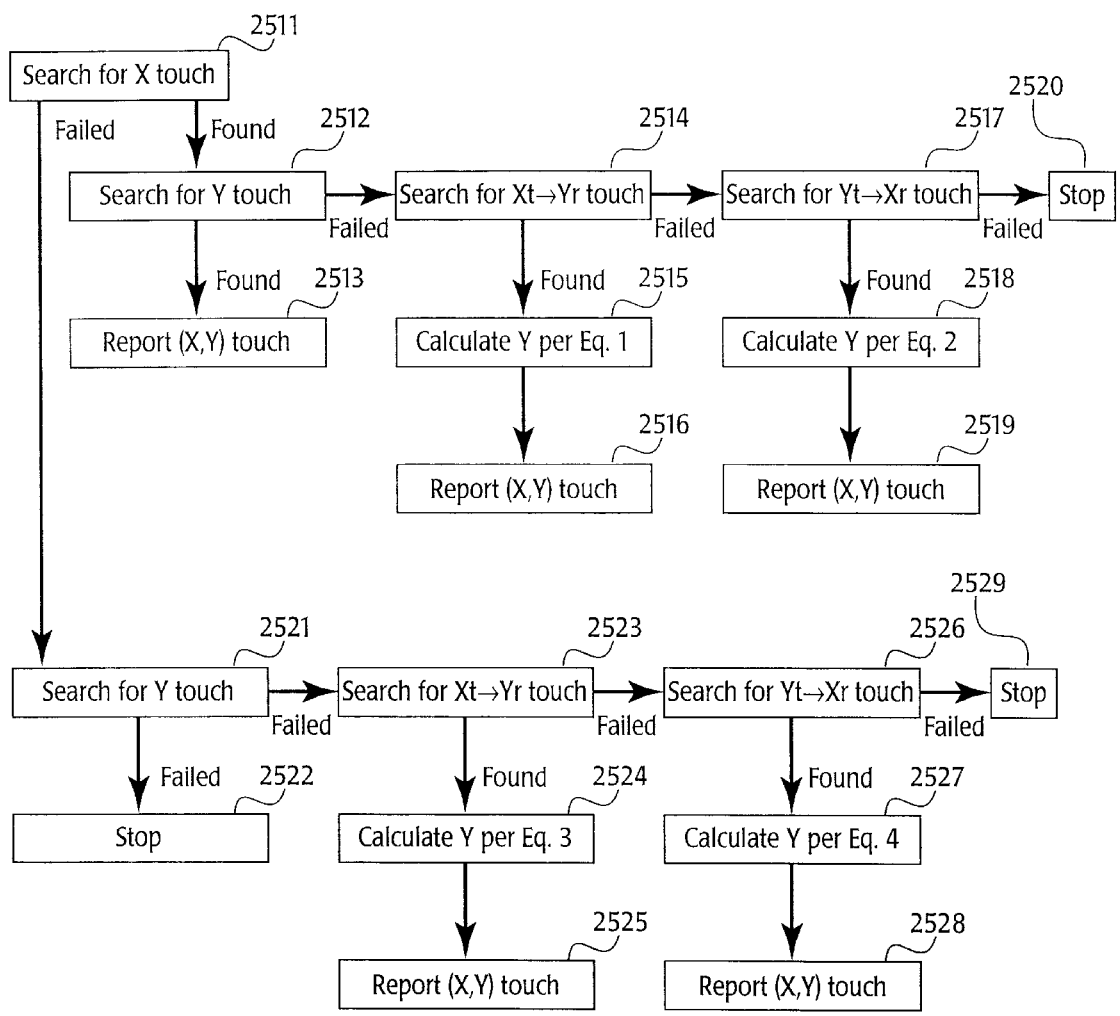

Fig. 25(b) Anti-Shadowing Algorithm Flow Chart

Equation 1: $Y = -H + (H/W)*X + \{H/[\sqrt{(H^2 + W^2)} + W - H]\}*V*(\text{dip time relative to beginning of signal})$ Equation 2: $Y = +H + (H/W)*X + \{H/[\sqrt{(H^2 + W^2)} + H - W]\}*V*(\text{dip time relative to beginning of signal})$ Equation 3: $X = +W + (W/H)*Y + \{W/[\sqrt{(H^2 + W^2)} + W - H]\}*V*(\text{dip time relative to beginning of signal})$ Equation 4: $Y = -W + (W/H)*Y + \{W/[\sqrt{(H^2 + W^2)} + H - W]\}*V*(\text{dip time relative to beginning of signal})$ Note (X,Y) at lower left corner of touch region opposite to the receiver pair corner, H and W are the height and width of the touch region; V is the acoustic velocity.

*Fig. 26 - Dual-mode touch-characteristic algorithm*
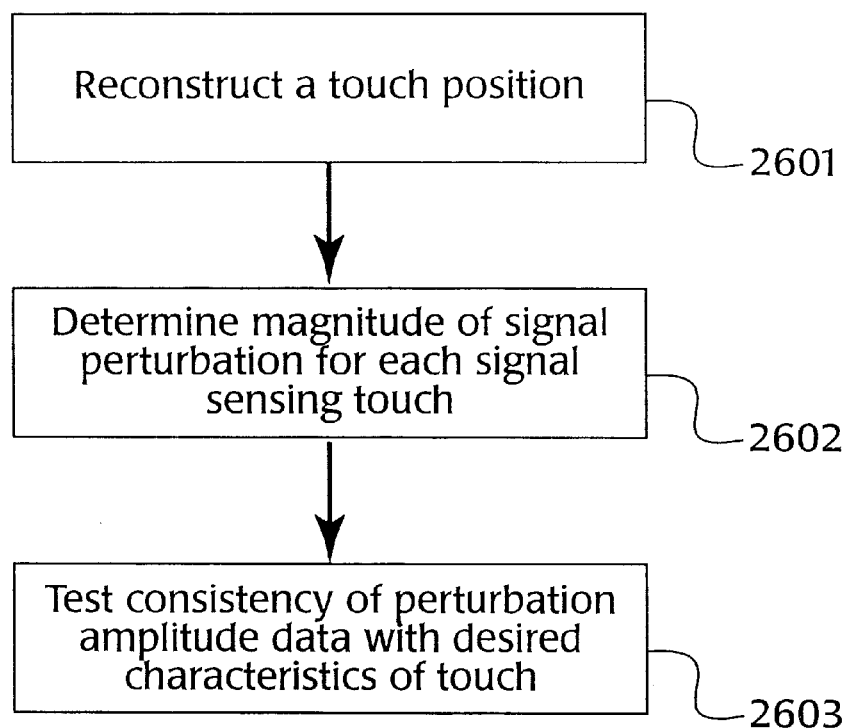

I − Q (R(t) − I(t)) vector diagram of perturbation recognition algorithm

Touch => less amplitude

Touch => no change in amplitude

Touch => more amplitude ("pop-up")

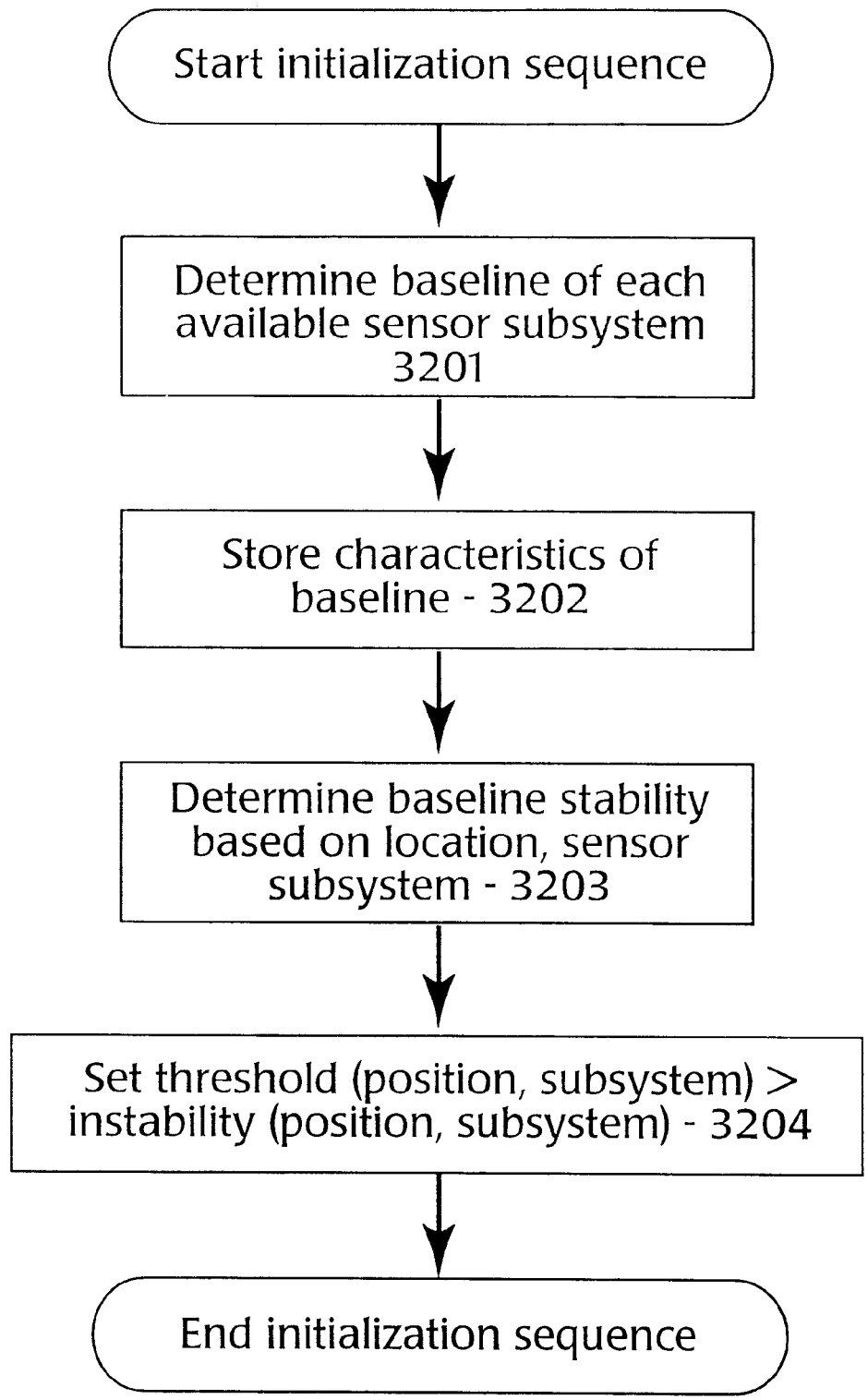
Fig. 32 (a)(1)

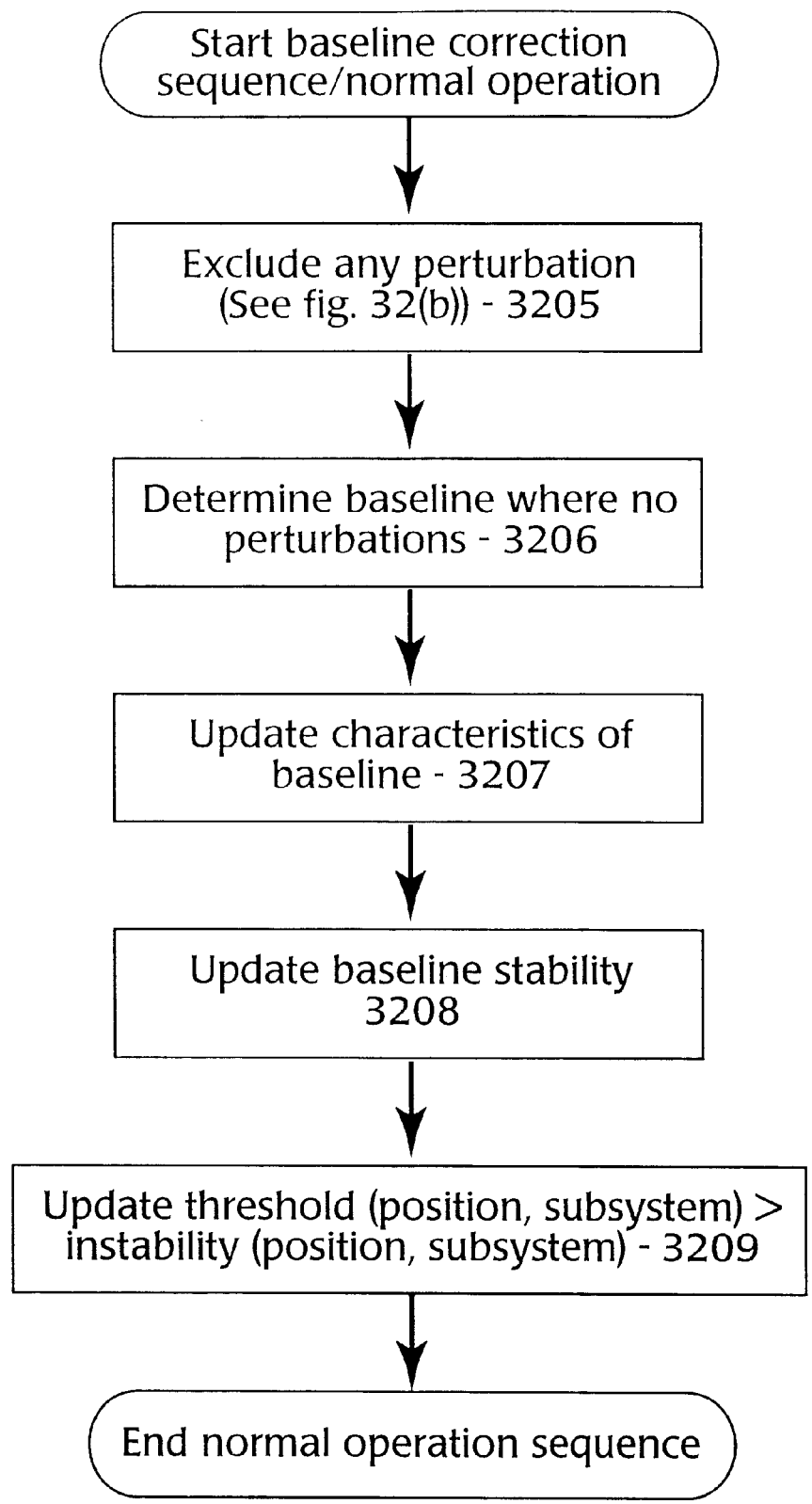
Fig. 32 (a)(2)

ACOUSTIC CONDITION SENSOR EMPLOYING A PLURALITY OF MUTUALLY NON-ORTHOGONAL WAVES

This application is a divisional of U.S. patent application Ser. No. 08/695,716, filed Aug. 12, 1996, now U.S. Pat. No. 5,854,450, which is a Continuation-in-Part of U.S. patent application Ser. No. 08/424,216, filed Apr. 19, 1995, now U.S. Pat. No. 5,591,945, each of which is expressly incorporated herein by reference.

TECHNICAL FIELD OF THE INVENTION

The present invention relates to an acoustic touch position sensor, and more particularly to such a sensor wherein a coordinate position, and optionally an absorption characteristic, of an acoustic disturbance is determined by analyzing a plurality of received signals. The present invention allows the sensing system to employ waves to differ in path geometry, and/or wave characteristic type. e.g., mode, frequency, waveform, velocity, and/or wavelength. This system advantageously allows redundant position measurement and/or differential wave perturbation sensing.

BACKGROUND OF THE INVENTION

Acoustic touch position sensors are well known. A common system includes two sets of transducers, each set having a different axis aligned respectively with the axes of a physical Cartesian coordinate system defined by a substrate. An acoustic pulse is generated by one transducer, propagating as a Rayleigh wave along an axis which intersects an array of reflective elements, each element angled at 45° and spaced corresponding to an integral number of wavelengths of the acoustic wave pulse. Each reflective element reflects a portion of the wave along a path perpendicular to the axis, across an active region of the substrate, to an opposing array and transducer which is a mirror image of the first array and transducer. The transducer in the mirror image array receives an acoustic wave consisting of superposed portions of the wave reflected by the reflective elements of both arrays, directed antiparallel to the emitted pulse. Wavepaths in the active region of the sensor have characteristic time delays, and therefore a wavepath or wavepaths attenuated by an object touching the active region may be identified by determining a timing of an attenuation in the composite returning waveform. A second set of arrays and transducers are provided at right angles to the first, and operate similarly. Since the axis of a transducer corresponds to a physical coordinate axis of the substrate, the timing of an attenuation in the returning wave is indicative of a Cartesian coordinate of a position on the substrate, and the coordinates are determined sequentially to determine the two dimensional Cartesian coordinate position of the attenuating object.

The applicability of such systems as commonly employed is restricted by the following major limitations. First, acoustically absorptive contamination in localized regions, e.g. a water drop on a known Rayleigh-wave sensor, result in large areas of shadowing in which two-dimensional touch positions cannot be reconstructed. Second, the configurational requirements of these sensors limits their versatility with regard to shape and size. Third, reconstruction of touch coordinates may lead to ambiguities when more than one touch is applied simultaneously. Finally, such sensors provide limited touch characteristic information from which to differentiate valid touches from false touches, e.g. fingers from water drops. The present invention addresses these problems.

Present commercial touch screen products generally serve applications in which the touchscreen is an input device that is intended to be used by one user at a time. An automatic-teller-machine (ATM) banking application is typical. While many customers may sequentially use a touchscreen based automatic teller machine, each user in turn has a private dialog with the system. In contrast, few if any touchscreen products are presently available for applications in which the touchscreen is an input device that is intended to be used by more than one user simultaneously.

a. Parallel Transducer Arrays

Acoustic touch position sensors are known to include a touch panel or plate having an array of transmitters positioned along a first edge of a substrate for simultaneously generating parallel surface acoustic waves that directionally propagate through the panel to a corresponding array of detectors positioned opposite the first array on a second edge of the substrate. Another pair of transducer arrays is provided at right angles to the first set. Touching the panel at a point causes an attenuation of the waves passing through the point of touch, thus allowing interpretation of an output from the two sets of transducer arrays to indicate the coordinates of the touch. This type of acoustic touch position sensor is shown in U.S. Pat. No. 3,673,327 and WO 94/02911, Toda, incorporated herein by reference. By employing a direct acoustic path from a transmitting transducer to a corresponding receiving transducer, an acoustic path length which is approximately equal to the height or width of the substrate is provided, as shown in FIG. 1. Because the acoustic wave diverges, a portion of a wave emitted from one transmitting transducer will be incident on a set of receiving transducers, as shown in FIG. 2.

b. Reflective Arrays

In order to reduce the number of transducers required for an acoustic touchscreen, Adler, Re. 33,151, and 4,700,176, provide a reflective array for reflecting portions of an acoustic wave along incrementally varying paths. Therefore, if two such arrays are disposed opposite one another, as shown in FIG. 4, a single transmit and receive transducer will allow touch sensing along one axis of the substrate, with a maximum acoustic path length of twice the height plus width or twice the width plus height of the touch sensitive area. The maximum acoustic path length is a useful metric for acoustic touch sensors because most materials, e.g., glass, have a relatively constant acoustic power loss expressed in dB per unit length; the greater the path length, the greater the attenuation. In many cases, it is this attenuation of the acoustic signal which limits the design of the touchscreen, and therefore it is generally desired to have high acoustic efficiency in each of the touchscreen components to allow design leeway. Thus, for example, greater numbers of transducers may be selectively deployed to allow larger substrates, and likewise, with limited size substrates, acoustic paths may be folded to reduce a required number of transducers.

In order to provide a set of surface acoustic waves which propagate across a broad region of the substrate in parallel, an acoustically reflective grating having elements set at 45° to the axis of the beam is disposed along its path, each element reflecting portions of the wave at right angles to the axis of propagation. The acoustic waves are then collected, while maintaining the time dispersion information which characterizes the axial position from which an attenuated wave originated. The position of a touch in the active area is thus determined by, e.g., providing another reflective grating opposite the first, which directs the surface acoustic waves as a superposed wave to another transducer along an antiparallel path, recording the time of arrival and amplitude of a wave pattern, an attenuation of which corresponds to a touch and a characteristic time corresponding to a position along the axis of the arrays. The touch, in this case, may include a finger or stylus pressing against the surface directly or indirectly through a cover sheet. See, e.g., U.S. Pat. No. 5,451,723. In addition, if the emitted wave diverges, one of the reflective arrays may be eliminated, as shown in FIG. 3, although a rectangular coordinate system is not provided. In the case shown in FIG. 3, the maximum path length is approximately the height plus the width. Acoustic touch position sensors are also known wherein a single transducer per axis is provided for emitting a surface acoustic wave, as shown in FIG. 5. In this case, the maximum path length is two times the sum of the height plus width.

The known reflective arrays are generally formed of a glass frit which is silk-screened onto a soda-lime glass sheet formed by a float process, and cured in an oven to form a chevron pattern of raised glass interruptions. These interruptions typically have heights or depths of order 1% of the acoustic wavelength, and therefore only partially reflect the acoustic energy.

Thus, with waves having surface energy, the reflecting arrays may be formed on the surface, and where wave energy is present on both sides of the substrate, these reflecting arrays may be formed on one or both sides of the substrate. Because the touch sensor is generally placed in front of a display device, and because the reflective array is generally optically visible, the reflective arrays are generally placed at the periphery of the substrate, outside of the active sensing area, and are hidden and protected under a bezel. The reflective elements of the reflective array each generally reflect of order 1% of the surface acoustic wave power, dissipating a small amount and allowing the remainder to pass along the axis of the array. Thus, array elements closer to the transmitting transducer will be subject to greater incident acoustic energy and will therefore reflect a greater amount of acoustic power. In order to provide equalized acoustic power at the receiving transducer, the spacing of the reflective elements may be decreased with increasing distance from the transmitting transducer, or the acoustic reflectivity of the reflective elements may be altered, allowing increased reflectivity with increasing distance from the transmitting transducer.

Adler, U.S. Re. 33,151, relates to a touch-sensitive system for determining a position of a touch along an axis on a surface. A surface acoustic wave generator is coupled to a sheet-like substrate to generate a burst of waves, which are deflected into an active region of the system by an array of wave redirecting gratings. According to a disclosed example, surface acoustic waves traversing the active region are, in turn, redirected along an axis by gratings to a receiving transducer. A location of touch is determined by analyzing a selective attenuation of the received waveform in the time domain, each characteristic delay corresponding to a locus on the surface. The redirecting gratings are oriented at 45° to the axis of propagation, and spaced at integral multiples of the surface acoustic wave wavelength, with dropped elements to produce an approximately constant surface acoustic wave power density over the active area. The spacing between grates decreases with increasing distance along the axis of propagation from the transducer, with a minimum spacing of at least one wavelength of the transmitted wave. U.S. Pat. No. 5,329,070, U.S. Pat. No. 5,260,521, U.S. Pat. No. 5,234,148, U.S. Pat. No. 5,177,327, U.S. Pat. No. 5,162,618 and U.S. Pat. No. 5,072,427 propose specific examples of types of surface acoustic waves that may be used in the acoustic sensor system taught in the Adler patents.

Where a separate reflective array is provided to redirect acoustic waves toward the receiving transducer, these are also provided with an increasing acoustic reflectivity with increasing distance from the receiving transducer. This is to reduce signal loss with propagation of the signal toward the receiving transducer along the axis of the reflective array. Typically, array pairs are designed as mirror images of one another.

U.S. Pat. No. 4,642,423, to Adler, incorporated herein by reference, addresses pseudo-planarization techniques for rectangular touchscreen surfaces formed by small solid angle sections of a sphere. According to Adler, reflective elements are angled to excite waves along sections of great circles of the spherical surface which extrapolate to a common intersection point. This patent addresses the need for touchscreens that match the curvature of CRT faceplates, for which the radius of curvature is always large compared to the diagonal dimension of the faceplate. This patent teaches means to minimize the inherent differences between spherical geometry of a small portion of a sphere and the Cartesian plane, allowing use in conjunction with controllers that are designed for flat sensor geometry. The acoustic waves generated by the system of Adler are substantially orthogonal. Known embodiments of the Adler technology include 19 inch diagonal CRTs with a radius of curvature of 32 inches and 13 or 14 inch diagonal CRTs with a radius of curvature of 22.6 inches.

c. Two Dimensional Position Sensing

In order to receive information determinative of the coordinates of a touch, two acoustic waves, each propagating across the active region of the substrate along perpendicular axes are provided. Thus, the two axes are typically used in conjunction to recognize a valid touch, but may also be analyzed separately and non-interactively to sequentially determine a position along each of the two orthogonal coordinate axes. In these known systems, the coordinate axes of interest to the application are defined by the physical configuration of the sensor. Thus, sensor design is constrained by the requirements of the application's coordinate system.

In known systems, the system operates on the principle that a touch on the surface attenuates surface acoustic waves having a power density at the surface. An attenuation of a wave traveling across the substrate causes a corresponding attenuation of waves impinging on the receive transducer at a characteristic time period. Thus, the controller need only detect the temporal characteristics of an attenuation to determine the axial coordinate position. Measurements are taken along two axes sequentially in order to determine a Cartesian coordinate position.

Other known systems, described in more detail below, employ a single reflective array for separating as a plurality of wave paths, and superposing as a composite waveform, the signal from the transducer, through the active region, along a plurality of paths and then back to the transducer, by providing an acoustically reflective edge spaced parallel to the reflective array, causing the dispersed wave to traverse the active region twice, as shown in FIG. 5. See, U.S. Pat. No. 5,177,327, FIG. 10 and accompanying text, incorporated herein by reference.

FIG. 11 of U.S. Pat. No. 4,700,176 teaches the use of a single transducer for both transmitting the wave and receiving the sensing wave, with a single reflective array employed to disperse and recombine the wave. Such systems therefore employ a reflective structure opposite the reflective array. As a result, an acoustic wave passes through the active region twice, with consequent increased wave absorption by the touch but also increased overall signal attenuation due to the reflection and additional pass through the active region of the substrate. Thus, the acoustic wave may be reflected off an edge of the substrate or an array of 180° reflectors parallel to the axis of the transmission reflective grating and reflected back through the substrate to the reflective array and retrace its path back to the transducer. The transducer, in this case, is time division multiplexed to act as transmitter and receiver, respectively, at appropriate time periods. A second transducer, reflective array and reflective edge are provided for an axis at right angles to allow determination of a coordinate of touch along perpendicular axes.

A known system by Electro-Plasma (Milbury Ohio) employs a bisected reflecting array in order to reduce an acoustic wavepath, as shown in FIG. 6A. Therefore, a maximum path length of an acoustic wave along the composite reflecting array from a transducer is about one half of the total width, with transducers each sending acoustic waves toward the bisection point. Thus, the orthogonal set of paths will be longer, with a maximum total path length of two times the height plus the width. In this system, transmitting transducers are excited individually and produce identical types of waves, portions of which travel along parallel paths, with a small overlap of acoustic wave coverage of the touchscreen in order to avoid a dead zone in the touch region. The acoustic waves follow the traditional paths corresponding to axes parallel to the Cartesian coordinate axes. A similar type system would bisect both sets of reflective arrays, as shown in FIG. 6B.

The "triple transit" system, shown in FIG. 8, provides for a single transducer which produces a sensing wave for detecting touch on two orthogonal axes, which both produces and receives the wave from both axes. In this case, the area in which touch is to be sensed is generally oblong, such that the longest characteristic delay along one path is shorter than the shortest characteristic delay along the second path, thereby allowing differentiation between the two axes based on time of reception. See, U.S. Pat. Nos. 5,072,427, 5,162,618, and 5,177,327, incorporated herein by reference. The maximum path length of the triple transit design is four times the width plus two times the height. Due to the significant difference in path lengths, the X and Y signals are non-overlapping, as shown in FIG. 9C.

d. Controller Algorithms

The wave pattern of one type of known acoustic touch sensors is dispersed along the axis of the transmitting reflective array, traverses the substrate and is recombined, e.g., by another reflective grating, into an axially propagating wave, dispersed in time according to the path taken across the substrate, and is directed to a receiving transducer in a direction antiparallel to the transmitted wave, which receives the wave and converts it into an electrical signal for processing based on signal amplitude received as a function of time. Thus, according to this system, only two transducers per axis are required. Because of the antiparallel path, the time delay of a perturbation of the electrical signal corresponds to a distance traveled by the wave, which in turn is related to the axial distance from the transducer along the reflecting arrays traveled by the wave before entering the active area of the substrate, i.e., approximately two times the distance along the axis of the array plus the spacing between the arrays. A typical set of return waveforms is shown in FIG. 9.

The location of a touch is determined by detecting an attenuation of the received signal amplitude either in absolute terms or as compared to a standard or reference received waveform. Thus, for each axis, a distance may be determined, and with two orthogonal axes, a unique coordinate for the attenuation determined. Acoustic touch position sensors of this type are shown in U.S. Pat. Nos. 4,642,423, 4,644,100, 4,645,870, 4,700,176, 4,746,914 and 4,791,416, incorporated herein by reference.

U.S. Pat. Nos. Re. 33,151, and 4,700,176 also disclose a touch sensor system having a set of diverging acoustic paths which are incident on a reflective array having elements located along an arc and spaced to meet coherency criteria. See, Re. 33,151, and 4,700,176, FIG. 16 and accompanying text, incorporated herein by reference. This touch sensor produces a unidimensional output which corresponds to an angular position of a touch.

According to known systems, a number of algorithms are employed to determine the coordinate position of a touch. The simplest algorithm is a threshold detection, in which an amplitude of a received signal is compared to a set value. Any dip below that value is considered indicative of a touch. More sophisticated is an adaptive threshold, in which the threshold varies based on actual sets of received data, thus allowing increased sensitivity and rejection of artifacts of limited amplitude.

A control circuit may operate in a number of modes, e.g., number of transducers and configuration. In known systems having a rectangular substrate without redundancy, the number of transducers varies: 1 (triple transit); 2 (ExZec/Carroll Touch); 4 (Adler); and 6 (ElectroPlasma). There is a natural 8 transducer arrangement, not present in prior art designs, which is an extension of 6 transducer scheme in which 4 transducers are used for both X and Y axis measurements; see FIG. 6B.

Known systems also include an adaptive baseline, in which an amplitude of the normal received signal over time is stored, and the received signal is compared to a baseline having a characteristic timeframe. In this system, an artifact in one position does not necessarily reduce sensitivity at another.

Brenner et al., U.S. Pat. No. 4,644,100 relates to a touch sensitive system employing surface acoustic waves, responsive to both the location and magnitude of a perturbation of the surface acoustic waves. The system according to U.S. Pat. No. 4,644,100 is similar in execution to the system according to U.S. Re. 33,151, while determining an amplitude of a received wave and comparing it to a stored reference profile.

In order to reduce the number of transducers, the known "triple transit" system reflects the acoustic signal so that a wave emitted by a single transducer is dispersed as parallel waves along a first axis, then reflected at a right angle and dispersed as parallel waves along a second axis. These waves are then reflected back to the arrays and then back to the transducer, so that all the waves traveling along the first axis are received by the transducer prior to any waves traveling along the second axis, generally requiring an oblong substrate. The controller therefore sets two non-overlapping time windows for the received signal, a first window for the first axis and a second window for the second axis. Therefore, each time window is analyzed conventionally, and the pair of Cartesian coordinates is resolved.

A system for sensing a force of a stylus against an acoustic touch-sensitive substrate is disclosed in U.S. Pat. No. 5,451,723, incorporated herein by reference. This system converts the point-contact of the rigid stylus portion into an area contact of an acoustically absorptive elastomer, placed between the stylus and the substrate.

e. Wave Modes

"Surface acoustic waves" ("SAW"), as used herein refers to acoustic waves for which a touch on the surface leads to a measurable attenuation of acoustic energy. Several examples of surface acoustic waves are known.

The vast majority of present commercial products are based on Rayleigh waves. Rayleigh waves maintain a useful power density at the touch surface due to the fact that they are bound to the touch surface. Mathematically, Rayleigh waves exist only in semi-infinite media. In practice it is sufficient for the substrate to be 3 or 4 wavelengths in thickness. In this case one has quasi-Rayleigh waves that are practical equivalents to Rayleigh waves. In this context, it is understood that Rayleigh waves exist only in theory and therefore a reference thereto indicates a quasi-Rayleigh wave.

Like Rayleigh waves, Love waves are "surface-bound waves". Particle motion is vertical and longitudinal for Rayleigh waves. Both shear and pressure/tension stresses are associated with Rayleigh waves. In contrast, particle motion is horizontal, i.e. parallel to touch surface, for Love waves. Only shear stress is associated with a Love wave. Other surface-bound waves are known.

Another class of surface acoustic waves of possible interest in connection with acoustic touchscreens are plate waves. Unlike surface-bound waves, plate waves require the confining effects of both the top and bottom surfaces of the substrate to maintain a useful power density at the touch surface. Examples of plate waves include symmetric and anti-symmetric Lamb waves, zeroth order horizontally polarized shear (ZOHPS) waves, and higher order horizontally polarized shear (HOHPS) waves.

The choice of acoustic mode affects touch sensitivity, the relative touch sensitivity between water drops and finger touches, as well as a number of sensor design details. However, the basic principles of acoustic touchscreen operation are largely independent of the choice of acoustic mode.

f. Optimization for Environmental Conditions

The exposed surface of a touchscreen is ordinarily glass. While certain systems may include such additions, electrically conductive coatings or cover sheets are not necessary. Therefore, acoustic touchscreens are particularly attractive for applications which depend on public access to a durable touch interface.

Semi-outdoor applications, e.g., ATMs, ticket booths, etc., are of particular interest. Typically in such applications, the touchscreen is protected from direct environmental precipitation contact by a booth or overhang. However, indirect water contact, due to user transfer or condensation is possible. Thus, users coming out of the rain or snow with wet clothes, gloves or umbrellas are likely to leave occasional drops of water on the touchscreen surface. Water droplets have a high absorption of Rayleigh waves in known systems; thus, a drop of water in the active region will shadow the acoustic paths intersecting that drop, preventing normal detection of a touch along those axes.

One approach to limit water contact with the touchscreen surface is to employ a cover sheet. See U.S. Pat. No. 5,451,723. However, a cover sheet generally reduces the optical quality of the displayed image seen through the resulting sensor and leads to a less durable exposed surface. Another approach to reducing the effects of water droplets is to employ a wave mode which is less affected by the droplets, such as a low frequency Rayleigh wave, see U.S. Pat. No. 5,334,805, a Lamb wave, see U.S. Pat. Nos. 5,072,427 and 5,162,618, or a zero order horizontally polarized shear wave, see U.S. Pat. No. 5,260,521. These waves, however, also have reduced sensitivity, resulting in either reduced touch sensitivity of the touch system, increased susceptibility to electromagnetic interference, or more expensive controller circuitry.

In the case of Rayleigh waves, a lower frequency operation requires a thicker substrate, e.g., 3 to 4 wavelengths of the wave, and wider reflective arrays and transducers. The increased bulk of a sensor designed for low-frequency Raylecigh waves is typically a serious mechanical design problem. In the case of Lamb waves, a thin substrate is required, e.g., about 1 mm at about 5 MHz. These thin substrates are fragile, and Lamb waves have energy on both top and bottom surfaces, making optical bonding problematic due to signal damping. In the case of a ZOHPS wave, in contrast to a Rayleigh wave, the relative sensitivity is greater to a finger than to water droplets. Further, ZOHPS waves support limited options for optical bonding, such as RTVs (silicone rubbers) which do not support shear radiation damping.

Shear sensors have two disadvantages in cold climates. In particularly cold climates, it is important for touchscreens to sense touches of fingers of gloved hands. Shear waves have reduced sensitivity compared to Rayleigh waves thus making detection of gloved fingers more difficult. Secondly, in such climates, drops of water may freeze to form solid ice. While liquid water does not strongly couple to horizontally polarized shear waves, ice does. Thus drops of water which freeze on the touchscreen surface will cause shadowing or blinding.

There remains a need for a touch position sensor which operates reliably in the increasingly rugged environments to which such devices are deployed. There thus exists a need to supplement existing technologies in order to extend the applicability of acoustic touch sensor systems.

g. Size Constraints.

Acoustic sensors of the Adler type have been considered for use in electronic white boards; see FIG. 10 and associated text in E.P. Application 94119257.7, Seiko Epson. At present, no commercial electronic whiteboard products are available based on acoustic sensor technology. In part, this is because of size limitations for known acoustic technology.

SUMMARY OF THE INVENTION

The present invention derives from an understanding that acoustic position measurement technology suffers from various limitations, which may be addressed by implementing a system with various forms of partial redundancy in the sensing waves. Thus, for each coordinate axis of the output, a plurality of sets of waves are provided bearing information about the position of a single touch along that axis. Therefore, any limitation in the ability of one set of waves to determine a touch position may be supplemented by information derived from at least one other set of waves. Because the redundancy may be partial, other information may be derived from the available sets of waves as well, including a characteristic of a touch and information relating to a plurality of touches.

According to one set of schemes for producing partially redundant sets of waves, a plurality of sets of waves are provided, each propagating at a different angle with respect to the axis along which a touch position is to be sensed. Each of the waves should be able to sense position along a significant portion of the axis. Thus, a traditional type touch system provides two sets of waves which are each parallel to an edge of a rectangular substrate and produce waves which propagate perpendicular to the edges. Thus, each set of waves is dedicated sensing a position along a particular axis. Likewise, a known bisected reflective array scheme overlaps waves over an insignificant portion of the touch sensitive surface, and the waves generated are of the same frequency, mode, axis of propagation and therefore are essentially fully redundant and likely bear essentially the same information.

The present invention also extends these same principles to encompass a number of other embodiments, including acoustic touch systems in which the acoustic waves travel along paths which are neither parallel nor perpendicular to an edge of a substrate or travel along a path which is neither parallel nor perpendicular to a reflective array. Thus, the present invention relaxes constraints imposed in prior touch position sensors through an understanding that the geometry of the touch sensor substrate. reflective arrays or acoustic paths need not limit the coordinate system represented in an output. Thus, the present invention may provide control systems which are capable of performing coordinate system transforms and higher levels of analysis of the information contained in the acoustic signals than prior systems.

In forming this understanding that a control need not be limited to a conversion of a characteristic timing of a perturbation of an acoustic wave into a coordinate position along a single axis, the possibility of non-Euclidean geometric shapes is developed. Thus, while the prior art teaches that acoustic touch sensing may be applied to spherical portions of CRT faceplates, the goal of the prior art was to provide a system in which analysis of the received acoustic signals were as if the substrate were planar. Therefore, those prior art systems were developed to compensate for the spherical aberrations in the design and placement of the reflective arrays. Likewise, a known prior art system employs a diverging set of waves incident on a reflective array to sense a unidirectional angular measurement. In this case, a control treats the unidimensional angular measurement as a single coordinate axis without transformation.

The present invention provides touch system flexibility allowing analysis of waves which propagate along non-orthogonal axes in the touch sensitive region of the touchscreen. Further, the present invention provides a touchscreen system which tolerates and analyzes waves which are overlapping in time, i.e., simultaneously impinging on one or more receiving transducers. Together, these related aspects of the invention provide greatly enhanced flexibility in the design of the touchscreen, with improved performance under adverse conditions.

The present invention also includes touch sensors for purposes other than graphic user interfaces. For example, applications in the field of robotics exist, in which it is desirable to endow robots with a sense of touch. While a number of sensor technologies exist, acoustic sensing provides an opportunity for a large area, high resolution, low cost per unit area sensor on a machine, for example, to detect contact or pressure with an adjacent object and to determine the location of the touch. Such machines often have non-planar surfaces, and as such it is advantageous to provide a touch position and/or pressure sensor which conforms to the shell of the machine. According to the present invention, various surfaces having irregular geometries may be formed into sensor surfaces.

The present invention also provides a touch system allowing analysis of a wave perturbation of two different types of waves, the waves differing in mode, frequency, waveform, velocity, and/or wavelength. This system advantageously allows redundant position measurement and/or differential wave perturbation sensing.

One aspect of the invention can also be described as follows. Acoustic energy is emitted into a substrate supporting propagation of acoustic waves. This energy travels through a portion of the substrate to a receiving system, which may include redundant use of the acoustic energy emitting device. The energy is received as at least two distinct waves. These waves have differing paths or characteristic timing. These waves are non-orthogonal in either the time or space planes, meaning that they impinge simultaneously on one or more receiving transducers, or follow paths which are substantially non-orthogonal (having a relation different than 90°).

Therefore, one embodiment of the present invention, as depicted in FIG. 7, is somewhat similar to the "triple transit" system, but allows acoustic signals following two different paths 1, 2 to be received simultaneously. This system provides a first path 2 with a single reflective array 5, which reflects acoustic waves off an opposite side 3 of the substrate 4, back through the touch sensitive region of the substrate, back into the reflective array 5, and to the originating transducer 6, with a maximum path length of about two times the sum of the height plus the width. The orthogonal axis receives a portion of the same acoustic wave from the transducer 6, which reflects off a diagonal corner reflector 7, along a perpendicular axis has a second reflective array 8. The wave is reflected as a set of waves 9 through the touch sensitive region of the substrate 4, and is incident on a third reflective array 10, which reflects the acoustic wave toward a second transducer 11 on an adjacent side of the substrate 4, near the first transducer 6. The maximum path length of this path is two times the sum of the height plus width. In this case, two transducers 6, 11 receive signals simultaneously for at least some delay times.

Another embodiment of the invention provides a sensor which employs a plurality of waves having differing frequencies, wavelengths, phase velocities, or amplitude. Such waves may also be non-orthogonal in the time or space planes, but need not be so. In other words, these distinguishable waves may travel sequentially and/or over orthogonal paths.

Where portions of acoustic waves are received simultaneously by a single transducer, it is generally preferred that a receiving circuit be sensitive to a phase of a received signal in order to help resolve interference effects. Likewise, where waves of differing frequencies are employed, it is preferred that the receiver selectively receive those waves according to their frequency. Where waves of differing wave propagation mode are employed, transducer having selectivity for differing waves modes may be provided. Therefore, embodiments of the present invention may also include a receiver sensitive to at least some wave characteristics.

A further embodiment of the invention provides a positive response sensor, e.g., one where an increase in received signal is representative of a typical perturbation. Typically, a perturbation in a positive response system will cause a change of some type in the wave, making it distinguishable from an unperturbed wave. Again, such a wave may be non-orthogonal in the time or space planes, but need not be so. For example, the unperturbed signal may be completely attenuated through filtering, and therefore not received by the receiver. In this case, only a single, positive response signal according to the present invention is received.

Thus, the present invention is not limited in the conventional manner to sequential receipt of independent coherent signals representative of waves propagating along Cartesian coordinate axes, and analysis thereof to determine an attenuation of a transmitted wave by a touch by detecting the energy of the wave with respect to time. In particular, according to the present invention, a plurality of waves may be received simultaneously, the received signal may be an incoherent superposition of components from different wave sets, the waves need not propagate parallel to a rectangular coordinate axis of a planar substrate, and detection is not necessarily based solely on a determination of a time of an attenuation in power of a received signal. An improved receiver is therefore employed which includes enhanced logical analysis of the received waveform. Advantageously, the waveform sensitive analysis and enhanced logical analysis may be employed together.

The receipt of at least two distinct waves which overlap temporally may indicate two waves which each have substantial energy, each being specifically intended for receipt, and potentially bearing information relating to a touch position along a coordinate axis. Alternately, one of the two distinct waves may be due to unintentionally scattered waves, artifacts and interference that are not intended for use in touch detection. In either case, a touch-information carrying signal may be utilized even if superposed with other signal components.

The present invention allows receipt and analysis of partially redundant waves. Therefore, the effects of contamination and various artifacts may be reduced. Further, where differing wave modes or frequencies are used, a differential sensing approach may be followed to determine both position and a mode sensitive characteristic of a touch.

The present invention includes a system in which the position of a touch is determined by the controller independent of the physical axes of the substrate, thus providing for coordinate processing and transformation before output. This allows increased flexibility in the layout of the transducer systems. In this document, "transducer system" is defined to be the system that couples electronic signals to acoustic waves in the desired touch region including the transducer itself, e.g. a wedge or edge transducer, and associated reflective arrays if employed.

The present invention also allows receipt and analysis of signals which are excited by a common transducer representative of differing sets of wave paths with overlapping characteristic time-periods.

A still further aspect of the invention provides an acoustic wave touch sensor in which a touch is detected by a perturbation of a received signal where the perturbation may be a decrease in amplitude, an increase in amplitude, a change in phase of the received signal, or a combination of amplitude change and phase change.

One set of embodiments according to the present invention includes systems employing multiple waves sharing a common path portion. The known triple transit transducer also shares common path portions, but does not have simultaneously received waves or a transformation of coordinate system. In other words, the known triple transit system requires a time separation between received waves representing orthogonal axes, thus limiting the topology of the sensor.

According to one aspect of the present invention, a plurality of waves traveling along non-orthogonal axes in the active region of the touchsensor may have common path portions, being at least partially superposed. In particular, according to certain embodiments of the invention, these waves will share a common transducer, and a common axis of propagation from the transducer. The waves may differ, e.g., in path, mode, frequency, phase, propagation velocity, or wavelength. Therefore, some embodiments according to the present invention provide a reflective array which separates the waves to propagate along differing paths. Another set of embodiments provides a plurality of sets of distinguished reflective arrays, which reflect portions of the waves at differing angles or as waves of differing propagation modes, or both.

Sensor systems according to the present invention allow superposition of waves producing sets of touch-sensitive waves which are dispersed across the touch area of the substrate having characteristic time delays or other characteristics, and a system for receiving the dispersed waves and determining a characteristic of a touch or wave perturbation. The axes of propagation of one set of waves need not be orthogonal to those of another set. According to the present invention, these sets of non-orthogonal waves may be employed with orthogonal waves. By providing more than one set of these plurality of waves, a position of a touch may be determined using redundant information, e.g., having more information than is necessary to mathematically determine a position, allowing enhanced performance in the presence of noise, interference and shadowing.

As stated above, the acoustic waves may differ in other properties, including mode, propagation velocity, wavelength, which in general provides two advantages. First, waves having differing properties may have differing sensitivity to environmetal conditions and artifacts. Thus, the differential effect on the sensing waves may be used to determine properties of an object in contact with the surface. Further, the differences in the waves may be used to selectively filter the waves, thus providing opportunity to selectively reduce noise or separate potentially interfering waveforms. Waves having differing wavelength in the substrate may be selectively redirected with reflective arrays having physical characteristics corresponding to that wavelength and its axis of propagation.

In another aspect of the invention, the coordinate system of a sensing wave is non-orthogonal with an output coordinate system. Therefore, a plurality of waves must be analyzed and their position information transformed in order to output a coordinate value. The plurality of waves may also be analyzed for redundancy to verify a touch coordinate, and potentially to resolve ambiguities, perhaps due to multiple touches, in the two dimensional position measurement.

In an embodiment of the invention, at least three distinct acoustic wave sets are excited, of which analysis of at least two are required in order to detect a two dimensional position of a touch. Therefore, under various circumstances, one or more waves may be ignored or unavailable, yet operation continues. Where at least three are available, the three waves may be analyzed for touch position consistency, artifact or interference, and to determine an optimum output indication of the position of the touch. The analysis of the at least three waves may also include an output of a plurality of simultaneous touch positions.

According to another embodiment, differing wave modes are induced in the substrate so that regions of low sensitivity employing one propagation mode correspond to regions which have adequate sensitivity employing a different propagation mode. For example, in regions where Rayleigh waves are heavily shadowed due to contamination, a less sensitive backup wave mode, e.g. a horizontally polarized shear mode, may be analyzed for this same region to determine touch data.

The dual mode operation allows operation with at least two waves, with spatial domain, frequency domain, wave propagation mode or time domain multiplexing. Therefore, signals may be received along differing paths, having differing frequencies, differing wave propagation modes, or differing locations of reception.

In order to provide waves having differing characteristics from substantially common sensor hardware, the signal from the transducer system may include a number of components. In order to provide frequency mode discrimination, the receiving system must distinguish between various received frequencies. With respect to a plurality of wave modes, either the differing wave modes must be converted to a single mode which excites the transducer, or the transducer must be sensitive to the various modes. With a time domain multiplexing system, readings according to various wave modes are taken sequentially. In order to detect spatially separated waves, a separate transducer may be provided or the waves may be redirected to a common receiving transducer. Where different types of waves are superposed, a perturbation will typically have a different characteristic time delay for the different waves, which is used to distinguish the particular wave.

Various embodiments of the invention analyze a potential ambiguity in the received waveform. That is, two waves, following different paths, arrive at the same receiving transducer within an indistinguishable time window, and thus a given wave perturbation is potentially attributable to either wave. Therefore, without further information, the controller might not determine, based on the signal of the received wave, which of the two possible paths the touch intersects. According to a subclass of these embodiments, however, a pair of such ambiguous signal perturbations occur. Thus, by analyzing the pair of ambiguous signal perturbations, with reference to a physical model of the sensor and additional information from signals from other wave sets, the position of the perturbation may be determined or predicted, and the ambiguity resolved. Further, as referred to herein, the position may be sensed unambiguously by a pair of acoustic waves emitted along a single set of superposed arrays.

According to another aspect of the invention, additional information may be obtained from an additional set of superposed arrays, e.g., along another axis. This information may be further employed in determination of the coordinate position. More generally, the present invention encompasses the superposition of reflective arrays, e.g., to scatter a plurality of waves coherently, and a physically superposed array structure.

Where the waves travel along different paths, often the waves will be directed towards different edges of the substrate. Therefore, for example, two waves may be sensed with two different receiving transducers simultaneously. Advantageously, therefore, a traditional touchscreen system and a touchscreen system with inclined propagation paths are superposed. Embodiments according to the present invention may thus provide multiple channels for receiving acoustic wave information.

Reliability of operation is enhanced according to the present invention even where different types of touching objects are to be sensed, such as fingers, gloved fingers, styli, etc. Likewise, potentially interfering factors may be identified and/or filtered or ignored.

By allowing multiple wave modes and/or paths, the advantages of partially redundant measurements and differential wave perturbation characteristic sensing are realized.

Algorithms may use redundant coordinate information to verify and perhaps resolve ambiguities in two-dimensional position measurements.

Alternately, algorithms may support systems with redundant coordinate measurements in which only two of three or more sets of waves are needed to reconstruct two-dimensional coordinates of a touch.

Systems according to the present invention also encompass multiple user touch applications. In such cases, the redundancy of the multiple wave paths may be used to resolve multiple degrees of freedom. For example, such multiple user touch systems might include a classroom multi-media device that is simultaneously hands-on for the teacher and several students, interactive museum displays, a two-person video game with a touch interface, or a large table-top display of engineering drawings that can be simultaneously reviewed and edited by a small group of engineers. Complex control system human interfaces are also possible.

A multiple-user touch/display system will typically require a larger display device than a system intended for one user at a time, such as is possible with projection systems and large flat panel displays commercially available or under development. Therefore, various methods according to the present invention allow sensing of multiple touches, reduction of acoustic path lengths and of likely sources of interference. Embodiments according to the present invention also employ aspects which allow longer acoustic path lengths.

Simultaneous touches are problematic for existing touchscreen products. Analog resistive, capacitive, and force-sensing touch technologies inherently confound a multiple touch with a false touch at an intermediate position. High-resolution resistive and capacitive touch schemes that cover larger areas with discrete touch zones become awkward and expensive due to the large number of electronic channels required. If means are provided to resolve discrete ambiguities, acoustic touch technologies have the inherent capability to recognize simultaneous multiple touches. In addition to true multiple user applications, a simultaneous touch capability would also enable touch applications in which a single user simultaneously touches with both hands or more than one finger in one hand. For example, a virtual piano keyboard on a touch/display device that supports playing of chords.

It is therefore an object of the invention to provide a system in which waves of differing characteristics are used to sense a touch in a substrate, wherein the waves may have differing, non-orthogonal axes of propagation, differing wave propagation mode, differing frequency, wavelength or phase velocity.

It is another object according to the present invention to provide a touch sensor comprising an acoustic wave transmissive medium having a surface and a touch sensitive portion of said surface; a transducer system for emitting acoustic energy into said medium; and a receiver system for receiving the acoustic energy from the substrate, for determining a perturbation of said acoustic energy due to a touch on said surface, said touch sensor comprising a reflective array having a plurality of spaced elements for scattering portions of an incident acoustic wave as waves having a different propagation vector than said incident wave and passing other portions unscattered, said array being provided an array selected from the group consisting of:

(a) an array associated with said medium situated along a path, said path not being a linear segment parallel to a coordinate axis of a substrate in a Cartesian space, a segment parallel to an axial axis or perpendicular to a radial axis of a substrate in a Cylindrical space, nor parallel and adjacent to a side of a rectangular region of a small solid angle section of a sphere;

(b) an array situated along a path substantially not corresponding to a desired coordinate axis of a touch position output signal;

(c) an array situated along a path substantially non-parallel to an edge of said medium;

(d) has a spacing of elements in said array which differs, over at least one portion thereof, from an integral multiple of a wavelength of an incident acoustic wave;

(e) has elements in said array which are non-parallel;

(f) has an angle of acceptance of acoustic waves which varies over regions of said array;

(g) coherently scatters at least two distinguishable acoustic waves which are received by said receiving system; and (h) combinations and subcombinations of the above, except that said array in (d), (e) or (f) is not provided parallel and adjacent to a side of a rectangular region of a small solid angle section of a sphere.

It is also an object according to the present invention to provide a controller which is capable of logically analyzing two sets of waves derived from a common transmit transducer burst which are received simultaneously, i.e., in which the wave being received may not be distinguished solely by reference to a time window. Thus, the system need not maintain a time separation between a plurality of waves for proper operation.

It is a still further object of the invention to provide a receiver in which a received signal is analyzed for waveform information, due e.g., to multipath signal paths. Further, the receiver according to the present invention may analyze the received signal for a touch indicated by a perturbation of complex amplitude rather than merely an attenuation in received power.

A further object according to the present invention is to allow output of a coordinate position in an output coordinate system, typically Cartesian, of a perturbation of acoustic waves, each of which measures a coordinate substantially different from the axes of the output coordinate system.

Thus, touch position sensors according to the present invention may provide some or all of the following advantages:

(a) Tolerance to shadowing effects of contaminants by obtaining redundant information and/or employing robust waveforms.

(b) A higher signal to noise ratio due to availability of redundant coordinate information.

(c) A multiple wave mode sensor allowing the composite advantages of each selected type of wave mode, e.g., high sensitivity to touch for Rayleigh wave modes, relative immunity to contaminants for horizontally polarized shear modes.

(d) Ability to detect a mode sensitive perturbing characteristic of a touch based on differential wave perturbation and/or appearance of a characteristic new signal.

(e) Versatility in the selection of substrate, e.g., use of larger sizes, non-rectangular shapes, large solid angle sections of spheres and other non-planar topologies.

(f) Ability to reliably reconstruct multiple touches and hence support applications in which more than one finger, hand, or user may simultaneously input touch information.

These and other objects will become apparent from a review of the drawings and Detailed Description of the Preferred Embodiments.

BRIEF DESCRIPTION OF THE DRAWINGS

The preferred embodiments of the invention will be explained by reference to the drawings, in which:

FIGS. 9A and 9B show typical waveforms received from a transducer system according to FIG. 4 subject to one and two simultaneous touches, respectively;

FIG. 9C shows a typical waveform received from a transducer system according to FIG. 8;

FIG. 9D(1) shows the superposition of two simultaneously received signals, as would be seen by summing the receiving transducers of the embodiment of FIG. 7;

FIGS. 9D(2), 9D(3) and 9D(4) show the sum of the superposed signals of FIG. 9D(1) when the superposed signals are (2) in phase, (3) out of phase with an RMS detector, and (4) out of phase with a phase preserving receiver, respectively;

FIG. 10 shows a generic planar sensor subsystem, without intermediate reflections;

FIG. 11 shows the array reflector spacing and orientation of an embodiment according to FIG. 10;

FIGS. 12(a)–(f) show example coordinate subsystem geometries as embodiment of the touchscreen system according to FIG. 10, of which FIG. 12(a) is prior art;

FIGS. 13(a) and (b) show a rectangular touchscreen according to the present invention having two orthogonal sets of wavepaths and an additional diagonal set of wavepaths, respectively;

FIG. 14 shows a rectangular touchscreen according to the present invention having two orthogonal sets of wavepaths and two diagonal sets of wavepaths of which the second set of diagonal wavepaths is shown;

FIG. 15(a) shows a detail of a reflective array according to the present invention having two significant Fourier transform components supporting two distinct spacing vectors for two distinct coordinate subsystems;

FIGS. 15(b) and 15(c) show hexagonal and triangular sensor systems according to the present invention respectively incorporating reflective arrays according to FIG. 15(a);

FIG. 16(a) shows a large area rectangular sensor according to the present invention having segmented reflective arrays;

FIGS. 16(b) and 16(c) show linear segmented reflective arrays and shingled segmented reflective arrays, respectively, according to the present invention;

FIG. 17 shows a generic planar sensor subsystem, similar to the subsystem according to FIG., 10, with intermediate reflections;

FIGS. 18(a)–18(d) shows example touchscreen systems incorporating a sensor subsystem according to FIG. 17, of which 18(c) with common transmit/receive transducer system and 18(d) are prior art;

FIG. 19(a) shows an isometric view of a cylindrical sensor system having a triple superposed array at one end thereof, according to the present invention;

FIG. 19(b) shows a planarized representation of the surface of the sensor system according to FIG. 19(a);

FIG. 20 shows a generic non-planar sensor subsystem, according to the present invention;

FIGS. 21(a) and 21(b) show top and side views, respectively, of a spherical section touchsensor system, according to the present invention, for determining a touch position in a spherical coordinate system;

FIGS. 21(c) and 21(d) show flat-map projection and top views, respectively of another embodiment of a hemispherical touchsensor system according to the present invention;

FIGS. 22(a) and (b) show isometric and plan views, respectively, of a Love wave mode basin sensor according to the present invention;

FIG. 22(c) shows a side view of a half-hemisphere touch sensor having a single transducer and reflective array system according to the present invention;

FIGS. 23(a)–(d) show respectively signals received from transducers of the embodiment according to FIG. 13;

FIGS. 25(a) and (b) show respectively a generalized representation of and a detailed specific example of flow diagrams for an anti-Shadowing algorithm according to the present invention;

FIG. 26 shows a generalized flow diagram for a differential touch characteristic sensing algorithm according to the present invention (see FIG. 28(c) for a specific example);

DETAILED DESCRIPTION OF THE PREFERRED EMBODIMENTS

Figure 1:
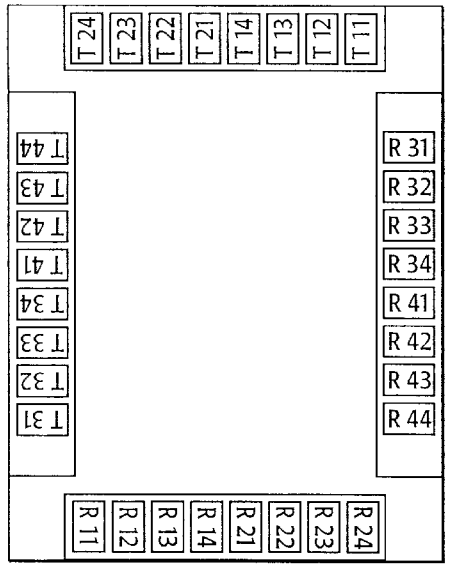
FIG. 1 is a prior art touchscreen system having a plurality each of transmitting transducers and receiving transducers.

The below detailed description and examples are provided to illustrate aspects and examples of the present invention, and should not be considered to limit various other possible combinations or subcombinations of the elements. Therefore, it should be understood that the below examples are preferred embodiments or portions of embodiments which form a part of the invention, which is to be construed in view of the entirety of the specification, including relevant aspects of the recited prior art and the claims.

Overview

Acoustic Waves

The wave employed for sensing touch may be any acoustic wave which is detectably perturbed by a touch on a surface of a substrate. Many options exist for the choice of surface acoustic wave modes. Rayleigh waves have excellent touch sensitivity and are inherently confined to a thin volume close to the touch surface even for a substrate of an arbitrarily large thickness. Horizontally polarized shear waves have the advantage that they weakly couple to liquid and gel-like contaminants such as water and silicone-rubber seals. A non-homogenous substrate may support asymmetric horizontally polarized shear waves, including Love waves, which are horizontally polarized shear waves trapped near the touch surface like Rayleigh waves. Lamb waves in a sufficiently thin substrate provide yet another option for the choice of surface acoustic wave mode. Various engineering trade-offs are involved in the optimal choice of acoustic mode for a given application.

In this context, Love waves may be supported by a top substrate portion having a lower phase velocity interfaced with a lower substrate portion having a higher phase velocity. Similar types of waves, generally classified as asymmetric horizontally polarized shear waves, may be supported by vertical phase velocity gradients of a more complex nature. Asymmetric horizontally polarized shear waves have particular advantages if they have essentially no power density on the lower surface. Where Love waves are employed herein, asymmetric horizontally polarized shear waves may be analogously employed.

The present invention seeks to enhance operation of touchscreens by providing various types of wave redundancy, wherein the redundant wave is subject to differing interferences, tradeoffs and artifacts. Thus, one redundancy strategy provides waves which propagate along differing angles. Thus, a shadowing effect which reduces sensitivity along one wave propagation axis may not also shadow a wave passing along a different axis. A second strategy employs wave having differing modes of propagation, thus allowing the advantages of each mode to be exploited, while allowing differential detection to determine an absorptivity characteristic of a touching object. When the differing wave modes travel along differing axes as well, further robustness is obtained.

Use of differing frequencies increases the options for implementing wave redundancy. In addition to differentiating redundant waves via differentiating axis or modes, different sensor subsystems may be distinguished by narrow band filters and filtering techniques. In addition, by operating at differing frequencies and differing modes, physical structures of the touchscreen may be redundantly employed to reduce substrate system complexity. Furthermore, a given acoustic mode, e.g. Rayleigh, at different frequencies will differ in characteristics, e.g. touch sensitivity and the amount of shadowing from contaminants, so that use of different frequencies can serve similar purposes as the use of differing acoustic modes.

It is noted that typical known acoustic touchscreens employ two different angles, e.g., X and Y axes. However, these are not considered redundant except for the existence of a touch, rather than its position. Therefore, aspects of the present invention provide a system which is capable of providing redundant information defining a position along at least one coordinate axis, or a position along a coordinate axis which does not correspond to an edge of the substrate.

Substrate

An acoustic touchscreen sensor is often constructed from a sheet-like substrate, which is a material capable of supporting propagation of acoustic waves with relatively low attenuation. Often, touchscreens are disposed in front of display devices, and thus they are transparent. The present invention allows the acoustic substrate to be an integral component of a display device, such as the face-plate of a cathode ray tube. The acoustic substrate may also be a touch-sensitive mechanical surface of a device, in the absence of an associated display device. In circumstances where transparency of the substrate is not required, a metal (e.g., aluminum or steel) or ceramic substrate may be employed.

The substrate or a component of a substrate, e.g., a portion of an acoustic filter, may also be formed of plastic. It is noted that most plastics are typically more acoustically absorptive than inorganic materials such as glass, and therefore may be unsuitable for use as monolithic substrates for acoustic touchsensors of substantial size. However, for smaller devices, plastics may be employed as the substrate or a component of a substrate. Acoustic absorption varies greatly for different polymer materials. Amongst plastics, polystyrene, low density polyethylene, Nylon 6/6, polypropylene, Lustran and acrylic have relatively less acoustic absorption. For an all plastic substrate, use of such a relatively low-loss plastic is preferred. If plastic is used to form a portion of an acoustic filter, then use of a higher-loss plastic may be permitted or even desired.

The substrate may be monolithic, laminated or coated. Non-monolithic substrates may he employed to alter a wave energy distribution in the substrate, support selected wave mode propagation, or to filter undesired wave modes. For example, a sandwich of a slow-velocity layer on a fast-velocity layer on an acoustically absorptive layer may support Love waves and simultaneously filter out parasitic plate waves. Thus, the substrate may comprise layers having differing acoustic propagation properties and/or acoustic interfaces.

In some cases, it may be convenient for manufacturing purposes to fabricate reflective arrays on strips of material which are then bonded onto the rest of the substrate; see U.S. Pat. No. 4,746,914, column 9. Thus a laminated structure may be used for manufacturing convenience or packaging configuration. Such laminated strips may also achieve benefits in acoustic performance.

A sheet-like substrate, in a touchscreen embodiment for a computer video display monitor, is commonly 2 to 3 mm thick transparent soda-lime glass. It is noted that various substrates may provide particular advantages for acoustic touchscreen sensors. For example, borosilicate glass has been found to have up to approximately 30 dB increased signal-to-noise ratio over soda lime glass for a typical Rayleigh mode touchscreen system for a display monitor. Further, the reduced rate of acoustic attenuation in borosilicate glass is of increasing benefit as the lengths of the acoustic paths increase. Accordingly, a borosilicate glass substrate may therefore be advantageously used for large dimension sensor systems, or those with long acoustic wave paths.

One advantageous embodiment of the present invention provides a borosilicate glass substrate on the back of which is laminated, or otherwise provided, a projection screen. Note that the use of Rayleigh, Love and any other mode that has little energy on the back surface can be conveniently used with a lamination or other acoustically absorptive structure on the back surface. Known projection Systems include cathode ray tubes, liquid crystal shutter devices, electro-optic projection of laser beams, and other spatial light modulators, such as a so-called digital mirror device ("DMD") from Texas Instruments. Borosilicate glass may thus be advantageous for the large areas of image projection devices. In addition, the geometric flexibility of the present invention enables considerable increase in the maximum feasible sensor size. Furthermore, such large devices may be placed in environments subject to environmental contamination, and therefore benefit from a robust touch sensing system as provided by the present invention, e.g., by use redundant or differential sensing of touch coordinates.

A large substrate may also be employed in a large white board application, in which the substrate is touch sensitive over a large area. In a white board application, the substrate need not be transparent, and therefore may be formed of an opaque material such as aluminum. Advantageously, aluminum and some other metals may be coated with an enamel with a relatively slow acoustic phase propagation velocity, thus supporting a Love wave with high touch sensitivity (relative to horizontal shear plate-wave modes) on the front surface.

A touch sensor substrate suitable for Love waves, a shear-type wave having wave energy at one surface and substantially less on the opposed surface, is formed as a laminate of two or more substrate materials which differ in phase velocity, with the lower velocity on the top, sensitive surface. The laminate may include a number of layers, which follow a generally increasing pattern of phase velocity change. Alternately, the laminations may have varying phase propagation velocities, provided as a filter arrangement to particularly select a desired Love wave mode. Filtering by the substrate may be direct, e.g., undesired modes are damped or evanescent, or indirect, phase velocity differences between desired mode and undesired modes are increased, thus enhancing the mode filtering performance of reflective arrays. Therefore, alternating layers of higher and lower phase velocity materials, with an overall asymmetry may be provided to help, e.g., reflective arrays, select a desired Love wave. By selecting the phase velocity distribution, the laminated substrate may selectively vary properties of different wave modes.

An example of a Love-wave substrate with a lower velocity surface layer, is a 2 mm glass sheet having a uniform coating of lead-based frit of 0.1 mm thickness. Other frit or glazing options may be appropriate for applications where acid leaching of lead from the touch surface is a potential health hazard. It is possible to construct Love wave substrates that strongly capture acoustic energy near the surface and hence improve touch sensitivity. For example, a 100 micron thick layer of lead-containing enamel having a shear velocity of less than about 2.6 mm/μsec, on top of a 2–3 mm thick aluminum sheet with shear velocity about 3.0 mm/μsec, captures the majority of Love-wave power within 200 microns of the surface; such a substrate is very similar to a known enamel-coated architectural aluminum panel.

Further, a glazed ceramic will also support Love wave propagation, provided that the glaze has a reduced shear wave velocity relative to the ceramic. Thus, for example, a basin may be formed as a plumbing fixture, e.g., a sink, or toilet bowl.

The substrate may be formed as a flat plate with a rectangular shape or a non-rectangular shape such as a hexagonal. Alternatively the substrate may be curved along one or both axes as a cylindrical, spherical or ellipsoidal surface or section surface, or may have other configurations. In particular, large solid angle spherical, and complete cylindrical substrates are contemplated. This invention provides flexibility in the layout of transducers and arrays to accommodate such a variety of sensor shapes. For example, a polygonal touch sensor may be provided with reflective arlays on each side and transducers at each vertex.

Cylindrical substrates are particularly interesting applications of the present invention, because perimeter reflective arrays may be used without need for arrays parallel to the axis of the cylinder, allowing determination of both axial position and angle. Thus, a cylindrical touch sensor may be used for electronically controlling focus and zoom of a camera lens in a cylindrical housing without external moving parts. By employing selected wave modes having low fractional absorption by water and a significant differential absorption between water and flesh, e.g., horizontally polarized shear waves, applications such as an underwater camera control may be supported.

Reflective Arrays
Spacing-vector Formula

Reflective arrays coherently scatter or redirect acoustic energy in a controlled fashion. Referring to FIG. 10, general principles of reflective array design are introduced below. These very board principles enable engineering of novel reflective array designs.

A comment on notation: in this document, variables which are vector quantities are given in bold face, while scalar variables are not.

Reflector orientations and spacings can be determined from the wave vectors of the desired incident and reflected acoustic waves. These wave vectors are defined as follows. Let the wave vector $k_I$ be defined as parallel to the incident beam direction and as having a magnitude $k_I = 2\pi/\lambda_I$. The wavelength of the incident beam, $\lambda_I = v_I/f$, is determined from the operating frequency, f, and the phase (not group) velocity, $v_I$, of the incident wave. Likewise for the reflected wave, let us define $k_R$ be defined as parallel to the reflected beam direction with magnitude $k_R = 2\pi/\lambda_R$ where $\lambda_R = v_R/f$ with $v_R$ being the phase velocity of the reflected wave.

These wave vectors may be a function of position along the array. For this purpose we introduce a path parameter "s" which uniquely identifies members of sets of acoustic wave paths, and hence also the position along arrays at which the acoustic path is scattered from the transmit array or scattered onto the receive array. For example each member of the set of acoustic paths can be represented by a value of "s" between zero and one. In general, the incident and reflected wave vectors for an array are functions of s: $k_I(s)$ and $k_R(s)$. For a sensor system as described in U.S. Pat. No. 4,645,870, in which the value of s for a touch is identified by the frequency of the signal absorption, even the operating frequency, f(s), and hence the wavelengths, $\lambda_I(s)$ and $\lambda_R(s)$, depend on the path parameter. For notational convenience, the path parameter dependence is not always explicitly written and is implicitly implied. In many cases, such as flat rectangular sensors of the prior art, the wave vectors are constants that do not depend on the path parameter.

The spacing and orientation of the array reflectors, for each position along a reflective array, can be determined from the wave vectors $k_I$ and $k_R$. Consider, for example, the case where the reflective array is composed of line-segment reflector elements; see FIG. 11. Of particular interest is the reflector spacing vector S which is perpendicular to the reflector lines and has a length equal to the center-to-center spacing between reflector elements in a direction parallel to S. If the reflector spacing vector S is known, then so are the orientations and spacing of the reflectors.

It is noted that the line-segment reflector elements represented in FIG. 11 are a form of pulse compression filter, and other known types of such pulse-compression filters may be employed according to the present invention, as appropriate.

The spacing vector, which in general is a function of the path parameter, may be determined from the incident and reflected wave vectors as follows.

$$S = 2\pi n (k_I - k_R)/|k_I - k_R|^2$$

This is the fundamental equation of coherent reflective array design. All reflector element orientations and spacings found in the prior art can be derived as special cases of this general formula. Furthermore, this fundamental equation enables the design of arrays for large families of new sensor embodiments outside the scope of prior art. Given its importance, the derivation of this spacing-vector formula is presented is some detail below.

For the derivation, we define a reflector orientation vector R which is parallel to the reflector line elements and whose length is the distance from point A to point C in FIG. 11. The reflector spacing vector S is perpendicular to the reflector elements; in vector dot-product notation, this orthogonality condition is expressed as R·S=0.

Note, for example, that $k_I \cdot R = (2\pi/\lambda_I) \times R \times \cos(\theta)$ where θ is the angle defined by the points A, C, and F. R×cos(θ) is the extra distance the incident acoustic wave must travel to intercept the reflector at point C rather than point A. Hence $(2\pi/\lambda_I) \times R \times \cos(\theta)$ is the phase advance, in radians, of the incident acoustic mode in propagating from point F to point C.

Similarly $k_R \cdot R$ is the phase advance for the reflected acoustic mode propagating from points A to G.

Coherent scattering from arbitrary pairs of points within a given reflector element, e.g. points A and C, requires equality of the phase delays $k_I \cdot R$ and $k_R \cdot R$. This requirement can be expressed as $(k_I - k_R) \cdot R = 0$, that is, the reflector elements are perpendicular to the vector difference of the incident and reflected wave vectors.

If there is no mode conversion, and hence the wave vectors $k_I$ and $k_R$ have the same magnitudes, $(k_I - k_R) \cdot R = 0$ reduces the angle-of-incidence-equals-angle-of-reflectance rule familiar from the optics of mirrors. If there is mode conversion, then the angle of incidence no longer equals the angle of reflectance, but rather is quantitatively analogous to Snell's law familiar from refraction in optics (where phase velocity equals the speed of light divided by the index of refraction).

Note that because vectors S and $(k_I-k_R)$ are both perpendicular to the reflector elements, both are orthogonal to R. Hence they must be parallel to each other (the algebraic sign of ±S is physically irrelevant, so there is no loss of generality if we neglect the possibility that they are anti-parallel). This confirms that the spacing-vector formula correctly gives the spacing vector direction.

Now consider the requirement that scattering between arbitrary points on different reflectors be coherent. In particular, consider scattering from points B and C in FIG. 11. The phase delay for the incident wave propagating from points D to B can be shown to equal $k_I \cdot S$. The phase delay for the scattered mode to propagate from points B to E is $-k_R \cdot S$. Hence the total phase delay for scattering off of point B relative to scattering off of point C is $(k_I-k_R) \cdot S$. To have coherent scattering between reflector elements, this total phase advance must be an integer multiple of $2\pi$, and hence the condition $(k_I-k_R) \cdot S = 2\pi n$.

Together, the within-reflector-coherence condition, $(k_I-k_R) \cdot R=0$, and the between-reflector-coherence condition, $(k_I-k_R) \cdot S=2\pi n$, tells us that $(k_I-k_R)$ is parallel to S and has a magnitude of $2\pi n/S$. Hence we have the following equality.

$$(k_I-k_R)=2\pi n S/S^2$$

Solving for S gives the fundamental spacing-vector formula given above.

A given spacing vector S will support scattering in the reverse direction. More formally, if we define the reverse-direction wave vectors $k_I'=-k_R$ and $k_R'=-k_I$ then a spacing vector S satisfies the spacing-vector formula for $k_I$ and $k_R$ if and only if it satisfies the spacing-vector formula for $k_I'$ and $k_R'$.

A special case of a spacing vector is an "n=1 spacing vector" which satisfies the following relation that does not contain a factor "n".

$$S=2\pi(k_I-k_R)/|k_I-k_R|^2$$

From a mathematical perspective, this is the most fundamental form of the spacing vector formula. Mathematically, a reflective array with a spacing vector of S is typically a superposition of a components with spacing vectors of S/2, S/3, etc. The n>1 solutions result from coherent scattering off of these "higher harmonics" of the basic reflector spacing.

Definition of Reflective Array

Reflective arrays in known systems and available touch-screen products are composed of line-segment reflective elements composed of material deposited on the substrate surface, fabricated by removing material from the substrate surface, or combinations of both. Here we define a reflective array more generally to be a region of a sensor subsystem in which the acoustic properties of the medium have been modulated in such a fashion to produce a distribution of scattering centers which has a significant two-dimensional Fourier-transform amplitude for the point in two-dimensional wave-vector space given by $2\pi S/S^2$ where S is a desired n=1 spacing vector. This condition assures coherent scattering in the desired direction into the desired acoustic mode.

In a preferred embodiment, reflective arrays are composed of linear reflector elements as illustrated in FIG. 11. The reflective arrays may be formed by any means that alters the acoustic impedance of the substrate for the incident acoustic waves. In a preferred embodiment, reflector elements are raised lines formed by screening glass frits through a stencil on the surface of the substrate and subsequently firing the screened substrate to fuse the frit to the substrate. In another embodiment, the reflectors are depressions in the acoustic substrate, perhaps back-filled with another material. Manufacturing cost considerations often guide the choice amongst the many options here.

While the general definition of reflective arrays includes arrays of line-segment reflectors in which the shortest distance between reflectors is given by the desired n=1 spacing vector S or a multiple thereof, this is not a requirement. For example, in analogy with crystal diffraction of neutrons off of nuclei, a reflective array may be composed of an array of reflective dots. X-ray crystal diffraction provides an analogy where the distribution of scattering centers (probability densities for electron orbitals) is more complex; reflective arrays need not be divisible into well-defined or isolated reflective elements. For example, a ductile substrate surface, e.g. aluminum or temporarily heated glass, may be modulated in a sinusoidal or more complex fashion by a stamping process. The coherent scattering principles in the spacing-vector formula are independent of the details of reflective array fabrication techniques.

Many embodiments involve superposed reflective arrays. The general definition of a superposed array is a region of a sensor subsystem in which the acoustic properties of the medium have been modulated in such a fashion to produce a distribution of scattering centers which has significant two-dimensional Fourier-transform amplitudes for two or more points in 2-D wave-vector space given by $2\pi S_i/S_i^2$ where Si for i=1,2, ... are two are more desired n=1 spacing vectors.

As stated above, other types of pulse compression filters may be employed to redirect or scatter portions of the acoustic wave along desired paths or sets of paths. Generalizing, therefore, the pulse compression filter has at least one two dimensional Fourier transform with an admittance for a desired wave or set of waves. Examples of these other types of pulse compression filters are employed, for example, in the field of piezoelectric radio frequency surface acoustic wave (SAW) devices.

Shared Wave Paths

In order to simplify the construction of the system or to support more compact sensor designs, a plurality of desired waves may share physical elements and portions of wave paths. In order to create a system in which a plurality of sensor subsystems share portions of wave paths, a number of configurations are possible.

First, a reflective array having a set of reflective elements with a characteristic spacing and angle which is suitable for scattering two different waves may be employed to generate two sets of wave paths, which are ultimately analyzed. Thus, the same physical elements of the reflective array may be used to reflect both waves. Generally, suitable waves may differ in frequency and/or wave mode. Referring to FIG. 11, this is the case in which a single spacing vector, S, simultaneously satisfies the spacing vector formula for two or more combinations of incident and reflected wave vectors; the value of n need not be the same for the two or more combinations. While this approach provides an elegant economy of design, the spacing-vector formula places constraints that limit the geometrical flexibility of this approach.

Second, a plurality of arrays may be provided, adjacent to each other, as shown in FIGS. 18(a), and (c). In this case, each array may be provided with a separate transducer or a transducer wide enough to excite acoustic waves propagating through more than one array. The spatial separation of the arrays provides opportunity for filtering of the wave between the arrays to remove undesired components. A wave from a lateral array must pass through a medial array in order to travel to or from the central, touch sensitive region. Scattering from undesired array may lead to some loss of signal amplitude and perhaps generation of parasitic acoustic paths; typically this will be a minor effect because only a small portion of the wave will be scattered by each array the wave passes through. If necessary, various parasite suppression techniques discussed below may be applied. For applications with tight space constraints, this approach has the disadvantage that the region containing the arrays near the edge of the substrate may need to be relatively large.

Third, arrays may be placed on opposite faces of the substrate. In this case, the waves intended for interaction with the reflective arrays on the back of the substrate must have a significant power density on the rear surface of the substrate, as is the case for plate waves. For example, A reflective array on the top surface may have a spacing vector designed for Rayleigh-to-Rayleigh scattering, and a rear reflective array may have a spacing vector designed to couple a HOHPS wave in the touch region to a back-side Rayleigh wave. This approach contrasts with the top-and-bottom array schemes proposed for Lamb wave sensors in order to distinguish symmetric and antisymmetric Lamb waves, allowing one to assure that only one acoustic mode is emitted; see U.S. Pat. Nos. 5,329,070, 5,243,148, 5,072,427, 5,162,618, and 5,177,327.

Fourth, a plurality of reflective elements arranged as arrays may be superposed in the same physical space, or more generally the reflective array may be designed by whatever means to support more than one spacing vector, as shown in FIG. 15(a). This configuration is generally preferable, because of its efficient use of spacing, efficient use of transducers and corresponding wiring and electronics. If the differing acoustic modes propagate along the superposed arrays, e.g., Rayleigh and shear, distinct transducers may be required. Advantageously, where the arrays are physically superimposed and only a single mode is propagated along the array, a single transducer may be employed.

Reflective Boundaries as Example of Reflective Array

The acoustic path may encounter a reflective boundary between scatterings off of the transmit and receive arrays. This is the generalized concept shown in FIG. 17. The reflective boundary may utilize coherent scattering from a superposition of scattering centers, and if so can be designed using similar principles as for reflective arrays that follow segments of acoustic paths. For example, the spacing vector formula can still be applied. Note, however, that for reflective boundaries, it may be advantageous to use reflective elements that scatter more strongly.

In many cases, a reflective boundary enables common or superposed transmit and receive arrays. For example, consider a superposed reflective array on a flat substrate including elements disposed at angles of $45°\pm\theta$. Thus, waves propagating along the array will be scattered at angles of $90°\pm2\theta$. Where a reflective structure is disposed opposite and parallel to the superposed reflective array across the substrate, and the reflective boundary's spacing vector is perpendicular to the boundary, waves will travel in sets triangular paths.

Under certain circumstances it may be desired to alter a wave mode while reflecting from a reflecting structure, rather than at the reflective array. In this case, the reflective structure may be provided as a series of appropriately spaced parallel elements which together efficiently scatter the wave energy as a selected mode; the coherent-scattering condition of FIG. 11 applies to reflective boundaries as well as reflective arrays. For example, a variant of the triangular acoustic paths above is one in which the reflective boundary and one of the sets of reflectors of the reflective array are designed as mode converters.

Parasitic Acoustic Paths

Engineering care may sometimes be required in array design to minimize creation of undesired parasitic acoustic paths which can result in signal artifacts. There are many means available to suppress such parasitic signals.

The reflective arrays serve as narrow band filters for both wavelength and angle of propagation. Thus, a reflective array has a high directional sensitivity, which in conjunction with the transducer's directional sensitivity, serves to limit the angular acceptance of the system. Thus, stray wave energy rarely causes substantial interference in the received electronic signal.

In cases were a parasitic acoustic path has a delay time longer than the delay times of the desired signals, the parasitic signals may be eliminated by time gating of the received signals.

The elements of the reflective array are designed to be inefficient reflectors, i.e., they allow a substantial portion of the wave to pass unscattered, with a small portion being scattered according to known principles. In a preferred array design, of order 1% of incident wave energy is scattered at elements of an array. Since the reflective elements each reflect of order 1% of the incident wave energy, reflected waves which are not directed directly toward the receiving transducer will require an additional reflection, and therefore will be substantially attenuated as compared to a desired signal. Studies by the present inventor have determined, in fact, that the primary interference due to stray acoustic energy is related to parasitic paths having a small number of reflections in its wave path, rather than scattered wave energy having elongated paths involving multiple reflections. Thus, interference may be controlled by attention to a relatively small number of direct parasitic paths rather than a large number of indirect paths.

Another result believed attributable to the relatively low reflectivity of the reflective elements and arrays as a whole is that small signal presumptions, e.g. the principle of superposition, are valid when analyzing the reflective arrays. Thus, the present inventor has found that low reflectivity reflective arrays, when overlayed, superpose generally linearly, without significant higher order effects. Thus, the intersections of the overlayed elements, as well as potential resonances, did not result in artifacts, distortion, undue parasitic paths or inoperability.

Signal Equalization Methods

Controller electronics and associated touch recognition algorithms typically can accommodate variations in signal amplitudes (before a touch) without variation in the touch sensitivity as perceived by a user. There is always a limit to the dynamic range of amplitudes that can be thus accommodated. Hence, it is generally desirable to limit the dynamic range of signal amplitudes within the useful time window of a received signal for the set of acoustic paths of a sensor subsystem. The variation is signal amplitudes can be controlled by a number of signal equalization methods.

Below a number of signal equalization methods are described. Combinations of these methods may be used simultaneously.

The power density of reflected acoustic waves may be controlled by a "reflective element withdrawal" method, as discussed in U.S. Pat. No. 4,644,100 and Re. 33,151. Here the spacing of reflector elements is varied. Here the "n" in the spacing vector formula, and hence the series of discrete options for the spacing vector S compatible with desired incident and reflected wave vectors, is used advantageously as a locally varying array parameter. The "reflective element withdrawal" method is such that selected reflective elements in the array are eliminated from a nominal dense n=1 array. It is noted that for superposed or dual use arrays, the optimal reflective element placement may vary from that provided for simple reflective arrays.

Note that with the withdrawal method, the local spacing vector is increased in length by an integral multiple, e.g., m. This increase in spacing makes it more likely that coherent parasitic scattering will take place because withdrawn reflectors are no longer available to provide destructive interference for undesired scattering. More formally, an integer value for n' may exist for a parasitic scattered wave vector $k'_R$ for a value of m greater than one, where no such solution exists for m=1:

$$mS(s)=2\pi n'(k_I-k'_R(s))/[(k_I-k'_R(s))\cdot(k_I-k'_R(s))]$$

In cases where this proves to be a significant cause of parasitic signals, alternate signal equalization techniques are preferred.

Another method of obtaining constant power density includes varying the power reflectivity at points along the array by providing a variable height reflective elements. Such reflecting elements of reflective arrays having varying height are known, see U.S. Pat. No. 4,746,914, incorporated herein by reference.

A further method of modulating reflected power is the use of segmented or truncated reflective array elements, having interrupted reflective elements, e.g., dashed or dotted lines, or staggered lines. See, U.S. Pat Nos. Re. 33,151, and 4,700,176, FIGS. 9, 10 and 10a, and accompanying text, incorporated herein by reference.

A still further method of modulating reflected power is to vary the line width of reflector lines. A reflector element of finite width can be analyzed as a superposition of many adjacent reflector elements of infinitesimal width. The scattering amplitude for the finite width reflector is the vector sum of the scattering amplitudes of its infinitesimal elements. In known sensors, the line width of the reflector element is designed so that there is a 180° path-length phase delay between the scattering off of the first and last infinitesimal reflector elements of the line width; and hence the line width is chosen to maximize the scattering amplitude. Therefore, the present invention encompasses a new reflected power modulation technique, that of reflective element line-width modulation. This method has an interesting benefit in the context of the present invention; for some parasitic scatterings, it is possible to pick a line width that substantially eliminates the parasitic scattering amplitude and yet supports a useful scattering amplitude for the desired signal path. This method is also advantageous for superposed reflective arrays because it allows modulation of reflected power while maintaining a uniform frit thickness. More generally this method supports array designs suited to manufacturing processes that support only one modified acoustic impedance of the substrate.

Segmented Reflective Arrays

Figure 6B:
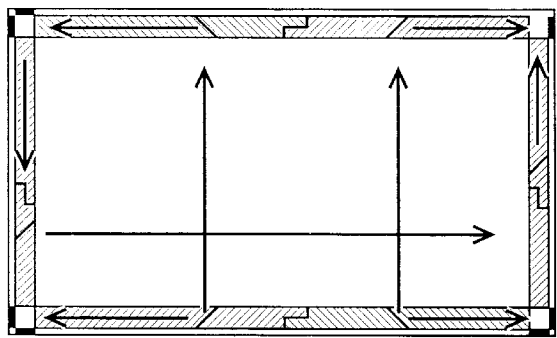
FIG. 6B is a touchscreen system having eight transducers and four segmented reflective arrays.
Figure 6A:
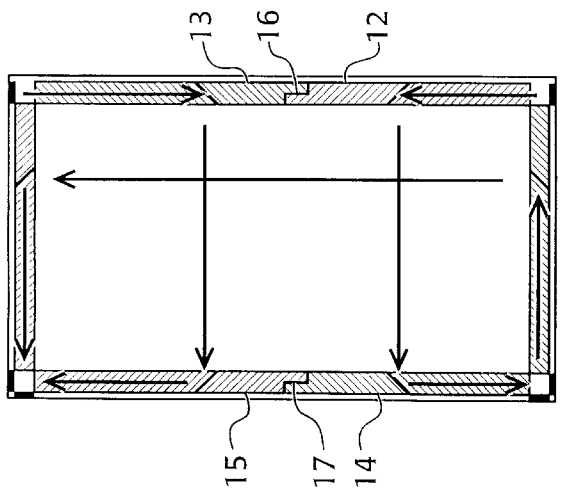
FIG. 6A is a prior art touchscreen system having six transducers, two normal arrays and two segmented reflective arrays
Figure 8:
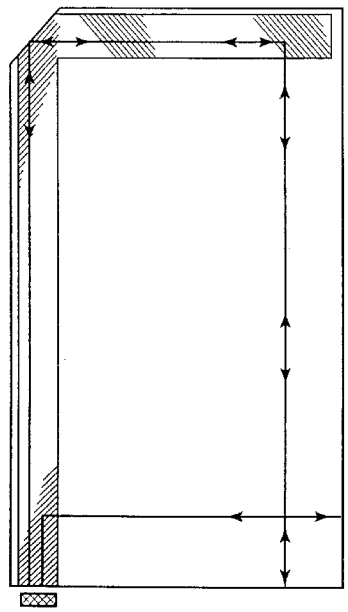
FIG. 8 is a prior art triple transit touchscreen system having one transducer and two reflective arrays.

In order to reduce an acoustic path length in large substrates, a side of a substrate mat be subdivided into a plurality of segments, each with its own transducer and reflective array associated with that transducer, as shown in FIGS. 6(a) and (b) and 16(a)–(c). Thus, an acoustic wave path need not include the length of an entire side of a substrate. Where the side is bisected, in a known embodiment shown in FIG. 6(a), the two transducers may produce or receive waves traveling in antiparallel directions along a reflective array which is provided as two reflective arrays which each reflect an acoustic wave directly into a touch sensitive portion of a substrate. The two reflective array portions overlap slightly, so that the overlapping portion is sensed by parallel waves of the same type produced by two transducers.

More generally, a reflective array may be segmented and disposed along a perimeter of an active region of a substrate. In this case, each segment includes a transducer at one terminus. According to this segmented array arrangement, the acoustic wave path length is reduced to the distance across the substrate plus the lengths of the transmitting and receiving arrays, which are shorter than the length of the substrate on the side where the arrays are situated.

Segmented arrays 1601 may lead to blind spots 1602 in a composite system at the junction of adjacent segments, as shown in FIG. 16(b). In some cases of sufficiently redundant sensor systems, such blind spots may be acceptable. In other cases blind spots may be avoided by arranging the reflective arrays to be shingled, i.e., inclined and overlapping a small amount at respective ends, as shown in FIG. 16(c), with the end of the array 1603 associated with the transducer 1604 being placed behind another array 1605. In this case, the angles and spacing of the reflectors should be adjusted as compared to a non-inclined array, per the principles of FIGS. 10 and 11, to provide waves propagating along desired axes. In a special case noted above, as shown in FIGS. 6(a) and 6(b), two end-to-end arrays 12, 13, 14, 15 (with antiparallel propagating waves) may avoid a blind spot by providing an overlapping portion 16, 17, but this solution is only applicable to front-to-end bisected systems.

Reverse Reflection

In some cases, it may be advantageous for an array to direct an acoustic path away from the touch region towards a reflective boundary, and hence only indirectly couple to acoustic path segments across the desired touch region. U.S. Pat. No. 5,260,521, incorporated herein by reference, in particular FIG. 17 and accompanying text thereof, illustrates such an arrangement. As shown in this prior art example, such reverse reflection provides additional opportunities to include mode-selective filtering within the acoustic path. It is noted that, according to the present invention, the reflective boundary according to the present invention need not comprise an edge of a substrate or be parallel to an edge of the substrate and/or a reflective array.

It the context of the present invention, reverse reflection may offer another possible benefit. If a desired spacing vector of a superposed a array $$S=2\pi n(k_I-k_R)/|k_I-k_R|^2$$

contributes to an undesired parasitic acoustic path, reverse reflection can allow use of a similar set of acoustic wave paths in the desired touch sensitive region of the sensor while employing a completely different direction for the spacing vector, due to a reversal of for the scattered wave vector. This adds to the design options available to suppress parasitic paths.

The reflective portion may be a cut edge of the substrate, or one or more parallel reflective elements providing a highly reflective interface for the desired wave(s). These reflective elements may be formed in similar manner to the reflective elements of the reflective arrays, although for increased reflectivity, a relatively large scattering strength is preferred. Advantageously, a reflective structure may be provided which controls an angle of reflection, thereby reducing reliance on the edge condition of the glass, and allowing fine control over the propagation angle of each wave path.

Reverse reflection typically adds to the acoustic path length and hence adds to the delay times. In some cases, this may provide means to avoid time overlap between signals from two sensor subsystems.

Under certain circumstances it may be desired to alter a wave mode while reflecting from a reflecting portion. In this case, the reflective portion may be provided as a series of parallel elements whose spacing satisfies the vector-spacing formula for the desired scattering of incident wave energy into the selected mode.

In various sensor configurations, the desired touch sensitive portion of a substrate may be disposed as desired, for example medial or lateral to a reflective array with respect to a boundary of the substrate.

Electronics

Transducer Interface

The transmitting and receiving transducers couple electrical energy to and from the controller to acoustic energy in the touchscreen. While other types of transducers are possible, transducers based on piezoelectric elements are generally preferred for reasons of cost, mechanical compactness, and performance.

A piezoelectric element is typically in the form of a thin rectangular slab having conductive portions serving as electrodes on two opposing surfaces. When an oscillating voltage signal is applied to the electrodes, the resulting electric field within the piezoelectric material, via the piezoelectric effect, causes the element to vibrate. Conversely, if the element is subjected to mechanical oscillations, an oscillating voltage will appear on the electrodes.

There are several options regarding the mode of the piezoelectric element's mechanical oscillations. A common choice is the lowest-order compression-expansion illation with respect to the thin dimension of the element; such an element couples to bulk pressure waves or other acoustic modes with a significant longitudinal component. Another option is a lowest-order shear oscillation in which one electrode-bearing surface moves anti-parallel to the opposite face; such an element couples to bulk shear waves and other acoustic modes with shear components. The direction of shear motion can be designed to be any direction within the plane of the electrodes. More complex options are also possible. According to one aspect of the present invention, various sets of sensing waves propagating in the substrate may be distinguished according to their propagation mode by selective coupling to appropriate mode-sensitive transducers.

Typically, piezoelectric elements are designed to have a resonant frequency at the operating frequency for the desired mode of oscillation. For lowest order compression oscillation, the resonant frequency is the bulk pressure-wave velocity (in the piezoelectric material) divided by twice the piezoelectric element thickness so that the piezo transducer element is a half wavelength thick. Similarly, a lowest-order shear-mode piezoelectric element is half of a bulk-shear wavelength thick. As used in a touchscreen, the piezoelectric element is a damped mechanical oscillator due to coupling to acoustic waves in the substrate. The mechanical quality factor, Q, is typically in the range from 5 to 20. Viewed as a frequency filter, the piezoelectric element has a corresponding relatively broad bandwidth; two signals at frequencies that are considered distinct by controller receiver circuitry might still use a common transducer.

Figure 2:
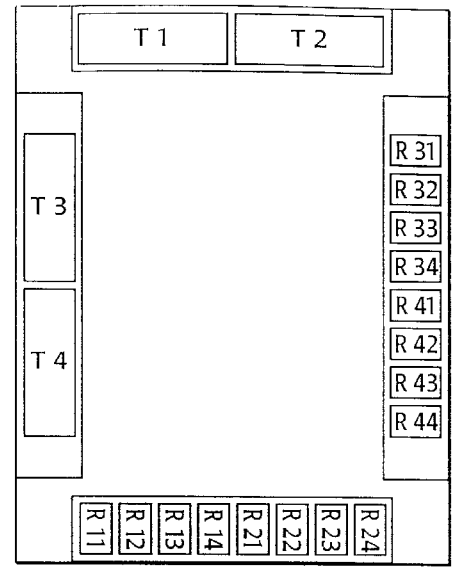
FIG. 2 is a prior art touchscreen system having transmitting transducers which emit a wide acoustic wave.
Figure 3:
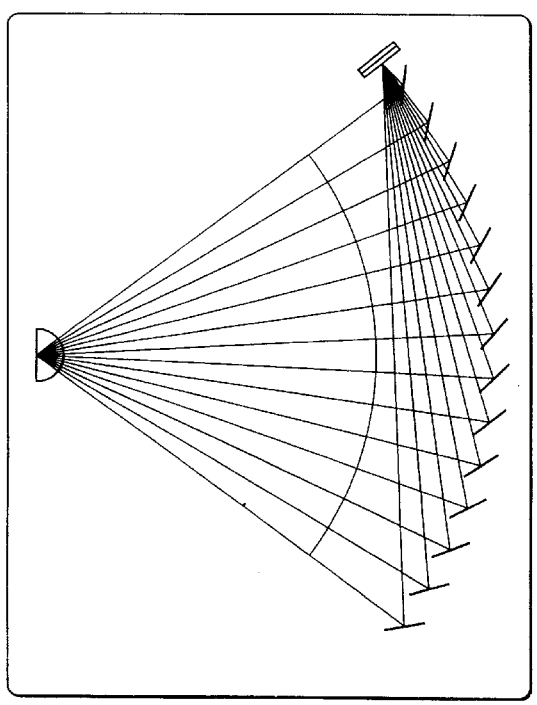
FIG. 3 is a prior art touchscreen system having a diverging transmitting transducer with a single reflective array along a curved path.
Figure 4:
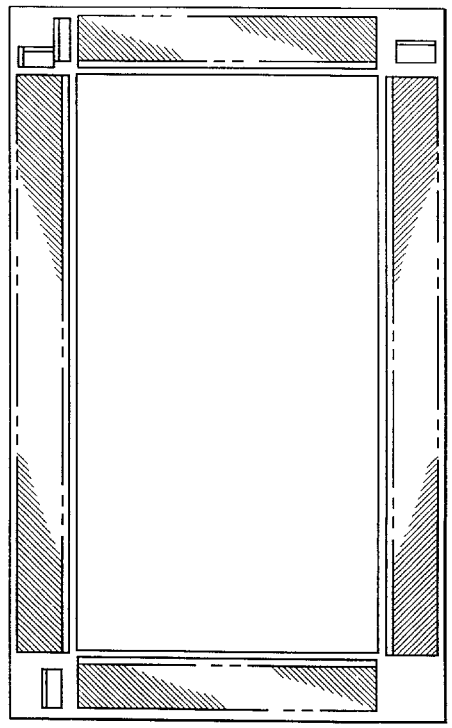
FIG. 4 is a prior art touchscreen system having four transducers and four reflective arrays.

A piezoelectric element may be bonded directly to the touchscreen substrate and thus form a transducer. For example, see FIG. 2B of U.S. Pat. No. 5,162,618, incorporated herein by reference in its entirety. Such transducers are typically placed on the edge of the substrate and referred to as "edge transducers". A transducer may include more than one piezoelectric element which may help coupling to the desired acoustic mode; for example see FIG. 2D of U.S. Pat. No. 5,162,618. All transducers shown in FIG. 2 of 5,162,618 may be used with this invention.

The piezoelectric element may be coupled indirectly to the touchscreen substrate. For example, see the "flexible connector" that serves as an acoustic transmission line between the piezoelectric element and the substrate in FIG. 12 of U.S. Pat. No. 5,072,427, incorporated herein by reference in its entirety.

In a preferred embodiment, the transducer includes a wedge shaped coupling block between the piezoelectric element and the touch substrate. When used as a transmitting transducer, the piezoelectric element generates bulk waves in the wedge material which in turn couple to the desired acoustic mode in the touch substrate. For example, in commercial touchscreen products of Elo TouchSystems, pressure-mode piezoelectric elements are coupled to Rayleigh waves in this fashion with an acrylic wedge. Alternatively, a wedge transducer may couple a horizontally polarized shear piezoelectric element to Love waves in a suitable touch substrate. The wedge material must have a bulk wave acoustic velocity that is slower than the phase velocity of the desired mode in the touch substrate; the cosine of the wedge angle equals the ratio of these two velocities.

The receiving transducer may also serve as the transmitting transducer in certain embodiments. When the same transducer is used for both transmission and reception, the low-voltage high-sensitivity receiver electronics may be temporarily disconnected through a high impedance switch from the higher voltage transmitting electronics.

The transmitting transducer receives a sine wave or pseudo sine wave tone burst at the desired frequency, from the controller. This burst typically has a power spectrum with a maximum at a nominal operating frequency. Normally, the sensor is tuned for use at a specific frequency or set of frequencies, and therefore this parameter is predetermined. See, U.S. Pat. No. 4,644,100, Re. 33,151, and 4,700,176, incorporated herein by reference.

Piezoelectric transducers of the type described are inherently directional. Acoustic-electronic coupling is strongest when all parts of a piezoelectric are driven, electronically or mechanically, in phase. Thus, waves which are incident at a skewed angle to the face of the piezoelectric element, have a substantially reduced off axis response.

Typically, transducers are mode selective. For example, a wedge transducer with a pressure-mode piezoelectric element may be sensitive to Rayleigh waves but insensitive to horizontally polarized shear waves. A transducer based on an edge mounted horizontally-polarized shear mode piezoelectric element may be sensitive to ZOHPS waves but insensitive to Lamb waves. The mode selectivity of transducers contribute to the suppression of signals from parasitic acoustic paths.

It is noted that, as used herein, the transducer system comprises the transducer and any associated array. Therefore, the transducer system generates sets of incrementally varying waves traveling through the substrate, which may be of the same or different wave propagation mode as generated by the transducer itself.

Control System

The control system has a number of functions. First, an electronic signal is generated, which excites the transducer to generate an acoustic waves which subsequently form the sets of waves. A transducer then receives the sets of waves, and transduces them to an electrical signal. The electrical signal is received, retaining significant information with a relatively high data rate in a low level control system. An intermediate level control system, often combined structurally with the low level control, processes the received data, seeking to identify and characterize perturbations. For example, in one embodiment, the intermediate level control filters the signal, performs baseline correction, and determines a relation of the signal to a threshold. A high level control analyzes the signal perturbations and outputs a touch position. The control system as a whole therefore has the functions of exciting an acoustic wave, receiving portions of the acoustic wave bearing touch information as a perturbation, and analyzing the received portions to extract characteristics of the touch, e.g., position.

In a preferred embodiment, as discussed in detail below, the electronic signal exciting the transmitting transducer is in the form of a short tone burst and delay times are determined for perturbations in the received signals. Alternately, the control system may determine which wave paths are absorbed by a touch via a frequency analysis of signal perturbations. See, e.g., U.S. Pat. No. 4,645,870.

A. Implementations

A typical control system for a touch position sensor includes a digital microcomputer system having program instructions stored in a non-volatile memory. This, for example, is an 8 or 16 bit microcontroller having internal CPU, RAM, counters and timers and possibly other functionality. Thus, an industry standard 80C51 derivative microcomputer or an ASIC device including an 80C51 core may be used. Likewise, a digital signal processor may be employed for analysis of the waveforms, or a low cost RISC microcontroller such as the Microchip PIC 16X and 17X RISC microcontrollers may also be employed.

The circuitry to implement the control according to the present invention may be provided as discrete devices, standard devices partitioned according to general availability, or as highly integrated circuits such as application specific integrated circuits (ASICs). A preferred control circuit is provided as a pair of ASICs which are generally involved in digital control of burst and acquisition cycles, and analog transmit and receive functions of the touchscreen systems, respectively. Traditionally, the excitation necessary for piezoelectric transducers in acoustic touchscreens has required relatively high voltages in the tens of volts range, and therefore discrete semiconductor devices were employed for this function. However, according to several embodiments of the present invention, a logic level transducer excitation is possible, permitting highly integrated mixed signal ASICs to implement the control. Therefore, the present invention also encompasses a highly integrated control circuit to implement the excitation and receive functions, and optionally the programmable microcontroller. Logic level voltages are intended to mean signals intended for communication between digital integrated circuits. Therefore, one advantageous embodiment may include excitation using voltages intended for intercomputer device communication, which may typically have higher voltages than intracomputer communications devices. Thus, such voltages may be derived from an RS-232 communications circuit, such as may be used to communicate touch position output.

While the various functions of the control are described herein separately, it should be understood that in many instances, a high level of functional integration is preferred, and therefore it is understood that common hardware elements may be used for the various functions. However, in some instances, especially where the touch sensing systems are employed with host computers, some of the high level functions may be implemented on the host computer as a program or so-called device driver.

B. Excitation

The excitation function is generally straightforward. A series of pulses or shaped pulses are emitted in a defined pattern, having substantial power spectrum density at a nominal operating frequency of frequencies. Because this pulse is of limited duration, it has a finite band width. For example, Elo TouchSystems manufactures a controller which can excite 5.53 MHz tone bursts with durations in the range of 6 to 42 oscillations. This electronic pulse train drives a transmit transducers which emits acoustic waves traveling away from the transmitting transducer. The wave is highly directional, and travels along an axis, which for example passes through a reflective array.

Where high flexibility of control over the excitation burst is desired, a direct digital synthesizer, such as the Analog Devices AD9850 may be employed.

During the excitation, it is generally desired that the receiving circuitry, which may be multiplexed to receive signals from a plurality of transducers, be electrically isolated, e.g., through electronic switches and/or diodes, so that parasitic electrical paths from the excitation circuitry do not overload the high gain receiver circuitry or influence charge storage elements including filters. When the excitation pulse is finished, the receiving circuitry is then connected to the receiving transducer, which may be the same as the transmitting transducer, by electronic switches. The isolation circuitry may cooperate with the multiplexing circuitry. The excitation circuitry may be adaptive to accommodate variations in the characteristics of the sensor subsystems. For example, Elo TouchSystem controller product E281-2310 adapts to touchscreens of varying signal attenuations by adjusting the burst pulse duration.

C. Bandwith Considerations

The excitation tone burst is of finite duration and will hence include a number of frequency components including the nominal transmit frequency. This frequency spread is typically broad compared to the relatively narrow frequency filtering characteristics of the reflective arrays.

The reflective arrays act as filters, and are generally the narrowest band filtering system of the transducer. For well equalized signal amplitudes and for high quality array design and manufacturing control of reflector spacings, the band width can approach the theoretical limit proportional to the inverse of the signal duration. Thus, much of the broadband energy from the excitation pulse is not coherently scattered or is misdirected by the reflective arrays and not received with the desired signal(s). In some cases, components of the broadband wave energy may lead to parasitic signals due to sidelobes, mode conversion, or other undesired effects which allow this wave energy to interfere with receipt of the desired waves. This provides a motivation to limit the bandwidth of the receiving circuitry. Thus, the receiver may include a selective filter.

From a frequency-domain perspective, a touch alters the frequency filtering characteristics of the sensor subsystem. A perturbation due to a touch which is narrow in the time domain will lead, via the fundamental mathematical relationships between bandwidth and time duration, to a broadening of the frequency filter characteristics of the sensor subsystem. The transmitted tone bursts are generally kept short enough so that the sensor subsystem is excited for the band of frequencies containing the touch information. The bandwidth of the bandpass filters in the receiving circuitry must have sufficient width to pass frequency components containing the touch information.

D. Receiver

The control receives the signals corresponding to the acoustic waves from the transducer and processes the signals for analysis. The control retains relevant data and may, and indeed preferably, filters extraneous data from the signal. Thus, where the relevant information is time and amplitude for a smoothed wave-form, other information may be ignored such as phase, frequency components outside the desired bandwidth, and signals for receive transducers for other sensor subsystems. Further, the type of data contained in the signal defines the simplest acceptable controller configuration. However, other types of information may also be included within the signal. Analysis of this information may be useful in analyzing the signal. The purpose of the receiver is to extract information from an acoustic wave signal which may represent its source, path, characteristics or type of perturbation(s), timing of perturbation(s), duration of perturbation(s), frequency characteristics of perturbation (s), pressure or amplitude of perturbation(s), and interferences or artifacts. Thus, the receiver takes a signal having a large amount of raw data and produces vectors representing significant features of the signal.

According to certain embodiments of the present invention, different types of waves may be time multiplexed, e.g., applied to the substrate sequentially, and therefore need not be present or analyzed simultaneously. Thus, where excitation of transmitted waves having differing frequencies or wavelengths may be independently selected, these may be time multiplexed onto the substrate. Therefore, a receiver may also be multiplexed to operate in a plurality of states. Alternately, various wave modes may be simultaneously applied to the substrate and resolved by selecting one of two or more receive transducers receiving signals from a common transmit transducer, with selective processing at the receiving transducer or in the receiving electronics.

The receive circuitry may be adaptive to variations in the physical characteristics of the sensor subsystems. For example, Elo TouchSystem controller product E281-2310 adapts to sensor subsystems of varying sizes by adjusting time windows used to gate received signals.

A multivariate analysis of different parameters may be employed to obtain further information from the received data. If more than one wave type is available, a controller may select an optimal wave or set of waves to analyze the sensed variable, i.e., under various conditions, a subset of the available information may be analyzed or employed in determining the output.

In many embodiments, it is not necessary to capture phase information contained in the received signals. However, in some instances, it may be advantageous, or even essential to do so. As discussed below, use of phase information allows generalization to cases in which a desired signal is coherently superposed on another desired signal or a parasitic signal. This novel feature of this invention is discussed in more detail below.

Phase and Separation of Superposed Signals

Figure 29:
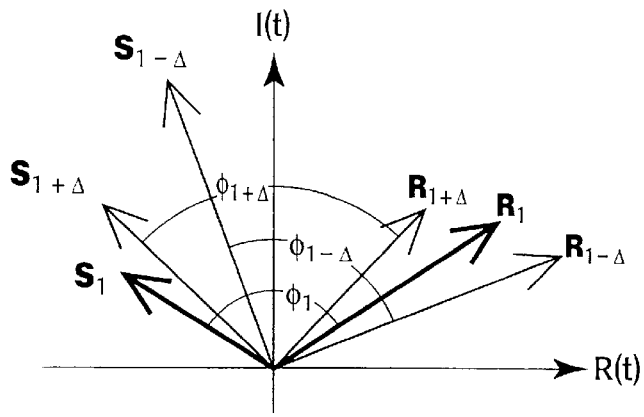
FIGS. 29(a)–(d) shows diagrams of the effect of a perturbation of one of a set of superposed waves with arbitrary phase relationship.
Figure 29:
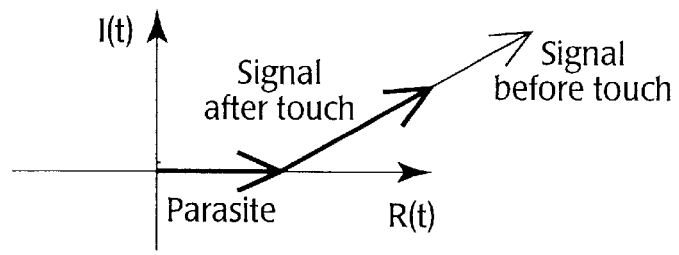
Figure 29:
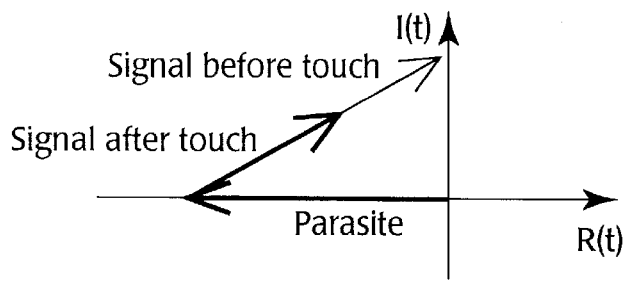
Figure 29:
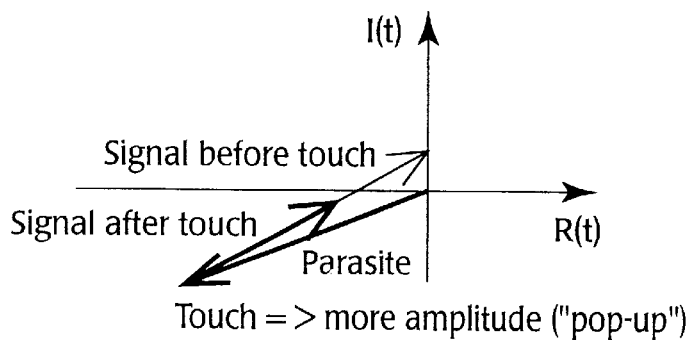

The phase information in received signals may be used to disentangle signals overlapping in time. With reference to FIG. 29($a$), the effect of superposed waves is shown. In a phase sensitive receiver system, a perturbation is detected at an $i^{th}$ time slice if the magnitude of signal vector $S_i$ is significantly larger or smaller than the magnitude of the reference vector $R_i$, or if the relative phase shift $$\Delta\phi = \phi_i - (\phi_{i+\Delta} = \phi_{i-\Delta})/2$$

is significantly non-zero, or some weighted combination of both such as the quadratic sum of $\Delta\phi$ and $|S_i - R_i|/|R_i|$ is greater than a threshold. In this formula, $\Delta$ is an integer comparable or larger than the number of time slices occupied by a typical touch perturbation. Note that the value of $\Delta\phi$, and hence the above conditions, are not affected by global drifts in absolute phase, nor by global changes in the slope of phase with time. Thus, a phase sensitive receiver system can reliably detect a perturbation of a desired signal even in the presence of an interfering signal. On the other hand, even if a significant change in the signal phase at the $i^{th}$ time slice occurs, this may be ignored by an AM detection system if $|S_i| \approx |R_i|$.

This threshold need not be a global value, and may therefore vary between different regions of the sensor. In theory, the threshold is set to reliably detect touches (low false negative rate) while preventing outputs indicative of touch which do not correspond to a real touch (low false positive rate). This may be optimized, for example, by determining a noise or signal instability level in a given region, and setting the threshold above an average noise or instability level for that region. The threshold may be redetermined periodically, continuously, and/or based on the occurrence of an event. While possibly more pertinent for a phase sensitive controller, a regionally determined threshold system may also be applied to traditional AM detector systems. The regions may correspond to the time dimension of a received signal, a physical coordinate of the sensor system, or other convenient space. The threshold determination may occur before, after or in conjunction with a logical analysis of the signal(s).

In a phase sensitive system, to ensure the perturbation is localized as expected for a touch, a further analysis may be conducted, requiring the following conditions on the signal amplitudes for the time slices a suitably small number of steps, $\Delta$, away from the $i^{th}$ time slice.

$$\phi_{i+\Delta} \approx \phi_{i-\Delta} |S_{i+\Delta}| \approx |R_{i+\Delta}| |S_{i-\Delta}| \approx |R_{i-\Delta}|$$

Further refinements and elaborations of these basic phase-algorithm principles can be supported by modern electronics. For example, a DSP filter design may be provided, having adaptive capabilities, i.e., it may learn new compensation strategies or details and apply these as necessary. It is noted that DSP functionality may be implemented as a dedicated semiconductor design, e.g., a DSP or digital filter, or may be provided as software controlled functionality of a general purpose processor. Suitable DSP devices include TMS320C2x, C3X or C5X devices from Texas Instruments, MC56000 series DSPs from Motorola, Z8 series microcontrollers including DSP capability from Zilog, etc. DSP functionality may also be obtained through application specific integrated circuits, programmable logic devices, and other types of semiconductor devices.

The acoustic signal propagation time for is very short as compared to human reaction times. Therefore, the signal need not be fully processed in real time. Typically it is sufficient to simply capture and digitize a wave-form information as it is received. The captured raw data can be processed later. It is possible to sequentially excite a plurality of sensor subsystems and process of signal data from one subsystem while another is excited. Thus, where a control system is provided which may analyze the received signals, the substrate is available for additional measurement cycles, allowing various wave mode excitation cycles to be analyzed independently. Under circumstances where a high speed of data acquisition is desired, or computational power is available for this purpose, multiple sensor subsystems may also be analyzed in parallel.

D(i). AM Detection

Figure 30:
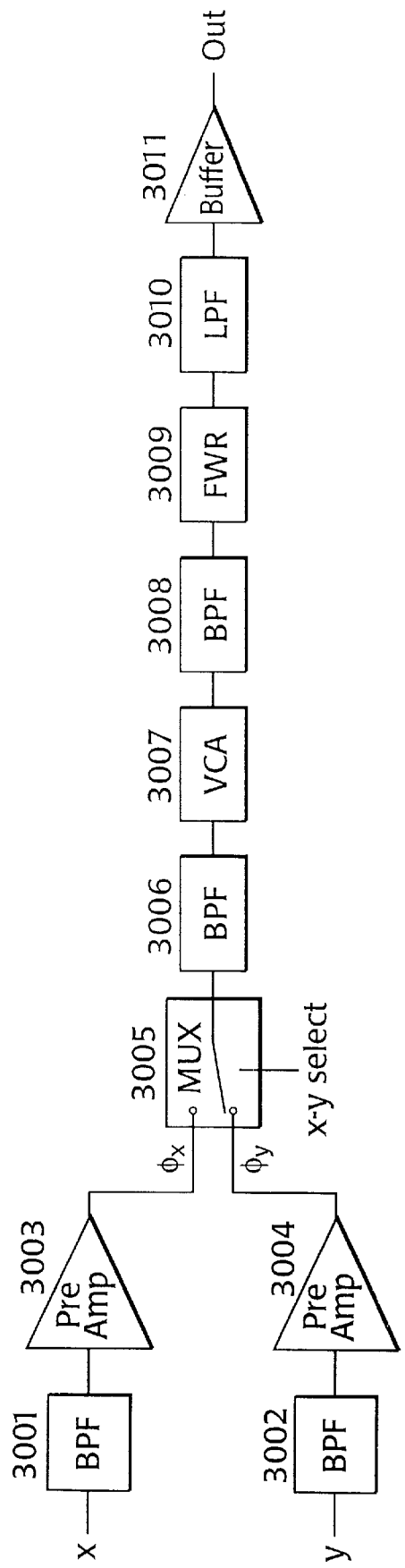
FIG. 30 shows a typical AM receiver circuit of prior art suitable for processing signals received by the embodiment according to FIG. 4.

For embodiments in which signal amplitude information is sufficient to reconstruct touch positions, an AM (amplitude modulation) detection circuitry may be used. This is likely to be the case if interference from parasitic acoustic paths is negligible and if there is never simultaneous receipt of more than one desired signal, from more than one sensor subsystem, at a receiving transducer. Prior art acoustic touch systems assume a requirement the received signals can be successfully processed via AM detection. For the present invention, this is not a requirement, but will nevertheless be true for many embodiments. A typical AM detection circuit is shown in FIG. 30.

AM detection methods have been widely used in the prior art. Thus, AM receivers are disclosed in U.S. Pat. Nos. 5,162,618, 5,072,427, 5,177,327, 5,243,148 and 5,329,070, expressly incorporated herein by reference and in U.S. Pat. Nos. 4,642,423, 4,700,176, 4,644,100 and Re. 33,151, expressly incorporated herein by reference, which may be employed, as applicable, with sensor embodiments. Controllers for acoustic touch panels are also disclosed in U.S. Pat. Nos. 5,380,959, and 5,334,805, expressly incorporated herein by reference.

The following AM detection scheme is typical of present commercial controller products. After a pre-amplifier stage, one for each receive transducer, the received signal is multiplexed to, e.g. an MC1350 RF automatic gain controlled amplifier. The signal is then detected, by for example a full or half wave rectifier circuit, a synchronous rectifier or an MC1330 detector. The detector is generally followed by a single pole low pass filter. Bandwidth limiting is applied at various stages of the signal chain. The resulting bandwidth is typically less than 0.5 MHz. The rectified signal, smoothed due to bandwidth limiting, is then buffered and digitized by an 8 or 12 bit analog-digital converter. One digitized sample per microsecond is typical. The digitized data may be analyzed in real time and/or buffered for later analysis.

Prior art approaches to AM detection of touchscreen signals are not the only AM detection techniques available. For example, the receiver circuit may include a tuned narrow band AM superheterodyne receiver. The received signal, with a known transmission frequency, is initially amplified in a low noise, high gain video-type amplifier. The amplified carrier and signal is then mixed with an AFC (automatic frequency control) tuning signal to achieve an IF of, for example, 3.54 MHz. The narrow band IF (intermediate frequency) signal is filtered to eliminate other frequencies but retain amplitude information having a bandwidth of less than 500 kHz, and then amplified. The amplified, filtered IF signal is then detected by a full wave rectification and filtering or synchronous detection. The AM detected signal is digitized.

For many embodiments of the present invention, the low-level recognition of signal perturbations may proceed via known AM detection schemes, while the higher-level logical analysis of identified signal perturbations differ from known systems, as described herein.

A variation of AM detection methods disclosed in U.S. Pat. Nos. 5,380,959, and 5,334,805, in which distinct X and Y receive transducers generate signals. One receiver responds to the desired signal plus interference from acoustic parasitic paths or electromagnetic backgrounds, and the other responds only to the interference. While perhaps atypical, there may be cases in which the interference is received with the same phase and amplitude for both the X and Y receive transducers. In such cases the interference-only signal may be coherently subtracted from the other signal, and the resulting interference-canceled signal processed via standard AM detection methods. This combining of signals from two receive transducers is very different from the phase-sensitive detection methods described below, in which a controller can process input from a single receive transducer even if multiple signals are superposed; the apparent purpose of the dual receiving transducer circuit of U.S. Pat. Nos. 5,380,959 and 5,334,805 is to avoid the need to for processing of signals overlapping in time that would otherwise interfere with AM detection schemes.

As shown in FIG. 30, a pair of transducers, X and Y, provide inputs to band pass filters 3001 and 3002. These band pass filters may also be notch filters, and indeed the preamplifiers 3003, 3004 are band limiting. The outputs of the preamplifiers 3003, 3004 are multiplexed through multiplexer 3005, depending on which transducer is actively receiving signal. A further bandpass filter 3006 may be provided. A voltage controlled amplifier 3007 is provided to allow a controller to adjust the gain of the input channel. A band pass filter 3008 eliminates DC and low frequency components, as well as high frequency noise, and the amplitude of the signal is detected in a full wave rectifier 3009 or RMS circuit. The detected output is then again filtered with a low pass filter 3010, amplified with amplifier 3011, and output. The output may be fed, for example, to a sample and hold amplifier and analog to digital converter (not shown).

D(ii). Phase Sensitive Detection

According to one set of embodiments according to the present invention, two (or more) sets of wave paths are superposed and portions are received simultaneously at the receiver. This scenario is demonstrated in FIG. 9D(1). A superposed set of wave paths may correspond to a desired sensor subsystem, or be due to parasitic acoustic paths. No presumption is made that there is any particular absolute phase relationship between the various sets of superposed wave paths, furthermore the phase relationships between superposed signals may drift with time.

Four representative relative phase states of two waves are: in phase, out of phase, leading and lagging. For example, waves having equal amplitude pass through a portion of a substrate subject to a touch induced perturbation, where, for illustrative purposes, we assume a finger touch completely absorbs one of the waves. If the waves are in phase, the touch will result in a factor of two reduction in total amplitude. If the waves have leading and lagging phase relationship of 90°, the finger touch results in only a 29% reduction in the magnitude of the net signal amplitude. If the waves are out of phase (180° apart), the net amplitude will be zero before the touch, and a finite signal will appear due to the finger touch. Such effects confuse typical touch recognition algorithms based on AM detection schemes, and hence is why it has been heretofore been considered unacceptable for sensor design to allow signal amplitudes to combine in such a fashion.

As shown in FIG. 9D(1), two signals, each bearing touch information, are present simultaneously. When summed, there are a number of possibilities, as discussed above. FIG. 9D(2) shows a phase coherent superposition, wherein the amplitudes of the two waves are additive. In a phase coherent detection scheme, as shown in FIG. 9D(3), the second waveform 21 is subtracted from the first waveform 20, with the possibility of negative amplitudes 22, and an increase in signal amplitude corresponding to a wave perturbation 23. FIG. 9D(4) shows a destructive interference of the two waves, with RMS detection of the resulting waveform, so that negative amplitudes are not possible. More generally, the phase relationship between the two signals in FIG. 9D(1) may drift while they are being received, thus leading to signals that are even more problematic for AM detection schemes.

Embodiments in which the controller captures phase as well as amplitude information can utilize such superposed signals. For example, as noted in FIG. 29(a), signal perturbations due to touches may be recognized by a displacement of the net amplitude in two-dimensional I-Q space. This is true even if the magnitude of the net signal does not change. Even in the presence of superposed signals, acoustic attenuation of the desired signal will always change the net signal vector in I-Q space. As noted in the discussion above regarding FIG. 29(a), it is possible to implement algorithms that filter our various drifts in the global phases of the superposed sets of waves.

In cases where the drifts in the global phases of superposed sets of waves is slow compared to the time it takes the controller to update the reference I-Q amplitude vectors $R_i$, the presence of a touch may be simply recognized as a significantly non-zero value for $|S_i - R_i|$.

There are many ways to implement a phase-sensitive controller. One basic approach is to compare the phase of received signals with a free running reference clock signal, as shown in FIG. 31(c). Other approaches may make use of phase-locked loops, as shown in FIGS. 31(a), 31(b), and 31(d).

In the context of FIG. 31(c), homodyne mixing provides a particularly simple conceptual approach. For example, for a sensor operating at 5 MHz, a continuous 5 MHz reference clock signal 3101 is generated. The tone burst to the transmit transducer has a fixed phase relationship to this reference clock signal. An "In-phase" or "I" copy of a reference clock signal 3102, derived by time-shifting the clock with phase shifter 3103, as necessary, is mixed in mixer 3104 with a filtered signal 3106 from a receive transducer 3105, and the resulting mixed signal passed through a low-pass filter 3107 and then digitized with analog to digital converter 3108; thus an I wave-form 3109 is captured. A "Quadrature" or "Q" copy of the reference clock signal is generated with a 90° phase shift with respect to the I reference clock signal, generated by quadrature generator 3110; this is similarly used to capture the Q wave-form 3114 through a mixer 3111, low pass filter 3112 and analog to digital converter 3113. In this fashion, $S_i = (I_i, Q_i)$ is directly generated for use in the implementation of algorithms based on FIG. 29(a). The digital processing may be accomplished with general purpose microprocessor, or more specialized digital signal processors, not shown in FIG. 31(c).

An alternate phase locked loop embodiment is shown in FIG. 31(a). In this figure, the transmit burst signal generator also controls the receive clock generator. The transmit burst generator 3147 produces an output which is influenced by a model 3148, which is, for example, a set of delays and filters. This is then fed to the phase locked loop circuit 3149. The remainder of FIG. 31(a) is similar to the circuit of FIG. 31(b), discussed below.

In certain instances, it may be preferable to capture the received signal from the receive transducer 3122 with sufficient high time resolution, e.g., four times the carrier frequency $f_0$, to capture the RF waveform. The received signal is preferably filtered with a narrow band filter 3127. In this case, the sampling clock 3123 provides a phase reference, to operate a track and hold amplifier 3124 and analog to digital converter 3125, as shown in FIGS. 31(e) and 31(f). In particular, a system as shown in FIG. 31(e) provides the full flexibility provided by programmable digital signal processing 3126. For example, in cases where two or more operating frequencies are used, a particular received signal may be selected, in part, by loading appropriate digital-signal-processing constants needed to produce a filter at the desired frequency selected the in software. FIG. 31(f) provides an application specific digital signal processing circuit 3120, which performs phase extraction, digital filtering, and decimation in time. Thus, the output data rate is reduced, and a typical microcomputer 3121, without particular digital signal processing prowess, may be used to perform further analysis.

In such a system that captures a RF wave-form, the received signal is digitized directly at a rate in excess of the Nyquist rate, after preamplification and standard signal conditioning (which may include narrow band filtering), and is then processed using a digital signal processor (DSP) 3126. In this case, the DSP 3126 may operate in real time, or buffer the received digitized waveform in a RAM and process it with some latency. For example, with a 5.53 MHz excitation, and a 500 $\mu$S echo analysis, a RAM buffer on the order of about 16 kWords may be required, with samples acquired about every 40 nanoseconds (25 Megasamples per second). Of course, this storage requirement may be reduced if the entire signal need not be fully analyzed at one time; for example, the signal may be divided timewise, and blocks of consecutive samples analyzed consecutively. This will focus the analysis on sections of the sensor for each excitation burst. The actual sample timing may vary adaptively to track the received waveform or be at a constant rate. The digitized signal, after detection of the relevant parameters, may then be digitally filtered (FIR, IIR, auto regression, or more complex filters such as auto regression and moving average process filtering), waveform analyzed, adaptively compensated, compared to a reference, and subject to other techniques to determine waveform perturbing characteristics of the touch, such as location, z-axis (pressure), and type of object (wave mode absorption characteristics). Thus, a selective, sensitive system is provided.

Figure 31:
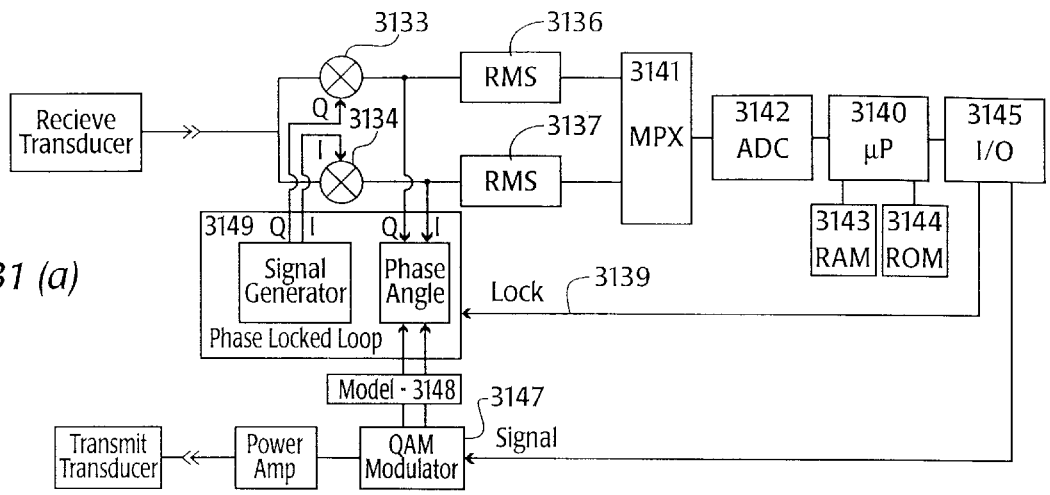
FIGS. 31(a)–(f) show, respectively, alternative circuit diagrams according to the present invention for implementing a phase sensitive receiver, having (a) a carrier synthesis circuit based on the transmitted wave burst; (b) a tracking phase locked loop carrier recovery circuit; (c) a carrier circuit which employs the transmit burst clock; (d) a clock recovery circuit based on the received signal; (e) a digital signal processor embodiment which oversamples the signal and employs software to analyze the digitized signal; and (f) an application specific integrated circuit embodiment which performs phase detection, filtering and decimation in time prior to transferring a digital signal representation to a microcomputer.
Figure 31:
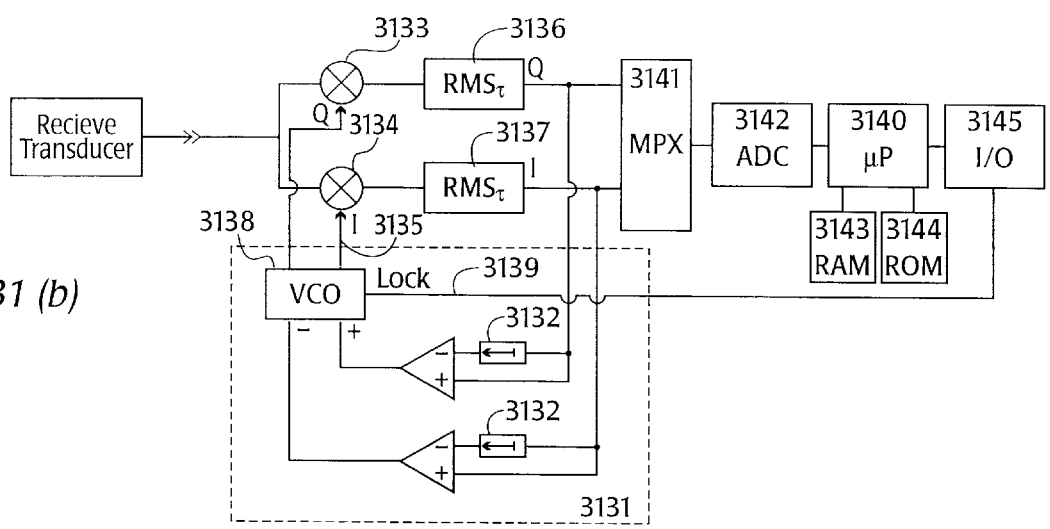
Figure 31:
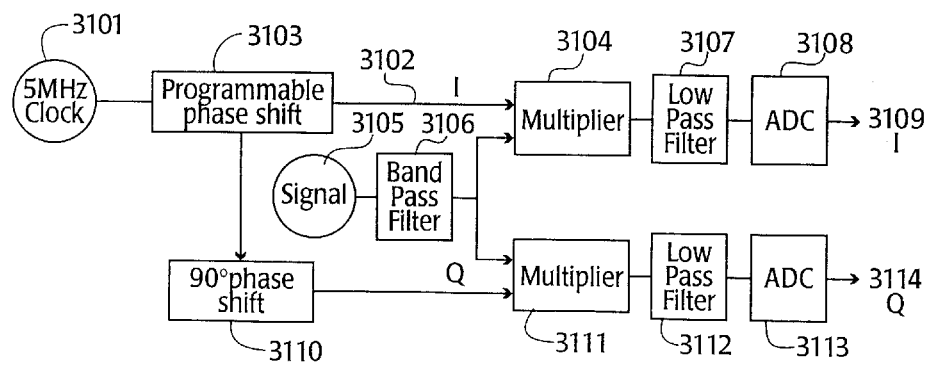
Figure 31:
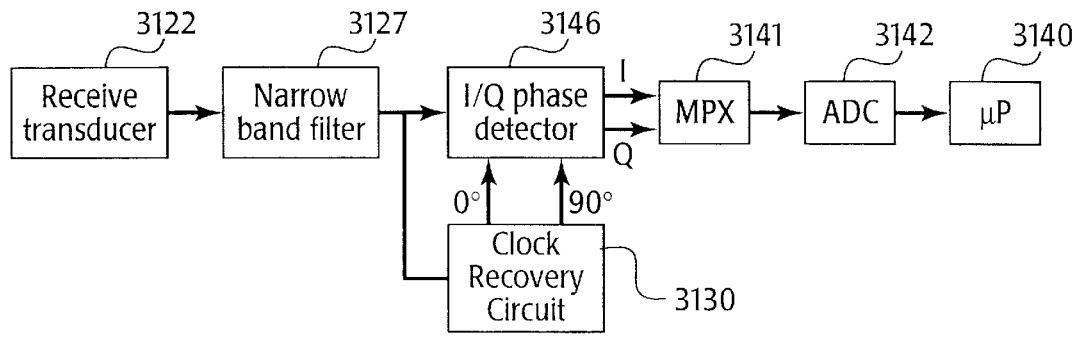
Figure 31:
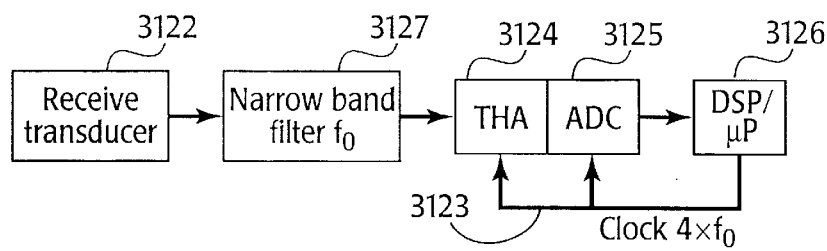
Figure 31:
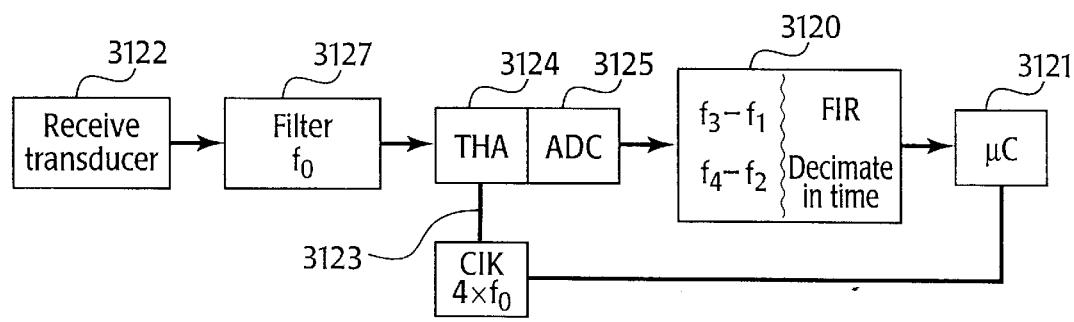

The reference clock signal may be generated from the received signal with a phase-locked loop 3130, as shown in FIG. 31(d). Typically, a phase locked loop 3130 may be implemented in hardware, so that an oscillating signal is generated which corresponds to a "carrier" wave of another signal. As shown in more detail in FIG. 31(b), the phase locked loop 3131 tracks the signal, but is limited to vary more slowly by time delays 3132. Thus, drift in phase due to manufacturing tolerances and environmental effects may be filtered, and yet any rapid changes in phase due to a touch may be determined by comparing the generated carrier with the actual signal, or by analyzing the error signal. Also shown in FIG. 31(b) is a pair of mixers 3133, 3134, for mixing the in phase and quadrature synthesized clock outputs 3135 with the received signal, and a pair of RMS detectors 3136, 3137 to detect each phase signal. As shown, the circuit seeks to maximize the difference between the RMS value of the I and Q signals, to shift the phase of the VCO 3138 when a relative change occurs in the respective amplitudes. The VCO 3138 has a lock input 3139 from the controller 3140 to prevent compensatory changes, for example where a touch is detected. The RMS values of the I and Q signals are multiplexed in multiplexer 3141, and digitized in analog to digital converter 3142, and input to the controller 3140. The controller 3140 has associated RAM 3143, for storing transient data, and ROM 3144, for storing programs and tables, as well as input and output drivers 3145. As shown in FIG. 31(*d*), the detection circuit 3146 may generate the I and Q signals, which are multiplexed and digitized, without RMS processing.

If the control feedback of a phased-locked loop is sufficient fast, then, for example, the voltage controlling a variable-frequency oscillator within the phased-locked loop may be integrated and digitized to directly provide a measure of signal phase. With a DC-reject filter, variations in the global phase offsets can be eliminated. Combined with AM detection, this provides digitized I-Q signal amplitudes in polar coordinates. Thus phase-sensitive controllers may digitize signals in I-Q space in either Cartesian or polar coordinates.

The electronics industry provides, and can be expected to continue to introduce, components that enable fabrication of phase-sensitive controllers. For example, impressive digital signal processing power can be provided by an Intel Pentium processor or a Texas Instruments TMS 320C80 DSP coprocessor. Rapid digitization of signals is possible at 40 MSPS from one or more Texas Instruments TLC5540INSLE 8-bit ADCs, or at 10-bit resolution at 20 MSPS from one or more Analog Devices ADS820 10 bit ADCs. Suitable PLLs are, for example, the Signetics NE/SE564, NE568, (or equivalents) and Texas Instruments TLC2932 (or equivalent). Suitable mixers include the NE/SA602 and NE612 (or equivalent), which each include a double-balanced mixer circuit. See, Signetics NE/SA602 data sheet and Signetics AN 1981 and AD1982. The cost-performance trade-offs for particular applications will determine the most suitable choice of components for phase-sensitive controllers.

Use of intermediate frequencies ("IF") with heterodyne mixing may be considered as a means to shift received signals to a frequency which is a standard for a mass-market signal processing application. For example 455 kHz and 10.7 MHz are standard IF frequencies for radio and video communication. Further, where a plurality of frequencies are to be received, a heterodyne receiver allows a common filter and receiver to be employed for receiving the various signals after tuning. Note that it is possible for the intermediate frequency to be higher than the operating frequency for the touchscreens. The use of IF frequencies further increases options for electronic components to be used as building blocks of a phase-sensitive controller.

E. Intermediate Level Processing

The purpose of intermediate level processing is to efficiently reconstruct delay-times, and perhaps quantitative absorption information, for perturbations of the signals due to touches, and to do so with sufficient immunity to signal artifacts due to temperature, humidity, electronic emissions, radio frequency interference, and the like. Intermediate-level processing need not be fool-proof, as higher order processing within the algorithm may also reject artifacts. If fact, intermediate level processing can be optimized for efficiency at the expense of immunity if the higher level algorithms require consistent and redundant information from three or more sensor subsystems.

Typically, the relevant touch information is contained within a relatively narrow bandwidth about the nominal operating frequency or frequencies. Many artifacts can be eliminated with appropriate frequency filtering, either in hardware or via digital signal processing.

Touch perturbations occur on a fast time scale relative to many sources of signal drift. Therefore, as is typical of the prior art, an adaptive baseline is used to distinguish genuine touch information from systematic drifts in signal amplitudes. Note, however, in contrast to prior art, the adaptive baseline need not be limited to AM amplitude information; the adaptive baseline may also incorporate phase information.

As discussed above, the baseline and/or threshold processing may be regionally varying, and may be optimized for highest performance.

In the context of a phase-sensitive controller, use of an adaptive baseline is conceptually similar to known AM systems. Thus, for example, an adaptive baseline correction is implemented by memorizing a baseline pattern and analyzing the received signal with respect to the memorized baseline to determine the presence of a perturbation. The reference condition compensates for long term and environmental conditions, and facilitates meaningful analysis of the received signals. The reference condition is preferably derived periodically in the absence of a touch or other indications of transient conditions. Furthermore, the baseline may also be updated continuously based on portions of the signal presumed to be unaffected by transient conditions, even during periods when a touch occurs. The reference signal therefore compensates for many physical characteristics of the screen, contamination, as well as long term drift due to, e.g., temperature. Known systems implement such adaptive baselines.

Embodiments of the present invention using phase sensitive controllers necessarily involve more than simple subtraction of a baseline. The baseline information, e.g. a memorized reference wave-form, contains phase as well as amplitude information. Optionally, stability or noise information may be stored. Simple subtraction of reference amplitudes is replaced by mathematical processing involving calculations of displacements in I-Q space.

Whether or not the controller is phase sensitive, the received signals are processed to provide time-delays and magnitudes of candidate touch perturbations for the sensor subsystems. This information is then used in the next level of data processing.

In cases where there is an ambiguity regarding which sensor subsystem corresponds to a candidate touch perturbation, all interpretations may be provided to the higher level algorithms for further processing. Such ambiguities occur in sensor systems as shown in FIGS. 19, 22(*c*), and 28. A case in point is where a phase-sensitive controller simultaneously receives signals from two sensor subsystems through a common receive transducer, and the controller may not have a direct means to determine which of the coherently summed signals has been perturbed.

F. Analysis of Perturbation

Candidate touch perturbations are analyzed to reconstruct positions of touches. Optionally, the touch system may output further information regarding touches such as the touch "pressure", i.e. magnitude of acoustic absorption, and "water-rejection" touch characteristics such as the ratio of shear-wave to Rayleigh-wave absorption. Furthermore, the present invention supports algorithms with increased tolerance for shadowing due to contaminants, with unambiguous multiple-touch capability, and with enhanced reliability due to consistency checks based on redundant measurements.

Generalize to Non-orthogonal Sensor Subsystems

Although the scope of this invention includes schemes which output but a single coordinate, the primary objective of most touch systems is to output two-dimensional coordinates of touches on a surface. If a touch is sensed by two or more sensor subsystems, then there is typically a unique touch position on the touch surface that can account for the resulting delay times for the perturbations observed in the corresponding signals. Note that coordinates measured by the subsystems according to the present invention need not correspond to an output coordinate axis and need not be orthogonal to each other, the arrays, nor the edges of the glass. Thus, where the sensing waves do not cross the touch sensitive region of the substrate orthogonal to a reference coordinate system, the controller performs a coordinate transformation on one or more received signals to the desired coordinate system. The coordinate transformation to the output system may occur before or after the two-dimensional position of the touch is reconstructed.

Where more information is received than is required for reconstruction of the touch position, e.g., three received signals for two coordinate axes, a consistency checking and optimization analysis may be executed to make optimal use of the available information. A weighted average may be constructed based on coordinates determined by pairs of sensor subsystems sensing the touch. Alternately, the algorithm may use the coordinate determined by the sensor-subsystem pair most likely to provide reliable and accurate coordinate measurements.

Once a touch is registered, the coordinates of the touch are determined by calculating a center of a touch, possibly with correction for non-linearity or scaling, and output as the touch position.

There is no requirement here that there is a linear, or approximately linear relationship between delay times of touch perturbations and any coordinate of interest.

Dual Mode Sensing of Touch Characteristic

As with prior art sensors, a "pressure" or "Z axis" value for the touch may be included with the touch position as part of the output from the touch system. Additional information may be provided by the present invention in cases where a touch is sensed by more than one acoustic mode. See FIG. 26. For example, if a touch is sensed by both a horizontally polarized shear wave and an acoustic mode subject to leaky-wave-radiation damping into water contaminants, such as a Rayleigh wave, then the ratio of shear-wave to non-shear-wave acoustic absorption provides an touch characteristic that may be used for water rejection. A threshold may be defined so that "touches" due to water drops are rejected while finger touches are accepted. This in an important feature of sensors utilizing more than one acoustic mode in the touch region. Thus, according to FIG. 26, a touch position is reconstructed 2601. The magnitude of the signal perturbation for each wave is determined 2602. The consistency of the perturbation is tested with respect to known conditions 2603, to allow classification of the characteristic of the touch.

Anti-shadowing

For sensor designs in which touches are designed to be sensed with three or more sensor subsystems, anti-shadowing algorithms are possible. See, FIGS. 25(a) and 25(b). Shadowing occurs when a contaminant or other acoustic obstruction so reduces signal amplitudes so as to produce an unresponsive dead region. For a sensor subsystem, the dead region includes not only the location of the contaminant, but also the entire length of the acoustic paths shadowed by the contaminant. For example, in rect- angular sensors according to the prior art with X and Y sensor subsystems, a strongly absorbing contaminant one inch in diameter will result in a cross-shaped dead region, with one inch horizontal and vertical stripes intersecting at the contaminant, within which two-dimensional touch coordinates cannot be reconstructed. Note that the loss of either coordinate measurement results in an inability to reconstruct a touch position. In contrast, when a touch is within the sensitive zone of three or more sensor subsystems, a two-dimensional position can still be determined if one coordinate is lost in the shadow of a contaminant.

FIG. 25(a) shows a simplified flow chart for an anti-shadowing algorithm. The algorithm flow chart is abbreviated and representative, setting forth the basic steps. Application of the basic concepts here will be considered below in the context of specific embodiments of the invention. All significant perturbations in all sensor subsystem signals are identified 2501. The delay times are determined for each signal perturbation 2502. Perturbations in overlapping regions of sensor subsystems are matched 2503. Finally, from the matched sets, touch positions are calculated 2504. It is noted that the shadowing influence will be considered a strongly absorptive, slowly changing perturbation, in contrast to a touch, which is generally of short duration and may be less than completely absorptive. FIG. 25(b) shows an antishadowing algorithm in more detail for an X, Y, 30° diagonal path sensor system as shown in FIG. 13. The X signal is searched for a touch 2511. If found, 2512, the Y signal is searched, or if not found, the Y signal is also searched 2521. If X and Y are found, the touch position is reported 2513. The diagonal paths of the two triangular sensor subsystems are then searched for touch, 2514, 1517, and if found, the missing Y is calculated 2515, 2518, and reported 2516, 2519. If no diagonal touch perturbation is found, the X touch information is likely artifact and ignored 2520. If no X is found, the Y is searched for a touch 2521. If both X and Y fail to show a touch, it is presumed that no touch is present 2522. On the other hand, if a Y touch is found, the diagonal paths are then searched for touch 2523, 2526, and if found, the missing X calculated 2524, 2527, and reported 2525, 2528. If no diagonal touch perturbation is found, the Y touch information is likely artifact and ignored 2529.

For a shadowing contaminant, particularly one which is observed by three or more sensor subsystems, the controller has information from which one can determine the presence and location of the contaminant. Such information can also be used to provide user feedback to remedy the problem. For example, diagnostic software may include a maintenance option in which "Clean me here!" messages appear as needed with arrows and targets.

Multiple Touch Capability

A particular aspect of certain embodiments of the present invention is the ability to detect and analyze multiple simultaneous touches, based on the plurality of waves. See FIGS. 24(a) and 24(b).

Prior art sensors are subject to the following ambiguity when simultaneously subjected to two or more touches. Consider an acoustic touchscreen is subjected to two touches, one may be represented with coordinates $(X_1, Y_1)$ and the other with coordinates $(X_2, Y_2)$. The received signal providing X coordinate information contains two signal perturbations allowing the determination of the values of $X_1$ and $X_2$. See FIG. 9B. Likewise the Y signal allows reconstruction of the values of $Y_1$ and $Y_2$. The signals make it clear that there are two touches. However, there is an ambiguity whether the two touches are at coordinates $(X_1,$ $Y_1$) and ($X_2, Y_2$), or alternatively at coordinates ($X_1, Y_2$) and ($X_2, Y_1$). The ambiguity concerns which X coordinate to pair up with which Y coordinate. With increased complexity, similar ambiguities are present for three or more simultaneous touches.

To some extent, this ambiguity can be resolved by timing and quantitative attenuation information. If the ($X_1, Y_1$) touch makes contact with the sensor before the ($X_2, Y_2$) touch, the controller may decide that a ($X_1, Y_1$)/($X_2, Y_2$) double touch is more likely to follow a ($X_1, Y_1$) single touch than a ($X_1, Y_2$)/($X_2, Y_1$) double touch. Similarly, touch amplitude information may be used. Assume, for example, that the second touch is a lighter touch, i.e. with less attenuation, than the touch at ($X_1, Y_1$), being represented using lower case letters for its touch coordinates ($x_2, y_2$). By matching amplitudes, the controller may decide that a ($X_1, Y_1$)/($x_2, x_2$) double touch is more likely than a ($X_1, y_2$)/($x_2, Y_1$) double touch. In many cases, these methods will resolve the ambiguity. However, by themselves, these methods are not always reliable. Two touches may have approximately the same attenuation or make contact simultaneously. Most importantly, if $X_1$ and $X_2$, or $Y_1$ and $Y_2$, are sufficiently close in value, the corresponding perturbations in the signal will overlap and make it problematic to reliably and accurately disentangle the two coordinate values.

Figure 24:
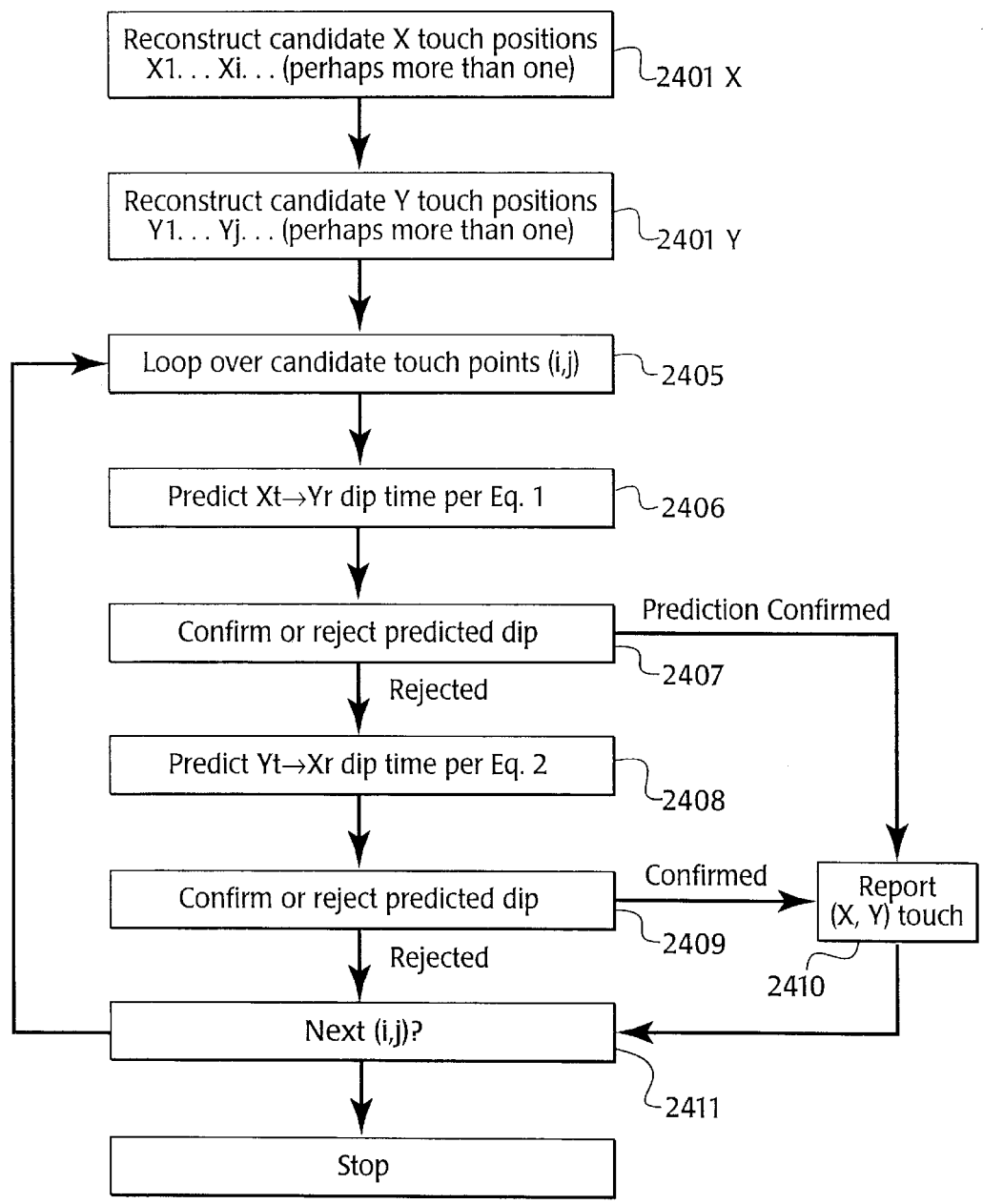
FIGS. 24(a) and (b) show respectively a generalized representation of and a detailed specific example of flow diagrams for a redundancy check algorithm according to the present invention.

Here, it is advantageous to cover desired touch regions with three or more sensor subsystems, as shown in FIGS. 13 and 14. FIG. 24(*b*) presents an algorithm that may be used with the sensor in FIG. 13. Using a pair of sensor subsystems, candidate touch positions, subject to ambiguities, may be determined 2401X, 2401Y. For each candidate touch position, delay times can be predicted for the remaining sensor subsystem(s). For the valid touch positions, the predicted delay times will correspond to measured touch perturbations along all axes. More generally, a valid touch is recognized by a self-consistent triple(s) of delay times from three or more sensor subsystems. From these self-consistent triples, the touch positions may be calculated.

The comparison process includes testing candidate touch positions with the various possibilities. Thus, the candidates are identified 2405, the predicted perturbations calculated for each candidate touch position for the diagonal axes 2406, 2408, and the predicted perturbation compared with the actual perturbation for each diagonal axis 2407, 2409. The consistent candidates are determined for the touch positions and output 2410. The candidates are evaluated successively 2411.

Also note that the touch perturbation interference problem noted here is a variant of the "contaminant" shadowing problem, and hence may be solved with the aid of anti-shadowing algorithms. Namely, the algorithm may base touch position determination on sensor subsystem data for which touch perturbations are well separated.

A multiple-touch algorithm may be subject to the burden of sorting through a relatively large number of candidate touch positions due to the nature of combinatorics. However, unless the number of simultaneous touches becomes excessive, this is not a significant problem for algorithm response times. A substantial amount of data reduction occurs in the low level control, i.e., the data stream from the analog to digital converter is reduced to a relatively small set of parameters, e.g., a timing, width and amplitude of each detected perturbation. Because the amount of data to be processed by the high level control, i.e., logical analysis, is relatively small, a comprehensive analysis is possible. Therefore, if three perturbations are detected in each of three sets of waves, a logical analysis of each of the 27 possible coordinate locations of three touches is possible. Therefore, the perturbation characteristic, attenuation and timing correlation of each perturbation may be compared to predict a most likely set of points. If one of the perturbations, for example, comprises artifact or interference, the corresponding coordinate may be excluded or ignored.

It is also noted that, in order to define a touch position from among a number of possibilities, the resolution of ambiguity need not be performed strictly by acoustic means. For example, a coarse infrared touch detection grid (rotated with respect to coordinates measured by acoustic sensor subsystems) may be used to detect the gross position of one or more touches, with the coarse position used to consistently determine the exact location of multiple perturbations in the received acoustic wave signals.

Redundant Measurement Consistency Checks

Even when there are not discrete ambiguities due to multiple touches, algorithms based on self consistency of redundant coordinate measurements provides a means to eliminate artifacts. See FIG. 24(*a*). The use of self-consistent triples of delay times from three or more sensor subsystems goes beyond the redundancy checks used in the prior art.

According to known schemes, waves travel along axes which correspond to a pair of perpendicular physical edges or major axes of a substrate, and one set of waves senses touch along each axis. Thus, a single touch will produce a pair of corresponding perturbations in each of the sets of waves, which directly correspond to the coordinate system of the substrate. Thus, when a touch is detected, the analysis determines the position along each of the axes and outputs a coordinate pair. This known system thus redundantly detects the presence of a touch, that is the presence of a touch is validated if it is observed in both the X and Y channels. Thus, uncorrelated noise which effects one reading may be ignored if it does not effect a subsequent reading on the other axis. Further, a minimum perturbation duration may be required, so that at least one confirming reading may be required in order for a touch to register. However, known systems do not include a higher level of redundancy.

The present invention, encompasses the analysis of redundancy, such that a position along one coordinate axis is determined using information which provides at least two wavepaths through a touch position to determine a position along a single axis, or two waves having differential absorptivity characteristics for a touch passing through the touch position. According to another aspect of the invention, a coordinate transform is performed to translate signals produced by transducers from the various wavepaths to a desired coordinate system, wherein the transform requires at least two wavepaths to define a single output coordinate.

The perturbation analysis may thus also include validity checking and position estimation based on the multiple signals, wherein an inconsistency may be present. Thus, the signals are logically analyzed according to rules, which may be predetermined or adaptive, to define an output which should be produced for a given set of inputs.

FIG. 24 shows a multiple-touch/redundancy-check algorithm flow chart for a touch sensor having two orthogonal sets of acoustic paths and a non-orthogonal set of acoustic paths. The algorithm flow chart is abbreviated and representative, setting forth the basic steps. Significant perturbations in all sensor subsystem signals are identified 2401. The delay times for all perturbations is determined 2402. Self consistency of triples is then evaluated, with errors evaluated for significance 2403. The touch position(s) is then calculated 2404 and output. Application of the basic concepts here will be considered below in the context of specific embodiments of the invention. Such an algorithm is able to resolve multiple-touch ambiguities, and provides for additional noise rejection, allowing operation with a lighter touch threshold and/or operation in a noisier environment.

Where supposedly redundant information is inconsistent, the signals may be analyzed to determine if one of the signals is likely inaccurate or in error, and a most likely coordinate output. Further, where an inaccuracy or error follows a pattern, for example indicative of poorly optimized calibration constants used to correlate delay times with touch positions, an error signal may be provided which ultimately prompts a user to remedy the problem, e.g. re-run calibration software.

Wave Modes

As noted earlier, this document defines "surface acoustic waves" (hereinafter "SAW") as acoustic waves for which a touch on the surface leads to a measurable attenuation of acoustic energy. Surface acoustic waves are used for the segments of acoustic paths traversing the desired touch sensitive zone of sensor subsystems. Other segments of the acoustic paths, e.g. along the arrays to and from the transducers, can use any acoustic modes that couple to transducers and also couple to the desired surface acoustic wave via scattering by the reflective array. Several examples of surface acoustic waves are known.

There are many advantages to Rayleigh waves including high touch sensitivity and high power density at the touch surface even for arbitrarily thick substrates. Rayleigh waves maintain a useful power density at the touch surface due to boundary conditions that allows the substrate material to deform into free space, effectively reducing material stiffness for the wave and hence its velocity, thus resulting in a reduced-velocity wave guiding effect near the surface. For example, this enables Rayleigh waves to be used on a CRT faceplate which represents a very thick substrate relative to the acoustic wavelengths.

Like Rayleigh waves, Love waves are "surface-bound waves". Particle motion is vertical and longitudinal for Rayleigh waves; both shear and pressure/tension stresses are associated with Rayleigh waves. In contrast, for Love waves, particle motion is horizontal, i.e. parallel to the substrate surface. Only shear stress is associated with a Love wave. Love waves have the advantage that they do not couple to water or other liquid or quasi-liquid contaminants, e.g. a silicone rubber seal, via pressure-wave radiation damping. Of course, elimination of radiation damping will also reduce sensitivity for a finger touch which must now rely on viscous damping alone. However, for market niches for which liquid contamination is a particular problem, a Love wave may be preferable to a Rayleigh wave. Depending on substrate design, the concentration of acoustic power at the surface, and hence the touch sensitivity, can be varied. A key advantage of Love waves, or more generally asymmetric horizontally polarized shear waves, is that they may have no appreciable energy on the lower surface of the substrate.

Another class of surface acoustic waves of possible interest in connection with acoustic touchscreens are plate waves. Unlike surface-bound waves, plate waves require the confining effects of both the top and bottom surfaces of the substrate to maintain a useful power density at the touch surface. Examples of plate waves include symmetric and anti-symmetric Lamb waves, zeroth order horizontally polarized shear (ZOHPS) waves, and higher order horizontally polarized shear (HOHPS) waves.

Use of plate waves constrains the thickness of the substrate. For plate waves, the touch sensitivity decreases with increasing plate thickness. For low-order plate waves such as ZOHPS waves, phase velocity differences with respect to neighboring acoustic modes (i.e. n=1 HOHPS for ZOHPS) shrink with increasing substrate thickness making clean separation of modes more difficult. ZOHPS sensors operating at 5 MHz are thus typically limited to substrate thickness of about one millimeter for glass. Higher order modes can be used with somewhat thicker glass substrates of 2 to 3 millimeters, in part because of a larger phase-velocity differences from neighboring modes, and in part because nodal planes inside the substrate help concentrate acoustic power at the touch surface. Note that plate waves are equally sensitive on the top and bottom of the substrate. For applications in which limitations on substrate thickness are not a problem, and for which bottom-side touch sensitivity is not a problem, plate waves are viable options.

The choice of acoustic mode effects touch sensitivity, the relative touch sensitivity between water drops and finger touches, as well as a number of sensor design details. However, the basic principles of acoustic touchscreen operation are largely independent of the choice of acoustic mode.

As noted above, there can be particular advantages to simultaneous detection of touches with more than one acoustic mode. For example, a water rejection can be based on a comparison of touch perturbations from a horizontally polarized shear mode (e.g. Love, ZOHPS, HOHPS) and from a mode that is damped by pressure-wave radiation in liquids (e.g. Rayleigh, Lamb).

Mode Distingushing Physical Filters

Sensor subsystems are designed for a particular set of acoustic paths and acoustic modes. Ideally, the receiver signal is entirely due to the desired paths and modes. With the aid of a phase sensitive controller, some interference from parasitic acoustic signals may be acceptable, nevertheless it is still desirable to avoid excessive parasitic interference. Various physical filters may be employed to assure that sufficient suppression of parasitic modes is achieved.

The transducers and arrays provide the most basic filters to suppress undesired acoustic modes. For example, a Rayleigh-wave transducer composed of a pressure-mode piezoelectric element and a wedge will couple strongly to Rayleigh waves but very weakly to possible parasitic horizontally-polarized shear waves. The arrays themselves are typically very selective mode filters. Referring to FIG. 11, an array's spacing vector is designed to efficiently scatter the desired mode in the desired direction, fortuitous circumstances are required for the array to coherently scatter the wrong mode or the right mode in the wrong direction. In addition to these two fundamental mode filtering mechanisms that are inherently part of the sensor design, further mode filters may be introduced.

Figure 5:
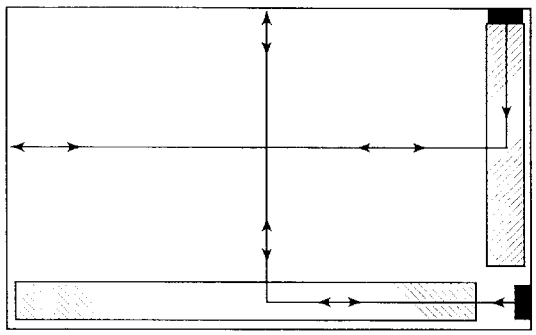
FIG. 5 is a prior art touchscreen system having two transducers and two reflective arrays.
Figure 7:
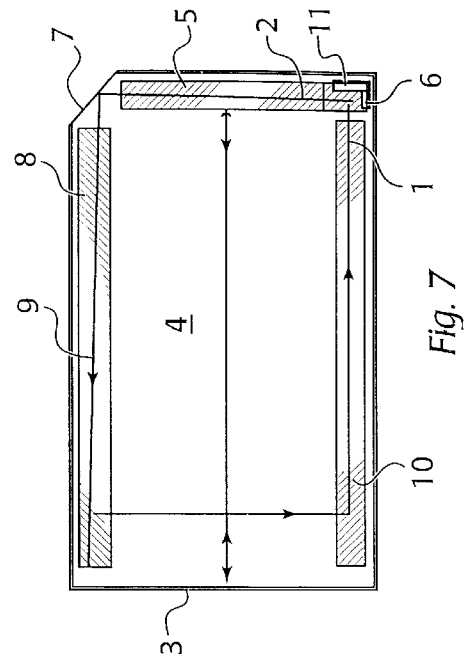
FIG. 7 is a touchscreen system having two transducers and three reflective arrays.

In some cases, the mode selectivity of reflective arrays can be enhanced by means of the depth structure of the reflective arrays. For example, FIGS. 5A and 5B of U.S. Pat. No. 5,072,427 consider reflective materials on both the top and bottom surfaces of a substrate in order to reduce parasitic mode generation during mode conversion from a ZOHPS wave to a Lamb wave of a specified symmetry (symmetric or anti-symmetric). In principle, optimal reflective array mode selectivity could be obtained if one had full design control over the depth profile of the reflector structure; this is not always cost-effective in practice.

Commercial acoustic touchscreens typically use acoustic damping materials to absorb or "filter out" undesired acoustic paths. For example, in sensor designs for which the substrate edges serve no desired acoustic purpose, acoustic absorbers such as contact adhesives are placed around at least part of the perimeter of the substrate to eliminate possible reflections off the edge of the glass. Such absorbers at the substrate perimeter are analogous in function to the wave-absorbing design of the sides of Olympic-style swimming pools; waves impinging the perimeter are not reflected back into the active area where they may complicate signal analysis or slow down swimmers. Such prior art techniques may also be applied to embodiments of the present invention.

FIG. 14, reference numeral 52, of U.S. Pat. No. 5,177,327 also shows use of acoustically absorbing materials to differentially absorb desired and parasitic modes. Such techniques may also be applicable to embodiments of the current invention. Reverse reflection schemes, such at that shown in FIG. 17 of U.S. Pat. No. 5,177,327, increase opportunities to place mode filters in the acoustic path from the transmit to receive transducers.

The substrate itself may be designed to selectively propagate desired modes and cut-off or absorb undesired modes. For example, if the desired mode is a lowest order plate wave, e.g. a ZOHPS or a flexural wave, then a sufficiently thin substrate will not support Rayleigh waves nor the higher order plate waves for which the cut-off frequency is above the operating frequency; the thinning may be in a limited region or for the entire substrate. As another example, the glass-polymer-glass lamination of safety glass may serve as a Rayleigh-wave substrate for wavelengths sufficiently small compared to upper glass thickness; all plate wave modes will be absorbed by the acoustically absorbing adhesive bonding layer. As yet another example, a Love-wave substrate may be designed with a thin slow-velocity layer on the top, a higher velocity medium in the middle, and an acoustically absorbing material on the bottom. The thickness of the slow-velocity layer can be reduced until only the lowest-order Love wave is captured. Such a Love-wave substrate will support the lowest-order Love wave and a modified Rayleigh wave, but will not propagate any of the (modified) plate-wave modes.

Some embodiments involve reflective boundaries. In some cases, the reflective boundary may be a source of parasitic mode conversions, for example when the reflective boundary is simply a machined edge of the substrate. In other cases, the reflective boundary may provide further mode filtering, for example reflective boundaries based on coherent scattering off of multiple reflectors, i.e. reflective boundaries based on the principles of FIGS. 11 and 17.

One interesting variant of a reflective boundary is a beveled edge of a substrate. As the substrate thins, cut-off frequencies for higher order plate-wave modes increase. If the beveled edge becomes sufficiently thin to drive a cut-off frequency above the operating frequency, then the corresponding mode will be reflected. Due to the high acoustic power density at the reflection point (analogous to the long dwell time at the maximum elevation of an object rolling up a hill), an absorber placed at the reflection point will have increased damping effect. For a beveled substrate edge, different higher order modes will have reflection points at different distances from the substrate edge; thus allowing strategically placed absorbers to differentially absorb different modes. This basic mode-filtering technical applies to both Lamb waves and horizontally polarized shear waves.

As an example, let us look at horizontally polarized shear waves in more detail. A mode selective filter may be provided by a substrate having a beveled reflective edge. As the substrate becomes thinner, the cutoff frequencies for HOHPS modes increase. As the wave-guide cut off frequency increases, the group velocity decreases. When the substrate is thin enough for the cut-off frequency to equal the operating frequency, the group velocity becomes zero and the wave is reflected. This reflection point differs for differing wave modes, such that the larger the order n of the mode, the further from the edge of the substrate will be the reflection point. An acoustic wave generally has enhanced sensitivity to absorbing materials placed in the neighborhood of the reflection point. The substrate beveling may take the form of a narrowing bevel or tapering on one or both sides of the substrate.

Thus, if an HOHPS of order n is desired, e.g., order n=4, the order n−1 wave, e.g., order n=3, will be the wave with the closest group velocity and hence a potential source of interference. On a substrate with a beveled edge, an absorptive material, such as a sealant, RTV silicone epoxy, adhesive or self-adhesive tape, placed beyond the order n=4 reflection point (where the substrate is thinner) will filter the lower order waves. This material may be placed on one or both sides of the substrate. In order to filter the order n+1 wave, a further adsorbent material may be placed at the order n+1 reflection point (where the substrate is thicker), which will absorb the order n+1 wave more than the order n wave due to the concentration of n+1 wave energy at that point. For the special case than n=0, note that the n=1 HOHPS mode to be suppressed relative the ZOHPS mode. One attractive feature of such use of a beveled edge as a reflective mode filter is that glass and other substrates are commonly manufactured with beveled edges.

Positive Response Sensor

The scope of the present invention includes embodiments where one or more sensor subsystems are of the positive-signal type. Here "positive-signal" refers to the use of desired acoustic paths for which a touch induces a mode conversion required to complete the acoustic path, or produces a wave shifted in phase from the originating wave. Hence the signal perturbation is the generation of a signal amplitude at a delay time for which the previous signal amplitude was small or zero. Corresponding changes, if necessary, are made in the lower level algorithm. Embodiments using phase sensitive controllers may not require any modifications; there is still a vector displacement in I-Q space. Once a delay time and perturbation magnitude are reconstructed, the higher levels of the touch reconstruction algorithm proceed as they would without the positive signal feature.

Before considering an illustrative example of a sensor using positive-signal sensor subsystems, recall the following acoustics. Consider the lowest order symmetric and anti-symmetric Lamb waves labeled as $L_1$ and $F_1$ in, e.g., FIG. 10.18 of the second edition of "Acoustic Fields and Waves in Solids: Volume II" by B. A. Auld. In the limit that the substrate is very thick, the phase velocities of these two Lamb modes becomes the Rayleigh-wave velocity, and an in-phase superposition of $L_1$ and $F_1$, "$L_1+F_1$", becomes a Rayleigh wave on the top surface and an out-or-phase superposition of $L_1$ and $F_1$, "$L_1-F_1$". If the substrate is thick, but finite in thickness, then these superposed modes are "quasi-Rayleigh waves", which indeed are the "Rayleigh waves" used in actual touchscreens. For substrates of finite thickness, an acoustic wave initially launched as "$L_1+F_1$" quasi-Rayleigh wave on the top surface will convert into "$L_1$–$F_1$" quasi-Rayleigh wave on the bottom surface after propagating a distance given by $$d=(\tfrac{1}{2}f)v_R^2/\Delta v$$

where f is the operating frequency, $v_R$ is the Rayleigh-wave velocity, and $\Delta v$ is the difference in phase velocity between the $L_1$ and $F_1$ modes at the operating frequency. By varying the thickness of the substrate, and can control the value of $\Delta v$ and hence control the value of d. For commercial Rayleigh-wave sensors as are produced by Elo TouchSystems, it is desired that d be very large compared to the dimensions of the touchscreen so that "Rayleigh waves" stay on the top surface of the touch substrate. Use of 2 or 3 millimeter soda-lime glass at 5.53 MHz satisfies this condition. Alternately U.S. Pat. No. 5,072,427 and 5,162,618 teach acoustic sensors in which first order Lamb waves sense touches; here the substrate is approximately two wavelengths thick or thinner, e.g. about 1 millimeter or less of soda-lime glass at 5 MHz. Here d is very short so that quasi-Rayleigh wave behavior is suppressed. Having reviewed this background material, let us know consider the case of an intermediate substrate thickness (perhaps determined empirically) for which d is equal to the distance of an acoustic path across the touch sensitive zone.

For simplicity, let us first consider the case in which there are no reflective arrays, but rather a straight line of sight betwen transmit and receive transducers as in U.S. Pat. No. 3,673,327 of Johnson and Fryberger, as shown in FIG., 1(a). As described above, the substrate thickness is chosen such that a top-surface quasi-Rayleigh wave launched on one side of the touch region will be received as a bottom-surface quasi-Rayleigh wave on the other side of the touch region. By placing, e.g. wedge, transmit and receive transducers on the top and bottom surfaces of the substrate, both top and bottom quasi-Rayleigh waves can be launched and received. This arrangement supports four sensor subsystems with top-to-top, top-to-bottom, bottom-to-top, and bottom-to-bottom, acoustic transmission from a transmit transducer to a receive transducer. Before a touch (or contaminants), the top-to-bottom and bottom-to-top subsystems have large signals and the top-to-top and bottom-to-bottom subsystems have small (nominally no) signals. A touch will attenuate the top-to-bottom and bottom-to-top signals and create a positive signal response in the top-to-top and bottom-to-bottom signals.

For this example, a strongly absorbing touch on the top surface of the touch region will "reset" the wave mode as a bottom quasi-Rayleigh wave. Hence a touch not only attenuates the acoustic energy, but also changes the phase between the $L_1$ and $F_1$ components. Hence the $L_1$ and $F_1$ components will no longer have a phase difference of 0° or 180° at the receive transducers, and hence the received wave will no longer be a pure quasi-Rayleigh wave on one surface. The receive transducers on both surfaces will both detect a quasi-Rayleigh wave component. By this mechanism, the absorbing touch leads to a positive signal.

Note that a quasi-Rayleigh wave launched on the top surface and nominally received on the bottom surface will be more heavily absorbed (as measured by the sum of the intensities of the two receive signals) by a touch nearer the transmit transducers than the receive transducers. The converse is true for a quasi-Rayleigh wave launched on the bottom surface. Hence the ratio of the summed received intensities for bursts from the two transmit transducers provides a measurement of position along the direction of the acoustic path. With the four signals, top-to-top, top-to-bottom, bottom-to-top, and bottom-to-bottom, a touch coordinate and touch pressure can be determined with two additional degrees of freedom for redundancy or measurement of additional touch characteristics.

The above transducer-line-of-sight scheme generalizes to sensors with reflective arrays. For example, a rectangular sensor with only "X" arrays could measure X and Y coordinates if it is provided with transducers and reflective arrays on both the top and bottom of the substrate. Note that in this scheme there is no ambiguity for multiple touches regarding which X coordinate to associate with which Y coordinate. It may be advantageous to thicken the substrate in the region of the arrays so that quasi-Rayleigh waves between the transducer and the scattering on the arrays stay on the desired surfaces. For such a rectangular sensor with both "X" and "Y" arrays and transducers on the top and bottom surface, both X and Y coordinates would be redundantly measured.

Positive-signal sensor subsystems may be considered in which a touch induces other types of mode conversions, e.g. where a wedge transducer transmits a Rayleigh wave, the transmitting array scatters the acoustic beam into the touch region in the form of an n=3 HOHPS wave, the receiving array selectively scatters n=4 HOHPS waves into Rayleigh waves which are then received by a Rayleigh-wave wedge transducer. Mode conversion from n=3 to n=4 HOHPS mode in the touch region is required to complete the acoustic path. Such a sensor would be sensitive to such mode converting perturbations.

In an embodiment such a positive-signal sensor subsystem is combined with other sensor subsystems, and dual or multiple mode algorithms provide added characterizations of true and false touches.

Non-touchscreen Applications

The present invention adds much flexibility regarding in sensor geometry. Maximum sensor size is increased. Sensors need not be rectangular. Dramatically non-planar shapes are possible. This opens the door for many non-touchscreen applications for which rectangular substrates are not appropriate.

The hexagonal sensor of FIG. 15(b), the triangular sensor of FIG. 15(c), the cylindrical sensor of FIG. 19(a), the spherical sensors of FIG. 21, the basin sensor of FIG. 22(a) and (b), and the half-hemisphere of FIG. 22(c) provide examples of the freedom of sensor geometry provided by the principles of FIG. 10, FIG. 17, and FIG. 20. This enhances the applicability of acoustic touch sensor technology to, for example, endow robot components with a sense of touch.

An example of a non-touchscreen application of acoustic touch position sensing is to detect the presence of acoustically absorptive matter on a surface. For example, as shown in FIGS. 22(a) and (b), acoustic waves are used to determine whether a basin or toilet has been used, the nature of its contents, and during a flushing or draining process whether and when it is reasonably clean. Thus, a feedback mechanism is provided for the inside of a wash basin or toilet, which may form part of a control system. If it is desirable that the sensor may be able to distinguish solids from liquids, it is preferred that horizontal shear wave such as a Love wave be employed. Such a wave is viscosity sensitive, and thus is relatively insensitive to water and more sensitive to viscous materials. Algorithms may thus be implemented to support public policy, e.g., a recent California drought slogan: "If it's pee, let it be, if it's brown, flush it down." In this case, the position of a mass need not be determined with precision or without ambiguity.

Figure 27A:
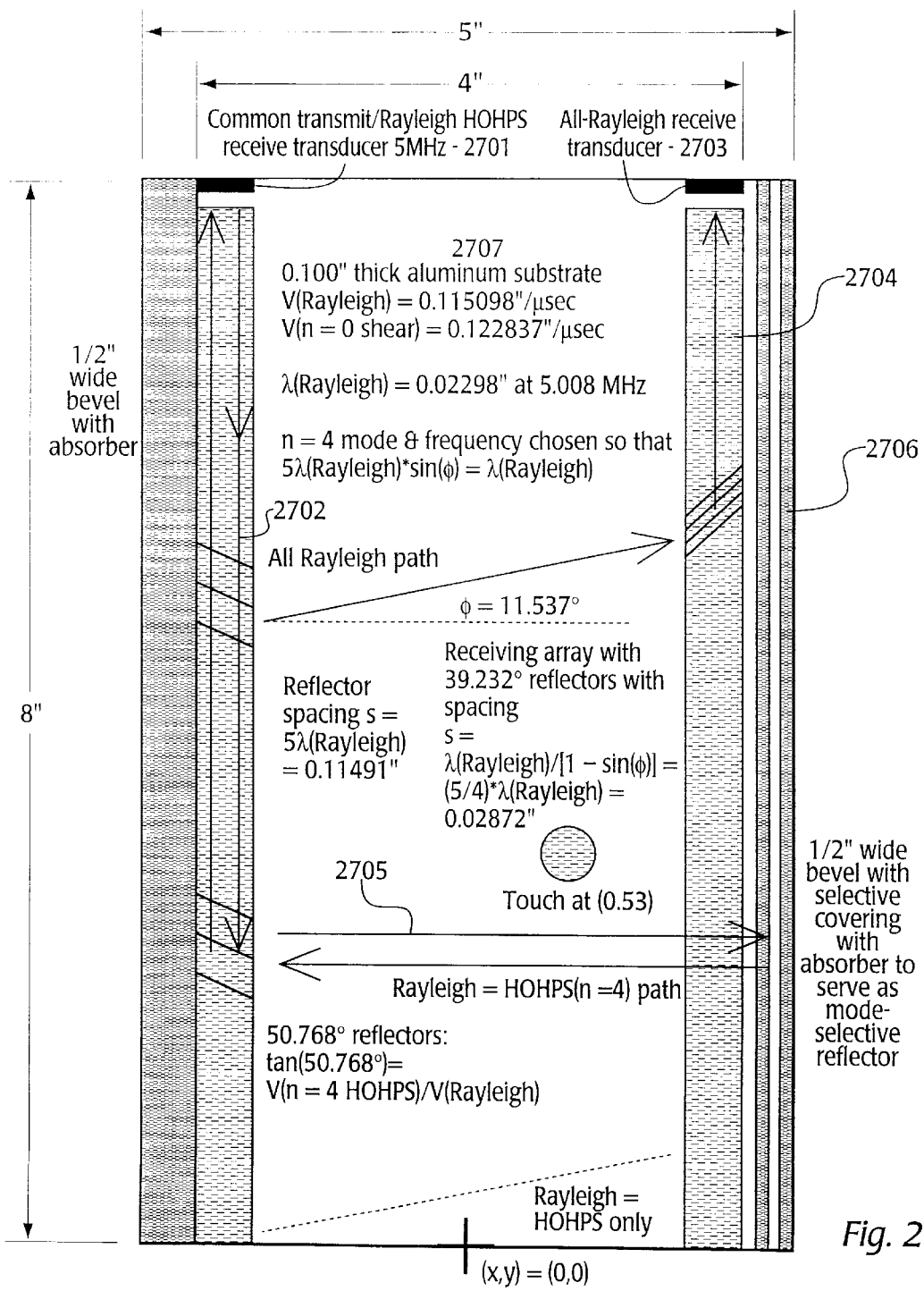
FIGS. 27(a) and 27(b) show a touch position sensor system having two non-orthogonal sets of wavepaths for waves of differing modes, and a timing diagram showing the relationship of received signals, respectively, according to the present invention.
Figure 27:
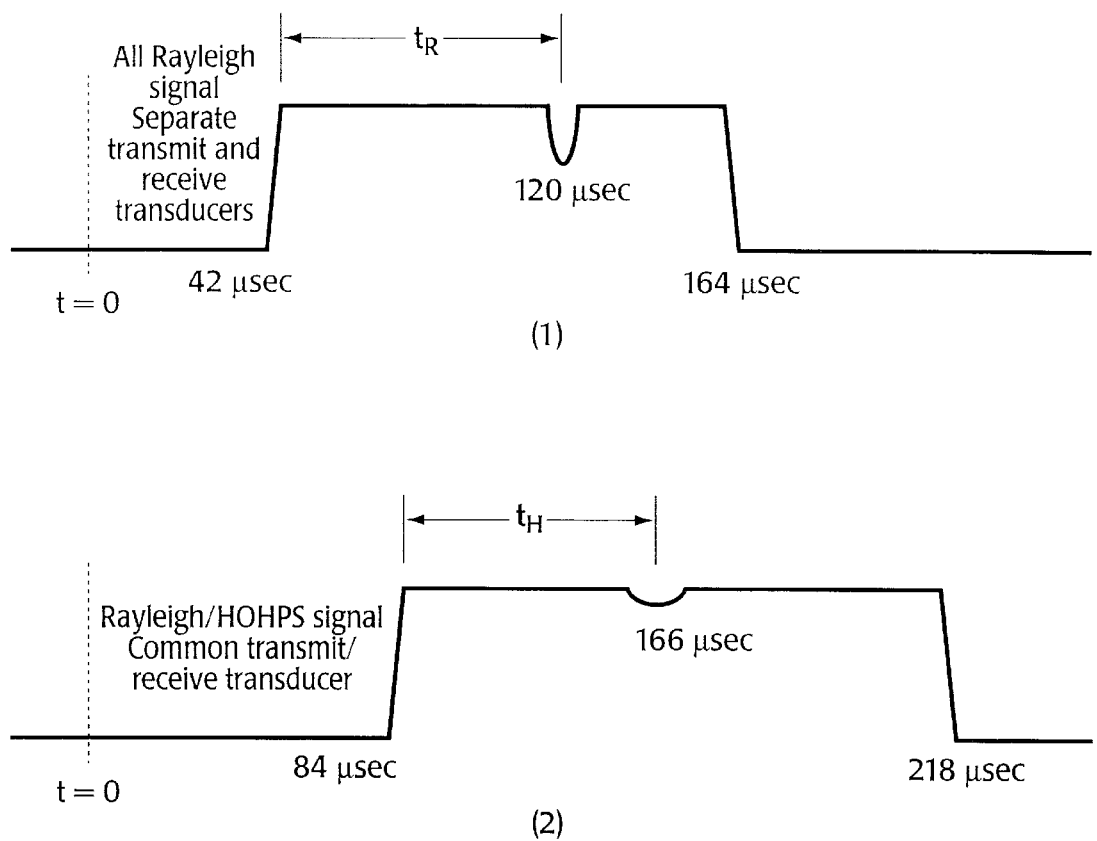

The present invention allows the use of redundant information to determine the position or quality of a touch, allowing differential sensing and immunity from shadowing in various embodiments. While often it is desired to sense coordinate position, in some applications, an axial position measurement is sufficient. Therefore, the present invention also includes one dimensional sensors. For example, practical applications of 1-D sensors include components of an apartment building door-bell system; elevator buttons; musical devices; single degree of freedom manual input devices; and a touch sensor for a security entry system. For example, See FIG. 27, which shows a dual mode primarily single axis sensing system. In this system, waves of differing modes, a Rayleigh wave and an n=4 HOHPS wave are employed. Both waves are emitted from a single transducer 2701. The wave is emitted at about 5 MHz, is scattered at a non-orthogonal angle by a reflective array 2702, and is scattered to a second transducer 2703 by another reflective array 2704. The HOHPS wave, on the other hand, is emitted and travels along an orthogonal path 2705. The HOHPS wave passes through the reflective array 2704, reflects of a selective n=4 HOHPS reflective boundary 2706, formed as a partially masked beveled edge, and is redirected along its path of incidence, to the reflective array 2702, back to the transducer 2701. In this case, the substrate 2707 is aluminum. FIG. 27(b) shows a timing diagram for the system according to FIG. 27(a), in which the Rayleigh, FIG. 27(b)(1) and HOHPS, FIG. 27(b)(2), waves overlap in time. Due to the non-orthogonal path of the Rayleigh wave, some horizontal position information may be extracted from the received signals.

For security systems, for example, it may be advantageous to be able to verify that the finger or stylus has the expected acoustic properties (e.g., ratio of shear to Rayleigh absorption). Thus, for example, to enter an area containing biohazard materials, one may want to require that the operator is wearing dry rubber gloves selected, in part, to have a distinctive acoustic signature.

The use of coversheets extend the potential applications for this invention. The touch surface may be exposed, or covered. For example, a plastic sheet with spacer dots, provides a number of interesting advantages. Such a cover sheet protects touch surfaces from scratches and digs that may disrupt propagation of acoustic waves; particularly if the shell is a soft metal like aluminum. By keeping rain off the touch surfaces, a cover sheet may enable outdoor applications. When provided a coversheet, an acoustic sensor responds more directly to the pressure of contact via the compliance of the sheet (rather than sensing the acoustic properties of the contacting material). See, Knowles and Huang, U.S. Pat. No. 5,451,723, which proposes the use of a cover sheet with acoustic touch panels for certain applications.

Advantageously, "control buttons" can be painted on the touch surface, or on a corresponding cover sheet. This allows a single surface to serve both as sensor and a user input device, providing an opportunity for a unified interface to reduce costs, such as on a toy device, or to best exploit available surface area. On a toy robot, for example, a cylindrical aluminum shell is provided with a cover sheet having graphics. As the toy robot moves, any contact will be sensed. When the robot is motionless, or under other circumstances where contact with environmental objects is unlikely, e.g., where a touch is not detected along an axis of movement or expected touch, the sensing may be analyzed as a potential input from a user.

The scope of this invention is not limited to transparent touchscreens placed in front of display devices.

EXAMPLES

Example 1

FIG. 10 represents a generic sensor subsystem including transmit and receive transducers and arrays. This generic sensor subsystem includes a family of embodiments which differ in the various parameters.

Later examples will generalize to families of embodiments in which the acoustic path between the transmit and receive arrays are scattered one or more times by reflective boundaries. Later examples will also generalize to families of embodiments in which the sensor surface has non-planar geometry. In this example, we consider the generic sensor subsystem of FIG. 10.

In the embodiment of FIG. 10, a set of acoustic paths is associated with a sensor subsystem. Each member of the set of acoustic paths can be represented by a value between zero and one of a path parameter "s". (In cases where a range other than zero to one is mathematically convenient; this can easily be accommodated with a change of variables.) The acoustic path for a given path parameter starts at the transmit transducer centered at position $T_t$, proceeds along the transmit array for a distance and direction $sA_t$ where it is redirected across the touch sensitive region for a distance and direction $P(s)$ where it is intercepted by the receive array. The acoustic path then continues for a distance and direction given by $sA_r$ until it ends at the receive transducer centered at $T_r$. The array locations and orientations need not have any particular relation to Cartesian axis directions or edges of the glass.

According the present invention, there is no requirement that the set of acoustic paths through the active region be a set of parallel paths, although in many cases it is convenient to do so in order to simplify touch reconstruction algorithms.

There is an acoustic mode associated with each segment of the acoustic paths. Here we define $V_t$ to the group velocity, and $v_t$ to be the phase velocity, of the acoustic mode that is emitted from the transmit transducer and travels down the transmit array and is scattered, and perhaps mode converted, by the transmit array. Similarly we define $V_p$ and $v_p$ for the path segment across the touch region and $V_r$ and $v_r$ for the segment along the receive array. The acoustic mode across the touch region must be a surface acoustic wave such as Rayleigh or Love waves and Lamb, ZOHPS, HOHPS waves in sufficiently thin substrates. The modes along the arrays can be any mode with sufficient coupling to the transducers and the reflective array elements.

For each value of the path parameter, there is an associated delay time. This delay time is related to the group velocities of the modes used by the following equation.

$$t(s)=sA_t/V_t+P(s)/V_p+sA_r/V_r$$

(Recall notation where, for example, $A_t$ represents the magnitude of the "bold face" vector $A_t$.)

It is generally desirable, but not a requirement, that a geometry be chosen so that the delay time is a monotonically increasing function of the path parameter. If so, then a finger touch in the active region causing a reduction in signal amplitude at time $t(s)$ must be located within the locus of points defined by varying $\alpha$ between zero in one in the following expression.

$$\alpha P(s)+sA_t+T_t$$

The reflective arrays may be designed with the aid of the spacing-vector method illustrated in FIG. 11. Wave vectors used in the spacing-vector calculations are determined as follows. The wave vectors $k_t$, $k_p(s)$, and $k_r$, are parallel to $A_t$, $P(s)$, and $A_r$ respectively. The magnitudes of the wave vectors $k_t=2\pi/\lambda_t$, $k_p=2\pi/\lambda_p$, $k_r 2\pi/\lambda_r$, dependent on the mode wavelengths $\lambda_t$, $\lambda_p$, and $\lambda_r$, which in turn are determined by the operating frequency, f, and the phase (not group) velocities $v_t$, $v_p$, and $v_r$, namely $\lambda_t=v_t/f$, $\lambda_p=v_p/f$, and $\lambda_r=v_r/f$. Given the wave vectors as a function of the path parameter, the reflective array spacing vectors may be calculated as follows. For the transmit array, the reflector spacing vector can be calculated by the equation below.

$$S(s)=2\pi n(k_t-k_p(s))/|k_t-k_p(s)|^2$$

Similarly, for the receive array, the orientation and spacing of the reflectors are determined as follows.

$$S(s)=2\pi n(k_p(s)-k_r)/|k_p(s)-k_r|^2$$

For clarity of presentation, FIG. 10 does not fully does not include the following generalizations which are within the scope of this invention.

The vector representing the receive-array scatter location, $sA_r$, is more generally expressed as $r(s)A_r$ where $r(s)$ is a monotonically increasing function of the path parameter with a range from zero to one.

FIG. 11 of U.S. Pat. No. 4,642,423 of Adler teaches an array design technique to cause an acoustic beam traveling along an array to deviate from a straight-line trajectory, or more generally to deviate from a geodesic trajectory such as a great circle. With the use of this or other wave guiding techniques, the family of embodiments associated with FIG. 10 is extended to cases in which the arrays are not straight line segments.

A gap without reflectors can be introduced between the transducers and their corresponding arrays. Such a gap, for example, may be used to prevent the transducer in question from blocking acoustic paths of another sensor subsystem. More generally, within the formalism of FIG. 10, there is no requirement that the full length of the array is populated with reflective elements.

Example 2

FIG. 12 illustrates examples of specific touch region geometries within the scope of FIG. 10.

The rectangular touch region shown in FIG. 12(*a*) is typical of the X-coordinate sensor subsystems of current flat rectangular acoustic touchscreen products.

If all segments of the acoustic path in FIG. 12(*a*) use the same acoustic mode, then the spacing-vector formula leads to the prior art 45° reflectors with wavelength spacing along the array axes. For example, if the incident wave is in the –X direction and the scattered wave is in the Y direction, then the spacing vector is calculated to be $S=(n\lambda/2,n\lambda/2)$ and hence the reflectors are at 45° the spacing between reflectors in a direction perpendicular to the reflectors is $n\lambda/\sqrt{2}$ and the reflector spacing in along the array axis $n\lambda$.

If, instead, the transmit and receive array modes are zeroth order horizontally polarized shear (ZOHPS) waves and the touch region mode is a Lamb wave, then the spacing vector is calculated to be $S=n(\lambda_{Lamb},\lambda_{ZOHPS})\{\lambda_{Lamb}\lambda_{ZOHPS}/(\lambda_{Lamb}^2+\lambda ZOHPS^2)\}$. This in turn implies a reflector angle θ with respect to array axis satisfying the condition $\tan(\theta)=\lambda_{Lamb}/\lambda_{ZOHPS}=v_{Lamb}/v_{ZOHPS}$. This reflector orientation is that given in equation 2 of U.S. Pat. No. 5,072,427. In terms of θ, the magnitude of the spacing vector can be reduced to $S=n\sin(\theta)\lambda_{ZOHPS}$ which in turn implies $n\lambda_{ZOHPS}$ reflector spacing with respect to the array axis. Hence, the array design essentials of U.S. Pat. No. 5,072,427, incorporated herein by reference, are also derivable from the spacing vector formula.

Going beyond prior art, the principles of FIG. 10 combined with the vector-spacing formula also allow one to engineer sensor subsystems for a variety of other geometries including parallelograms as in FIG. 12(*b*), trapezoids as in FIG. 12(*c*), and triangles, as shown in FIGS. 12(*d*), 12(*e*) and 12(*f*).

Example 3

FIG. 13 represents an example sensor design that utilizes four sensor subsystems. This design supports control systems which include anti-shadowing algorithms and algorithms that resolve multi-touch ambiguities. The touch region has a width-to-height aspect ratio of √3:1.

Two sensor subsystems are rectangular as in FIG. 12(*a*), see FIG. 13(*a*). By itself, FIG. 13(*a*) has much in common with prior art sensors with standard X and Y measurements. FIG. 13(*a*) shows an X transmit transducer 1301, an X transmit reflective array 1302, with reflective elements at 45°, an X receive reflective array 1303, with reflective elements at 45°, and an X receive transducer 1304. Likewise, a Y transmit transducer 1305, a Y transmit reflective array 1306, with reflective elements at 45°, a Y receive reflective array 1307, with reflective elements at 45°, and a Y receive transducer 1308 is provided along an orthogonal set of axes.

The other two subsystems provide a measurement of a "U" diagonal coordinate. FIG. 13(*b*) illustrates these other two sensor subsystems. They are both of the type illustrated in FIG. 12(*f*). One set of acoustic paths start at the X transmit transducer 1301 and are received by the Y receive transducer 1308; the touch region for this sensor subsystem is triangular with sides defined by the X transmit array 1302, the Y receive array 1307, and a diagonal across the touch region. The other set of acoustic paths start at the Y transmit transducer 1305 and are received by the X receive transducer 1304; the touch region for this sensor subsystem is triangular with sides defined by the Y transmit array 1306, the X receive array 1303, and a diagonal across the touch region. In both cases, the acoustic paths through the touch region are at a 30° diagonal with respect to the X axis. Together, the touch regions of these two sensor subsystems cover substantially all of the rectangular touch region covered by the X and Y sensor subsystems of FIG. 13(*a*).

Reflector angles and spacings are noted in FIG. 13. These values can be derived from the principles of FIGS. 10 and the spacing-vector formula. Reflector angles have been calculated for the case in which all segments of all acoustic paths use the same acoustic mode a wavelength λ. The spacing-vector formula supports generalization to embodiments involving mode conversion.

The arrays shown in FIGS. 13(*a*) and 13(*b*) are superposed. The transmit array 1302 in front of the X transmit transducer includes both 45° and 75° degree reflectors. The transmit array 1306 in front of the Y transmit transducer includes both 45° and 60° degree reflectors. The receive array 1303 in front of the X receive transducer includes both 45° and 15° degree reflectors. The receive array 1307 in front of the Y receive transducer includes both 45° and 30° degree reflectors. These reflector orientations are appropriate for designs in which no mode conversion at the reflective arrays, i.e. reflector elements are oriented like mirrors so that the angle of incidence equals the angle of reflectance.

In a specific embodiment for which the acoustic wavelength is 0.0226", e.g. soda-lime-glass substrate with an operating frequency of 5.53 MHz, the reflector spacings along the array axes are an integer times 0.0226" for all 45° reflectors, an integer times 0.0121" for the 75° $X_t$ reflectors, 0.1687" for the 15° $X_r$ reflectors, 0.0151" for the 60° $Y_t$ reflectors, and 0.0452" for the 30° $Y_r$ reflectors.

FIG. 23 shows the timing of received signals for the all-Rayleigh X-Y-U 30°-diagonal sensor shown in FIG. 13. Other options for acoustic modes and geometrical dimensions of an X-Y-U diagonal sensor will lead to qualitatively similar timing diagrams. As shown, a single acoustic emission from either transmit transducer is received by two receiving transducers. It is noted that the diagonal axis is read in two halves, from separate transducers, hence, a touch 2301 will perturb only one such diagonal path signal. Compare FIGS. 23(d) and 23(c).

In order to analyze the received signals, an anti-shadowing algorithm may be applied which first searches for a touch in one axis and then the other, reporting a valid output if both are found. If one is found and the other is not, the diagonal axis signals are analyzed for touch information. If one of the diagonal signals indicates a touch, then that signal is transformed to produce the missing data and output. Where a touch is not found on another axis, an error condition exists. Where no touch is seen on any axis, no output is reported. With such an anti-shadowing algorithm, consider the case in which an acoustic wave sensing a touch of one sensor subsystem is strongly shadowed by, for example, a drop of water absorbing a Rayleigh wave or a frozen drop of water absorbing a ZOHPS wave. In order to determine a position of a touch, two coordinates are required, which correspond to an X and Y. Where one of the X and Y is subject to interference, the 30° diagonal path which intersects the touch position, but generally does not also intersect the interfering substance, may be analyzed to determine the position of a touch. A relatively simple transform is applied to produce outputs corresponding to X and Y.

Alternately, a redundancy-check/multiple-touch algorithm may be employed. Because the data includes redundant information, in the absence of interference, the additional data may be used to check the computed positions for consistency or to determine the existence and position of multiple touches. In an initial step, candidate X and Y touch coordinates are constructed from the X and Y data streams. These candidates are compared for consistency with the diagonal data. Where all three correspond, a valid output condition exists. Where they do not correspond, a different candidate coordinate is proposed and tested.

Example 4

The sensor of example 3 and FIG. 13 is an X-Y-U sensor in which the U acoustic paths are at a 30° diagonal angle and an aspect ratio of √3:1. In this example, we consider an X-Y-U sensor with an arbitrary aspect ratio.

Let H and W be the height and width of the touch region of an X-Y-U sensor. The U acoustic paths through the touch region have a diagonal angle satisfying $\tan(\Theta)=H/W$. The principles of FIG. 10 and the spacing-vector formalism lead to the reflector angles and spacings for the U subsystems as given in the table below. For the value $\Theta=30°$, the angles and spacings of FIG. 13 are reproduced. The line widths given in the table correspond to the line width that maximizes the scattering amplitude; as previously noted these line widths may be used but are not required.

|  | Angle | Spacing | Line width |
| --- | --- | --- | --- |
| X transmit | $90° - \Theta/2$ | $\lambda/(1 + \cos(\Theta))$ | $\lambda/(4 \times \cos(\Theta/2))$ |
| X receive | $\Theta/2$ | $\lambda/(1 - \cos(\Theta))$ | $\lambda/(4 \times \cos(90° - \Theta/2))$ |
| Y transmit | $45° + \Theta/2$ | $\lambda/(1 + \sin(\Theta))$ | $\lambda/(4 \times \cos(45° - \Theta/2))$ |
| Y receive | $45° - \Theta/2$ | $\lambda/(1 - \sin(\Theta))$ | $\lambda/(4 \times \cos(45° + \Theta/2))$ |

In prototypes constructed according to the present invention, a system having touch region dimensions of H=6.40" and W=9.60" was constructed. These are the same touch region dimensions as the commercial touchscreen product E284A-693 sold by Elo TouchSystems, Inc. The prototypes were similar in construction, including placement of reflective arrays, except that the arrays in the prototype sensor were superposed arrays including U reflectors as well as standard X and Y reflectors. These prototypes demonstrated the use of diagonal acoustic paths and superposed arrays. The U diagonal angle of the prototypes is 33.7° as required by $\tan(\Theta)=H/W=6.40"/9.60"=\tan(33.7°)$. The spacings and orientations of the reflectors for the U sensor subsystems were calculated using the formulas in the above table.

All desired sets of acoustic paths were observed in the prototypes. This demonstrates the operation of superposed arrays. This also provides another demonstration of the spacing-vector formalism as a general means to enable calculation of reflector spacings and orientations from first principles. Some signal artifacts from interfering parasitic acoustic paths were observed with these prototypes, but none that can not be removed or tolerated with the aid of one or more of the following parasitic suppression techniques: reduction of electronic cross-talk in controller and in cabling between X and Y burst lines; fine tuning of array foot print geometry; acoustic damping on back side of substrate (e.g. optical bonding or back side application of an OCLI HEA™ anti-reflective coating on a plastic film with contact adhesive); line width modulation; increased density of reflectors elements; and use of a phase-sensitive controller. In all cases in which parasitic acoustic paths were detected in the prototypes, the acoustic path from the transmit to the receive transducers involved only one scattering off of an array; no signal artifacts were observed due to parasitic paths involving multiple reflections.

Example 5

FIG. 14 provides for the addition of a second diagonal "V" measurement beyond the X, Y, U sensor of FIG. 13. FIG. 14 therefore illustrates two additional sensor subsystems. The reflective arrays for this V subsystem are superposed on X,Y, and U arrays similar to those FIG. 13. Acoustic paths for one sensor subsystem start at the X transmit transducer 1301 and end at the Y transmit transducer 1305, which in this context serves as a receiving transducer; this sensor subsystem is of the type shown in FIG. 12(e). Acoustic paths for the other sensor subsystem start at the Y receive transducer 1308, now used as a transmit transducer, and are received by the X receive transducer 1304 transducer; this sensor subsystem is of the type shown in FIG. 12(d). In this case, the X transmit reflective array 1302 includes an additional set of reflective elements at 15°, the X receive reflective array 1303 includes an additional set of reflective elements at 75°, the Y "transmit" reflective array 1306 includes an additional set of reflective elements at 30°, and the Y "receive" reflective array 1307 includes an additional set of reflective elements at 60°. The reflector spacings are noted on FIG. 14, and may be calculated according to the principles according to FIG. 10 and the spacing-vector formula.

There are many options regarding the acoustic modes which may be employed. In one embodiment, the U and V subsystems involve no mode conversions, while the X and Y subsystems do. For example, all acoustic path segments may use Rayleigh waves, except for the touch region segments of X and Y which use Love waves. Alternatively, all acoustic path segments may use ZOHPS waves, except for the touch regions of X and Y which use a lowest order symmetric or anti-symmetric Lamb wave. In both these cases, one of the pairs of coordinates (X,Y) and (U,V) senses touch with a horizontally polarized shear wave and the other with an acoustic mode with significant vertical motion (coupling to pressure waves in fluids) at the touch surface. A false touch due to a water drop may be rejected by an anomalously small ratio of shear-wave to non-shear-wave touch signal.

If there is no mode conversion in the U and V subsystems, the principles of FIG. 10 and the spacing-vector formula lead to the reflector angles and spacings shown in FIGS. 13(b) and 14. However, where mode conversions are implemented, different reflector angles are used. To implement mode conversion in the X and Y subsystems, the 45° reflector angles illustrated in FIG. 13(a) are not used; the tangent of these reflector angles will equal the ratio of the phase velocity of the mode in the touch region to the phase velocity of the mode propagating along the array.

As with the X-Y-U sensor, the X-Y-U-V sensor need not be limited to diagonal paths at +3° and −30° angles. The U and V angles are approximately equal and opposite with magnitudes equal to the inverse tangent of the aspect ratio of the touch region. Preferably, the diagonal waves have a angle of between about 10° to 80° to the reflective array, and more preferably between 25° and 65° to the reflective array. The various wave angles preferably differ from each other by about at least 5°, and more preferably by at least 15°.

It should be understood that, as an extension of these techniques, it is possible to direct a set of acoustic paths having an incremental variation from each transducer to all transducers, including the originating transducer. Thus, the system is not limited to, for example, four sets of acoustic paths. Likewise, while separating the sets of received waves at differing transducers allows use of simple AM receivers for the acoustic waves, the invention is not so limited and a plurality of sets of waves may be received by a single transducer, with portions received simultaneously.

Example 6

Touch sensors according to the present invention need not be rectangular. A wide variety of polygonal shapes are possible. For example, FIG. 15(b) illustrates a hexagonal sensor including six identical trapezoidal sensor subsystems of the type of FIG. 12(c).

In this figure, even numbered transducers 1502, 1504, 1506, 1508, 1510, 1512 are transmit transducers and odd numbered transducers 1501, 1503, 1505, 1507, 1509, 1511 are receive transducers, although this is not the only possibility. The six trapezoidal sensor subsystems provide acoustic paths between pairs of transducers as follows: transmit from 1512 with receive at 1509; transmit 1502 with receive at 1511; transmit 1504 with receive at 1501; transmit 1506 with receive at 1503; transmit 1508 with receive 1505; and transmit 1510 with receive 1507.

The reflector angles of ±60° shown in FIG. 15(a) correspond to the case in which there is no mode conversion during scattering at the arrays. This can easily be generalized to other acoustic-mode options using the vector-spacing formula.

Most of the touch panel surface is covered by three sensor subsystems. If, as drawn, arrays are shortened to make room for transducers, then there may be the three strips covered by only two sensor subsystems. In this case, the very center of the panel is insensitive. Alternately, one can back off the transducers and use longer arrays; perhaps at the expense of increasing the width of the border region. In addition, a set of paths may be provided which are rectangular, e.g., FIG. 12(a), which encompass the gap region. Three such added rectangular sensor subsystems may utilize the following pairs of transmit/receive transducers: 1506 and 1501; 1508 and 1503; and 1510 and 1505. When these three rectangular sensor subsystems are added, then each array has three superposed sets of reflective arrays.

In theory, a reflective array system may be provided to direct acoustic waves to each other reflective array (with a reflection allowing transmission to reflective arrays disposed on the same side or at an overly obtuse angle). It is preferred, however, in order to minimize acoustic losses, that no more than three sets of reflective elements be provided in any reflective array.

This hexagonal touch sensitive surface has application, for example, as a system built into a conference table. The sensor is provided as, for example, a portion of a table top for a round table. A central portion of the table includes a hexagonal substrate, each edge having a pair of transducers and a composite reflective array having two or three sets of reflective elements for directing waves to each side which is not adjacent. Thus, with three superposed arrays, waves are directed at 60°, 90° and 120°. Therefore, to sense coordinate position along two axes, potentially 18 wave paths are provided, or nine non-trivial paths. A significant redundancy therefore exists, providing enhanced immunity to shadowing and allowing resolution of multiple simultaneous touches, suppression of interference from fixed objects, distinction of finger from palm, and other advantages. Several people sitting around the table could simultaneously interact with the system. Due to the large number of sensing paths, this table therefore allows conferencing and multitouch capability. The touch panel itself may be opaque or transparent. If it is transparent, a reverse projection screen may be provided on the back side of the substrate upon which an image is projected. For example, a projective display device may illuminate a reverse projection screen laminated to the underside of a 3 mm thick borosilicate glass substrate, upon which an all-Rayleigh wave hexagonal sensor is fabricated; the relatively low acoustic attenuation of borosilicate glass at 5.53 MHz can support a sensor size with a touch region large enough to contain a 60 cm diameter circle.

As shown in FIG. 15(c), the principles may also be applied to a triangular sensor, which in this case also uses the arrays according to FIG. 15(a). In this case, the wavepaths correspond to FIG. 12(d). Alternatively, with array designs differing from FIG. 15(a), a triangular sensor may use three sensor subsystems of the type of FIG. 12(e) with the same arrangement of transmit and receive transducers given in FIG. 15(c).

As is evident from this example, and the general principles of FIGS. 10 and 11, a wide variety of polygons are possible shapes for touch sensors.

Example 7

This example illustrates the use of this invention to extend sensor size. For some applications, e.g. electronic whiteboards, larger sensor sizes are of considerable interest.

For a given acoustic mode, operating frequency, and acoustic substrate, the sensor size is limited by a maximum acoustic path length beyond which further attenuation of the acoustic waves leads to unacceptably weak signal strengths. For example, for 5.53 MHz Rayleigh waves in soda-lime glass, weak signal amplitudes typically are a problem for acoustic paths longer than about one meter. Use of borosilicate glass or aluminum as a substrate can almost double this maximum path length, for otherwise the same system parameters.

The characteristics of the receiver systems and electronics, the electromagnetic noise environment affect the limit of detectability and hence affect the numerical value of the maximum acoustic path length. The efficiency of transducers and reflective arrays also influence the maximum path length. Whatever factors limit the acoustic path length, for a given maximum path this invention provides means to extend the maximum size of the sensor. For example, as shown in FIG. 16, a large rectangular sensor is shown having an X, U, V sensor layout along with representative examples of sensor subsystems.

For the X sensor subsystem of a prior art rectangular touchscreen, the maximum path length is approximately 2W+H where W and H are the width and height of the touch region. In the sensor illustrated in FIG. 16, the width is divided into four segments of length S=W/4. Hence each of the X sensor subsystems has a maximum acoustic path length of approximately 2S+H=W/2+H. For the U and V sensor subsystems, the maximum path length is $3S/2+\sqrt{[H^2+(3S/2)^2]}=3W/8+\sqrt{[H^2+(3W/8)^2]}$. For a touch region with a 3-to-4 aspect ratio, known prior art rectangular touchscreens employ a maximum path length of 2W+H=(11/3)H, while FIG. 16 gives maximum path lengths of W/2+H=(5/3)H and 0.46W+H=1.62H<(5/3)H. For given sensor size. the maximum acoustic path has reduced by more than a factor of two. For a given maximum acoustic path length the sensor size can more than doubled. By avoiding long acoustic path lengths along arrays, the permissible path lengths crossing the touch region are increased. This increases the maximum permissible height of the rectangular sensor.

According to this embodiment, as shown in FIG. 16, acoustic paths that must traverse the entire width of the sensor, e.g. as found in a Y sensor subsystems, have been avoided. As a result, there is no acoustic-path-length limitation on the width of the large rectangular sensor, provided there is no limitation on the number of transducers. Thus, while the height of the sensor in FIG. 16 is extended by remains limited, the width of the sensor can be arbitrarily increased with further segmentation of the arrays.

Delving into further details of the sensor in FIG. 16, there are six transmit transducers as indicated at the top of the sensor labeled TL, T1, T2, T3, T4, and TR. Six receive transducers are indicated at the bottom of the sensor and are labeled RL, R1, R2, R3, R4, and RR. The arrays associated with T1, T2, T3, T4, R1, R2, R3, and R4, are triply superposed arrays containing reflectors for X, U, and V sensor subsystems. The vertical arrays are doubly superposed arrays supporting U and V sensor subsystems only.

The reflector angles and spacings can be computed from the principles of FIGS. 10 and 11. The acoustic paths across the touch region are at angles of 90° and 90°±θ with respect to the horizontal where θ is defined as arctan[(3/2)S/H]. If there is no mode conversion, the reflective arrays at the top and bottom of the sensor have reflectors at angles of 45° and 45°±θ/2 and reflector spacings of nλ and nλ(1±sin θ). The side arrays have reflector angles and spacings of ±θ/2 and nλ(1−cos θ). One option for the reflector width can be determined by equalizing the reflector line widths and the gaps between reflectors for the densest reflector spacing. The spacing-vector formula allows calculation of reflector design parameters for embodiments employing mode conversion.

To minimize dead regions, it may be advantageous to "shingle" the top and bottom transducer-array systems, as shown in FIG. 16(c). By tilting the arrays so that the transducer end of the arrays is at least one transducer width closer to the edge of the glass than the far end of the arrays, the arrays can be extended to eliminate the dead spaces caused by the transducers as shown in FIG. 16(b).

The X, U, and V, coordinates determined by the sensor subsystems are linearly related to the delay times for signal perturbations induced by touches. Each sensor subsystem has is own appropriate constants for this linear mapping. U and V are related to Cartesian coordinates by the following relations.

$$U=X+\tan\theta \times Y \quad V=X-\tan\theta \times Y$$

The X, U, and V coordinates are interrelated by the following equations.

$$X=(U+V)/2 \quad U=2X-V \quad V=2X-U$$

Hence the Cartesian coordinates (X, Y) are related to X, U, and V as follows.

$$(X,Y)=(\{U+V\}/2,\{U-V\}/\{2\times\tan\theta\})=(X,\{U-X\}/\tan\theta)=(X,-\{V-X\}/\tan\theta)$$

Any two of X, U, and V is sufficient to determine a touch position. Furthermore, due to the redundancy and segmentation of the touch sensitive surface, multiple touches may be simultaneously detected and their positions analyzed.

Now consider specific embodiments with no mode conversion having a rectangular touch region with a 3-to-4 aspect ratio. The value for θ is 26.6°, so that the waves traverse the touch region at angles of 64.4°, 90° and 16.6° with respect to the horizontal X direction. The U subsystem reflectors angles are 31.72° for the top arrays, 58.28° for the bottom arrays, and 13.3° for the side arrays. The X subsystem reflectors of the top and bottom arrays are at 45°. The V subsystem reflector angles are 58.28° for the top arrays, 31.72° for the bottom arrays, and 13.3° for the side arrays. The U subsystem reflectors spacing is 1.809×nλ for the top arrays, 0.691×nλ for the bottom arrays, and 9.472×nλ for the side arrays. The X subsystem reflectors of the top and bottom arrays have nλ spacing. The V subsystem reflector spacings are 0.691×nλ for the top arrays, 1.809×nλ for the bottom arrays, and 9.472×nλ for the side arrays.

Further, another embodiment of the sensor has a layout wherein the dimensions of the touch region are 3 foot by 4 foot, i.e. 60 inch diagonal. With the layout of FIG. 16(a), the maximum acoustic path length is 60". This is feasible for 5.53 MHz Rayleigh waves in a borosilicate or aluminum substrate. Hence, the sensor design of FIG. 16(a) supports a size typical of many electronic white boards presently on the market.

White boards (not necessarily electronic) often have an enamel-on-metal writing surface. An aspect of the present invention is the use of a Love-wave substrate composed of a thin layer of low-acoustic-velocity enamel on a low-acoustic loss metal substrate. For example, an approximately 100 μm thick lead (or other heavy metal) based enamel on an 3 mm aluminum substrate, similar to known architectural panels in past use. Such a Love-wave substrate may be advantageous in suppressing effects of liquid contaminants such as a trail of drying ink from a felt pen and furthermore may be able to provide greater touch sensitivity than ZOHPS waves in a one millimeter thick substrate due to the Love wave's higher concentration of acoustic power near the surface.

Example 8

Flexibility of sensor design is further enhanced by the use of reflective boundaries in sensor subsystems to produce intermediate scattering of acoustic paths. See FIG. 17 which is a generalization of FIG. 10 in which the acoustic paths undergo an intermediate reflection between the transmit and receive arrays. Similarly, a plurality of reflections may occur.

The reflective boundary 1701 may be formed of an array of reflective elements similar to the transmit and receive arrays. For example see item 60 of FIG. 11 of U.S. Pat. No. 4,700,176. The angles and spacing of reflectors may be calculated using the spacing-vector formula, that is the reflective boundary's reflector spacing vector is given by the following expression (subscript "pt" for path from transmit array and "pr" for path to receive array).

$$S(s)=2\pi n(k_{pt}(s)-k_{pr}(s))/|k_{pt}(s)-k_{pr}(s)|^2$$

As with transmit and receive arrays, mode conversion is an option at a reflective boundary 1701.

Unlike the transmit and receive arrays, which need to be quasi-transparent to acoustic paths propagating along their lengths, reflective boundaries 1701 can be designed to be strongly reflective, so long as no acoustic path need pass through the reflective boundary 1701.

As with transmit and receive arrays, reflective boundary 1701 arrays from different sensor subsystems can also be can superposed with another sensor subsystem's reflective boundary 1701 or reflective array.

The reflective boundary 1701 may include an edge of the substrate. In this case additional diffraction-grating reflective boundary schemes may be considered, such as a faceted edge. If no mode conversion is desired, and the angle of incidence equals the angle of reflectance, then a simple machined glass edge may be sufficient, particularly for the lowest order plate waves: ZOHPS and lowest order symmetric and anti-symmetric Lamb waves. For example, see items 220 and 222 of FIG. 17 of U.S. Pat. No. 5,243,148.

While the acoustic path in FIG. 17 encounters only one reflective boundary 1701, these principles generalize to two or more intermediate reflections.

The delay time in terms of path parameter and group velocities of modes along transmit array ($V_t$), transmit path across touch region ($V_{pt}$), transmit path across touch region ($V_{pr}$), and receive array ($V_r$) is $$t(s)=sA_t/V_t+P_t(s)/V_{pt}+P_r(s)/V_{pr}+sA_r/V_r$$

A perturbation in the signal at this time corresponds to a touch within the union of the following two sets of points (where $0<\alpha<1$).

$$\alpha P_t(s)+sA_t+T_t$$

$$\alpha P_r(s)+P_t(s)+sA_t+T_t$$

FIG. 11 of U.S. Pat. No. 4,700,176 illustrates the use of reflective boundaries to reduce the required number of transducers; a sensor subsystem is shown in which the acoustic path leaves a transducer, is scattered by 90° by the reflective array, traverses the touch region, is reflected back across the touch region by a reflective boundary, and retraces its path back to the same transducer from which it started.

FIG. 17 of U.S. Pat. No. 5,243,148 illustrates the use of reflector boundaries to pass the acoustic path through mode selective filters. In this example, the "reverse reflection" reflective array directs acoustic paths away from the touch region through a mode filter before a reflective boundary redirects the acoustic paths back toward the touch region.

In the context of the present invention, reflective boundaries further increase the options for non-orthogonal acoustic paths, the options non-rectangular and non-planar sensor shapes, and the options for sensing touches with more than one acoustic mode.

Example 9

FIG. 17 embodies many possible sensor subsystem geometries, a few examples of which are show in FIG. 18.

In FIG. 18(a), the receive and transmit transducers and arrays are on one side of a trapezoidal touch sensitive region. The receiver and transmit arrays may be superposed, thus allowing the use of a common transmit/receive transducer.

FIG. 18(b) is a variation of the trapezoidal scheme in which the receive and transmit system are lined up in series. In the context of a vertical cylinder with periodic boundary conditions, the transmit and receive arrays may be superposed and use a common transmit/receive transducer.

The rectangular sensor subsystem in FIG. 18(c) involves a 180° reflection off the bottom edge. The transmit and receive arrays may be superposed, or indeed be identical, thus supporting the use of a common transmit/receive transducer. As presented in FIG. 18(c), with reuse of the reflective array and transducer, such sensor subsystems are known and employed by Carroll Touch in its ZOHPS products for X and Y coordinate measurements.

In FIG. 18(d), the transmit and receive arrays scatter in directions opposite to standard commercial rectangular sensors. This scheme is shown in FIG. 17 of U.S. Pat. No. 5,329,070 to Knowles. This scheme provides additional opportunities for mode filtering of the scattered acoustic waves and may be used to interpose time delays. Thus, a superposed reflective array may be provided with, e.g., reflective elements disposed at ±45° to an incident acoustic beam, with one scattered path traveling opposite to the other. One of the paths intersects a reflective boundary, which redirects it and/or mode converts it in a desired manner. Further, this configuration may be used to suppress certain parasitic paths. Finally note that the reflective boundary need not act as a mirror parallel to the reflective array, and therefore may produce an arbitrary reflection angle.

Example 10

FIG. 19 illustrates a cylindrical sensor which includes sensor subsystems of the types given in FIGS. 18(b) and 18(c).

For the purposes of this invention, the meaning of "planar surface" is extended to include any 2-dimensional surface of Euclidean geometry, i.e. surfaces that can be "unrolled and laid flat" without wrinkles or other distortions. A spherical surface is still non-planar; this is an observation related to the map makers' problem for flat maps of the globe. However, a cylindrical surface may be considered "planar" according to the present invention. A cylindrical sensor surface along with acoustic paths can be mapped to a flat surface with corresponding acoustic paths provided that the curvature is always large compared to the acoustic wavelength; and in fact known touchscreens for cylindrically curved video monitors do not provide particular compensation for the cylindrical shape. Hence the cylindrically curved sensor of FIG. 19 may serve to illustrate application of FIG. 18.

The sensor in the form of a complete cylinder poses an interesting topological twist to "planar" sensor geometry. The sensor of FIG. 19 takes advantage of the periodic boundary conditions of a full cylindrical surface 1901. As is apparent from inspection of FIG. 19, this eliminates the need for any vertical arrays.

The touch sensor of FIG. 19 includes the superposition of two sensor subsystems 1902, 1903 of the type of FIG. 18(*b*) and two sensor subsystems 1904, 1905 of the type of FIG. 18(*c*). There are two receive/transmit transducers 1906, 1907 each aimed at superposed reflector array 1908, 1909 containing three sets of reflectors.

With the aid of the principles of FIGS. 10 and 11, there are many options regarding acoustic modes. The choice of acoustic modes will affect the design of the reflective boundary at the top of the cylinder. If lowest order plate waves are used across the touch region, i.e. ZOHPS, lowest-order symmetric Lamb, or a flexural wave, the reflective boundary can simply be a machined edge as illustrated in FIG. 19(*a*). For other types of surface acoustic waves, reflective-array type reflective boundaries may be used.

If there is not mode conversion at the reflective arrays, then the reflector angles are 45° for the sensor subsystems of the type of FIG. 18(*c*), and the reflectors for the trapezoidal subsystems are at angles of $45°\pm\theta/2$ where $\tan(\theta)=\pi R/2H$. If mode conversion is desired, then the spacing-vector formula may be used to calculate reflector angles and spacings.

Note that a burst from a transducer will generate three signals. For some delay times, all three received signals will be active. Several approaches can be used to disentangle such simultaneously received signals.

Signals from the rectangular subsystems of the type of FIG. 18(*c*) are isolated. For these sigills, the receive transducer is the same as the transmit transducer, in contrast to the four signals from the trapezoidal subsystems of the type of FIG. 18(*b*). This is an example of using distinct receive transducers to separate signals generated by a common transmit pulse.

In trapezoidal sensor subsystems, for a given choice of transmit transducer (the other choice simply reverses the directions of the acoustic paths), a burst generates two signals in the same time window received by a common receive transducer. One approach here is to design the reflector spacings of the two sensor subsystems to correspond to two different operating frequencies. The frequency tuning of the receiver electronics is then used to separate the signals; the transmit burst may be broad band or a sequence to bursts at different frequencies.

Another approach is to use a phase-sensitive controller. The two simultaneously received signals are allowed to combine with an uncontrolled phase at the receiver. However, regardless of the relative phase between the two received signals, a touch attenuation in one signal will always be recognized by an amplitude change, or phase change, or both, of the combined signal.

Signal separation with a phase sensitive controller may result in an ambiguity in the identification of which perturbation in the combined signal corresponds to which component signal. See dotted ghost paths 1910 shown in FIG. 19(*b*). For the sensor of FIG. 19, such ambiguities can be easily resolved with the aid of the coordinate data from the rectangular sensor subsystems.

FIG. 19 is but one of many possible cylindrical sensor configurations. Other examples include systems with a touch surface on an inside surface of a cylinder; a single transducer with reflective array around full circumference; top and bottom arrays, side-by-side arrays with separate transducers rather than superposed arrays; etc.

Example 11

Figure 28:
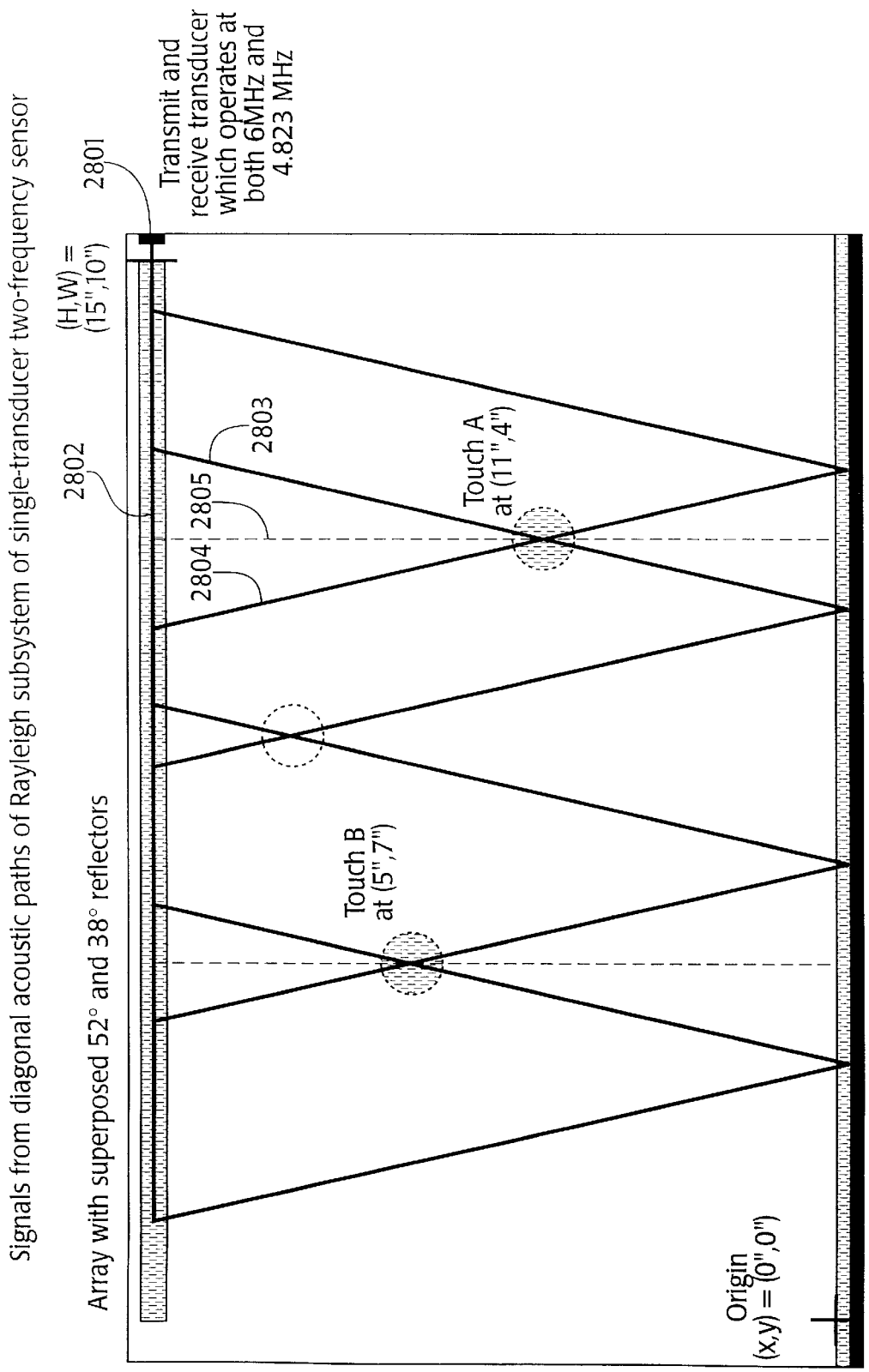
FIGS. 28(a) and 28(b) show a touch position sensor system having two non-orthogonal sets of wavepaths for waves of a single mode and a rectangular set of wavepaths for a third wave, and a timing diagram showing the relationship of received signals for two simultaneous touches, respectively, according to the present invention.
Figure 28:
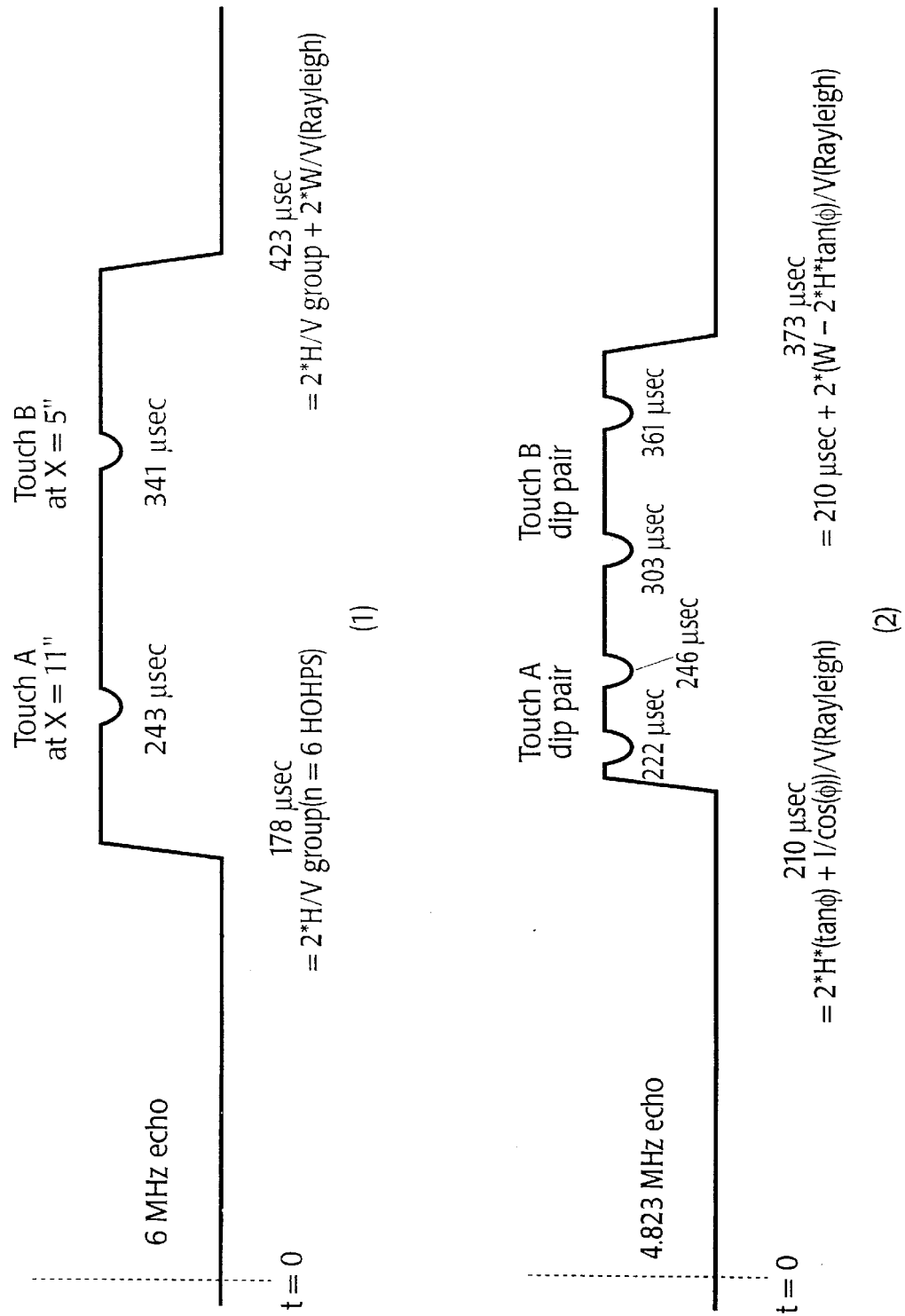
Figure 28:
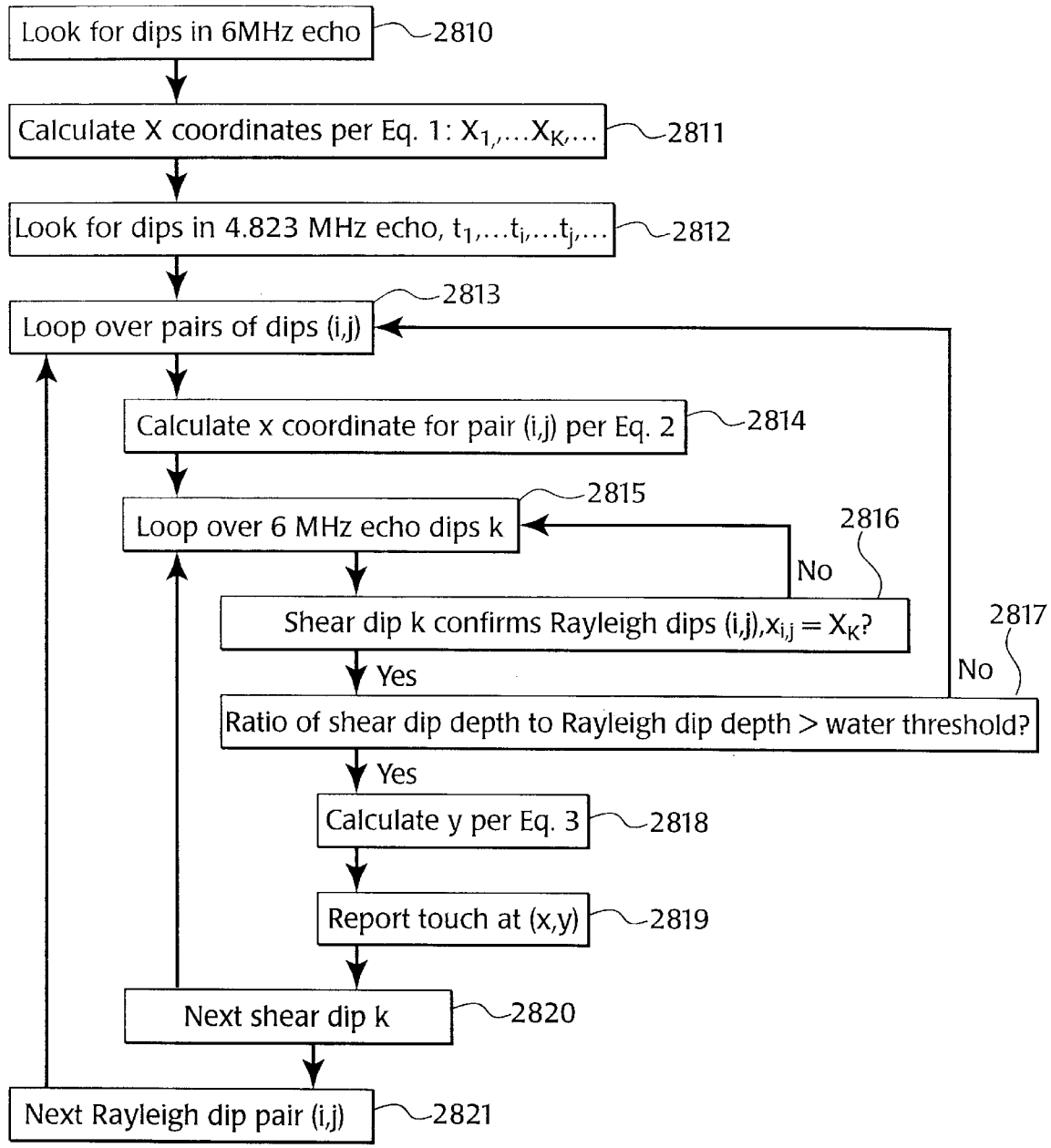

FIG. 28 shows a planar sensor system which faces the same types of ambiguities as the cylindrical sensor according to FIG. 19. In this embodiment, a single transducer 2801 and superposed reflective array 2802 generates and receives sets of waves 2803, 2804 traveling at an angle to one another. In this system, as shown in FIG. 28(*b2*), a single touch produces a pair of perturbations in a received signal. The average time delay for the pair of signal perturbations represents the distance along the array from the transducer, while the separation represents the distance from the bottom edge of the substrate. Note that a single sensor subsystem observes the touch twice due to the forward and backward wave paths. The embodiment of FIG. 28(*a*) includes a third set of wave paths 2805 which is orthogonal. In this case, one set of the reflective elements in the array 2802 is used to mode convert a Rayleigh wave emitted from the transducer to a HOHPS wave at right angles.

The sensor of FIG. 28(*a*) provides redundancy that may support anti-shadowing algorithms, multiple-touch algorithms, as well as dual-mode touch-characteristic algorithms.

FIGS. 28(*b*) and 28(*c*) further show that these three wavepaths may be used to determine the positions of a pair of touches. The method first looks for perturbations of the rectangular wave sets 2810. From these, the X coordinate is estimated 2811. Perturbations in the "W" shaped wavepaths are next determined 2812. An iterative loop 2813 is then commenced to review all pairs of perturbations. The average delay is calculated 2814. For each perturbation of the rectangular path 2815, the consistency of the "W" shaped paths is determined 2816. Further, since the rectangular wave is a shear wave and the "W" wave is a Rayleigh wave, the attenuation ratio may be determined to eliminate water droplet shadowing effects 2817. The confirmed touch position is then calculated 2818, and output 2819. Further rectangular path perturbations are then analyzed 2820, and then the iterative loop 2813 incremented 2821.

Example 12

The concepts of FIG. 10 generalize to non-planar, i.e. non-Euclidean, surfaces. On a non-planar surface, acoustic waves naturally travel on geodesics of the surface. For example, on a spherical surface, acoustic waves naturally follow great circles. The line segments of FIG. 10 therefore generalize to the geodesics of FIG. 20.

All three segments of the acoustic path shown in FIG. 20 are geodesics. The path parameter "s" can be any parameter that is smoothly and monotonically related to the arc length along the reflective arrays. The delay time as a function of the path parameter, t(s), can be determined by the sum of the arc lengths of the segments, each divided by the group velocity of its acoustic mode.

A closed analytic expressions for t(s) typically does not exist for a general complex curved surface. Once the geometry of the sensor is known or proposed, numerical calculations may be needed to calculate t(s) as well as the wave vectors needed by the spacing-vector formula to compute reflector angles and spacings as a function of s.

Reflector spacing and orientations are determined as a function of the array and path parameter s by considering a small quasi-planar neighborhood in which the scattering takes place, and then applying the wave vector analysis in the same way it is applied to planar coordinate subsystems. In this context, FIG. 11 represents a small quasi-flat region of a general curved surface. The spacing-vector formula is equally applicable to planar and non-planar sensors.

As shown in FIG. 17, FIG. 10 can be generalized to cases in which the acoustic paths encounter reflective boundaries. While not explicitly shown, the same is understood for FIG. 20. Reflective boundaries are no less applicable to non-planar surfaces as they are to planar surfaces, and in fact may advantageously be employed to increase options for sensor geometry or to simplify construction of the touch sensor.

As noted with FIG. 10, wave guiding effects can be used to design transmit and receive arrays that cause the corresponding acoustic paths to deviate from line segments. Likewise, FIG. 20 generalizes to cases in which the transmit and receive segments deviate from geodesics.

The principles of FIG. 20 enable numerous possible shapes for non-planar sensor design. A few examples follow. While there is pedagogic value to emphasize special cases which can be analyzed analytically, e.g., sections of a sphere, the scope of the present invention is not subject to such limitations.

Example 13

FIGS. 21(a) and (b) provides an example of a non-planar sensor. Here the touch surface is a section of a sphere, qualitatively corresponding to the Earth's surface between the equator and the arctic circle.

This sensor contains four sensor subsystems as follows.

A burst from transmit transducer T1 will be scattered at a 90° angle and proceed up a "line of longitude" until it is reflected by a reflective boundary near the top of the spherical cap, and retraces its path back to T1. This sensor subsystem covers a "twelve hour time zone". Similar acoustic paths starting and ending at transducer T2 provide a second sensor subsystem which covers the other "twelve hour time zone". Together, these two sensor subsystems provide a $\phi$ coordinate measurement where T1 senses a touch if $\phi$ is negative and T2 senses a touch if $\phi$ is positive.

Not shown in FIG. 21(a) are the "u" acoustic paths that start at transducer T1 and end at transducer R1. As shown in FIG. 21(b), at an angle u with respect to the T1/T2 transducer pair, the transmitted acoustic beam is scattered onto a great circle. This great circle is tilted with respect to the vertical by an angle θ and passes between the R1/R2 transducers and the polar hole. When it intersects the equator, it is scattered onto the equator and completes its journey to R1.

Shown in FIG. 21(b) is an acoustic path of the "v" system which is very similar to the "u" sensor subsystem. This time the burst comes from T2 and the signal is received at R2. The great-circle geodesic is again inclined at a tilt of angle θ, but this time goes between the T1/T2 transducers and the polar hole and the associated reflective boundary used by the $\phi$ sensor subsystems.

Neither the u or the v sensor subsystems cover the full touch region. However (neglecting possible dead regions due to the finite size of transducers), all points on the touch surface are covered either by the coordinate pair (u,$\phi$) or by (v,$\phi$). Two dimensional coordinates can be sensed for the entire touch surface with the aid of an anti-shadowing algorithm; here the shadows in question are due to the polar hole.

Looking at more detail at the sensor geometry, if any two of the three coordinates, $\phi$, u, v are measured, then the coordinates of the touch on the spherical cap, ($\Theta,\phi$) can be determined. Here we define the angle of the touch with respect to the vertical direction, $\Theta$, such that $\Theta=0$ on the "north pole" and $\Theta=90°=\pi/2$ at the "equator", where the arrays are situated. Possible measured values of $\Theta$ are in the range $0<\Theta<\pi/2$.

$\Theta=\arctan(\tan(\theta)/\sin(\Delta\phi))=\text{arccot}(\sin(\Delta\phi)\times\cot(\theta))$ where $\Delta\phi=(\pi-u-v)/2$ for $\phi>0$ $\Delta\phi=(u+v-\pi)/2$ for $\phi<0$ or $\Delta\phi=\phi-u$ for $\phi>0$ $\Delta\phi=|\phi|+u-\pi$ for $\phi<0$ or $\Delta\phi=\pi-\phi-v$ for $\phi>0$ $\Delta\phi=v-|\phi|$ for $\phi<0$ If $\phi$ is not measured directly, it can be determined from u and v as follows.

If $(u+v)<\pi$, then $\phi>0$ and $\phi=(u-v)/2+\pi/2$

If $(u+v)>\pi$, then $\phi<0$ and $\phi=(u-v)/2-\pi/2$

If $\phi$ and one of u and v is known, the other can be predicted as follows.

$u=2\phi+v-\pi$ for $\phi>0$ or $u=2\phi+v+\pi$ for $\phi<0$ $v=\pi+u-2\phi$ for $\phi>0$ or $v=-\pi+u-2\phi$ for $\phi<0$ The angles u and v have ranges between 0 and $\pi$ and are linearly related to delay times.

With the aid of the spacing-vector formula and the principles of FIG. 20, there are many options for the choice of acoustic modes. As a simple example, consider the case in which only one acoustic mode is used for all acoustic path segments. In this case, the equatorial arrays will include three sets of superposed reflector elements as follows: 45° reflectors with $n\lambda$ spacing; 45°-θ/2 reflectors with $n\lambda/(1-\sin(\theta))$ spacing; and 45°+θ/2 reflectors with $n\lambda/(1+\sin(\theta))$ spacing. Also, in this case, the reflective boundary may be formed of a set of concentric rings with a surface spacing of $\lambda/2$.

There are many substrate options: glass, aluminum, enamel-on-aluminum Love-wave substrate, etc. The choice of acoustic mode and substrate do not affect the sensor geometry except in determining the maximum size. For example 5.53 MHz Rayleigh waves on aluminum can support sizes with a diagonal dimension larger than 30 centimeters.

In a particular embodiment, a hemispheric aluminum dome is provided approximately 300 mm in diameter. Near the "equatorial" concave opening, a pair of reflective arrays are provided on the outer surface, each extending almost halfway around the hemisphere and nearly meeting at each side. On each end of each reflective array is provided an ultrasonic transducer, such as a piezoelectric ceramic element, which may be mounted on a wedge, to generate or receive an acoustic wave traveling parallel to the axis of the reflective array.

Near the apex of the dome, another reflective member is provided, having a diameter of approximately 100 mm. This apical reflector may be strongly reflective for perpendicular incident waves and weakly reflective for possible parasitic acoustic paths at other angles of incidence.

Each reflective array includes three sets of reflective elements:

1. 45° to axis of symmetry of hemisphere with spacing of $n\lambda$
2. 45°+θ/2 (35.5°) to the equatorial plane of the arrays with spacing of $n\lambda/(1-\sin\theta)$
3. 45°−θ/2 (54.5°) to the equatorial plane of the arrays with spacing of $n\lambda/(1+\sin\theta)$ Mirror reflection ambiguities in these reflection angles are resolved by considering the desired acoustic paths along with the angle-of-incidence-equals-angle-of-reflectance criteria. θ is the angle between the center of the hemisphere of the upper reflective member, about 26°.

In this case, portions of a wave transmitted from a first transducer along one of the pair of arrays are emitted along great circles of the hemisphere, which are then received by the other reflective array, following a path parallel to the reflective array to a receiving transducer. Other portions of the wave are directed directly toward the apical reflective member and back down toward the originating reflective array and originating transducer. Therefore, at any time, a wave emitted by one transducer is received by that same transducer as well as one receiving transducer associated with the other array. Therefore, both systems may be operative simultaneously to receive acoustic waves without substantial mutual interference. The transmit transducers T1 and T2 may emit acoustic bursts sequentially.

Alternately, these arrays may be shingled, inclined at a small angle to allow the transducer of one array to sit distal to an end of the other array. Of course, the angles and spacing of the array must be compensated for this inclination per the spacing-vector formula. In a preferred embodiment, the transducers are tucked just below the equator and the corresponding reflector arrays follow great circles that end pass just above the transducers at the opposite side.

Furthermore, there may be greater than two transducers and arrays, allowing a plurality of sensing waves to be emitted by a transducer and received by a plurality of transducers, according to the principles set forth herein.

It is noted that, on any substrate, and in particular in substrates which are nonplanar, the coordinate system employed to define the perturbation position need not be in a Cartesian or pseudo-Cartesian system, and therefore may be expressed in a polar coordinates, or in other terms. Further, in certain instances, extrinsic factors, such as an overlay or superimposed image may be used to define valid entries, and therefore the ambiguities in the input position are need not necessarily be fully resolved solely through acoustic wave perturbation analysis in every instance in order to provide a useful output.

Example 14

FIGS. 21(c) and 21(d) provide another example of a non-planar sensor utilizing the principles of FIG. 20. Again we consider a section of a sphere. This time the touch surface corresponds to everything north of the "Tropic of Cancer", and the region between the equator and the Tropic of Cancer is available for arrays and transducers. This system is described in further detail below.

The dome sensor shown in FIGS. 21(c) and 21(d) is hemispherical in shape. The touch region is above the "Tropic of Cancer" at 23.5° N latitude and is redundantly covered with no dead regions by three pairs of sensor subsystems. Arrays and transducers are placed in the region of the hemisphere between its base or equator and the Tropic of Cancer. The arrangement of transducers and arrays are shown in the flat-map projection given in FIG. 21(c). One of the six sensor subsystems is illustrated from a top view perspective in FIG. 21(d).

In the simplest embodiment with six sensor subsystems, each array arc in FIG. 21(c) corresponds to a single set of reflective elements forming an array. However, according to the present invention, it is noted that these arrays may be superposed to support additional sensor subsystems, and therefore each transducer may be associated with a plurality of wave paths, providing further redundancy. The simplest embodiment is described in more detail below.

Equally spaced around the equator are six pairs of transducers, one transmit and one receive. Each transducer pair supports one sensor subsystem. Each of the following three sensor-subsystem pairs fully cover the touch region above the Tropic of Cancer: R1/T1 and R4/T4; R2/T2 and R5/T5; and R3/T3 and R6/T6.

For clarity of presentation only, FIG. 21(c) shows a gap between the end of the transmit array for T1 and the receive array for R4, and likewise for other diametrically opposed transmit and receive transducers. In practice, it is desirable to extend both arrays so that there is an overlap. This assures that there is no dead region, and in fact an overlap between, for example, the R1/T1 sensor subsystem and the R4/T4 sensor subsystem. The overlapping portions of the arrays have reflector elements approximately mirror reflected with respect to the array axis.

Consider now in more detail an individual sensor subsystem, i.e., the R1/T1 sensor subsystem shown in FIG. 21(d), the transmit array follows a section of a great circle that intersects the X axis and is rotated by an angle Θ about the X axis with respect to the equatorial plane. The tilt angle, say Θ=20°, is less than the 23.5° latitude of the Tropic of Cancer.

In analyzing this array, let R be the radius of the hemisphere. Then the transmit array follows the following trajectory on the surface of the hemisphere.

$x(s)=R\cdot\cos(\pi s/2)$ $y(s)=R\cdot\sin(\Theta)\cdot\sin(\pi s/2)$ $z(s)=R\cdot\cos(\Theta)\cdot\sin(\pi s/2)$ The definitions used here for the x, y, and z directions are shown in FIG. 21(d). Similarly, the trajectory for the receive array is as follows.

$x(s)=R\cdot\cos(\pi s/2)$ $y(s)=R\cdot\sin(\Theta)\cdot\sin(\pi s/2)$ $z(s)=-R\cdot\cos(\Theta)\cdot\sin(\pi s/2)$ In these formulae, s is the path parameter which nominally varies from zero to one as the distances from the transducers increases. In this example, the array will start for a small positive value of s in order to make room for the finite sized transducer, and the array will end at a value of s slightly greater than one in order to provide the overlap between the sensor subsystem pairs discussed above.

Now consider the (θ,φ) coordinate system for the surface of the hemisphere defined by the following relations.

$-\pi/2 < \theta < \pi/2$ $0 < \theta < \pi$ $x(\theta,\phi) = R \cdot \cos(\theta) \cdot \cos(\phi)$ $y(\theta,\phi) = R \cdot \cos(\theta) \cdot \sin(\phi)$ $z(\theta,\phi) = R \cdot \sin(\theta)$ In terms of this coordinate system, the transmit array follows the trajectory:

$\theta(s) = \arcsin(\cos(\Theta) \cdot \sin(\pi s/2))$ $\phi(s) = \arctan(\sin(\Theta) \cdot \tan(\pi s/2))$ and the receive array follows the following trajectory:

$\theta(s) = -\arcsin(\cos(\Theta) \cdot \sin(\pi s/2))$ $\phi(s) = \arctan(\sin(\Theta) \cdot \tan(\pi s/2))$ The geodesic connecting the transmit and the receive arrays for the path parameter s is a segment of a line of longitude with respect to the z axis, namely the following section of a great circle.

$-\arcsin(\cos(\Theta) \cdot \sin(\pi s/2)) < \theta < \arcsin(\cos(\Theta) \cdot \sin(\pi s/2))$ $\phi = \arctan(\sin(\Theta) \cdot \tan(\pi s/2))$ There are many options regarding choice of acoustic modes, and the particular spherical configuration does not alter the general principles of the invention. Let us consider in more detail the case in which the same acoustic mode propagates along both the transmit and receive arrays with group velocity V, while the mode, perhaps different, traversing the touch region has the group velocity V'. The delay time as a function of path parameter is given as follows.

$T(s) = (R \cdot (\pi s/2))/V + 2R \cdot \arcsin(\cos(\Theta) \cdot \sin(\pi s/2))/V' + (R \cdot (\pi s/2))/V$ The delay time can also be expressed in terms of the coordinate $\phi$ of a touch which intercepts the acoustic path.

$T(\phi) = (2R/V) \cdot \arctan(\tan(\phi)/\sin(\Theta)) + 2R \cdot \arcsin(\cos(\Theta) \cdot \sin(\arctan(\tan(\phi)/\sin(\Theta))))/V'$ With this analytic expression, a look-up table may be calculated. Such a look-up table can be used in real-time microprocessor code to convert measured delay times of signal perturbations into the touch coordinate $\phi$.

More generally, while explicit mathematical analysis may be able to determine a touch location on the surface, this analysis is not necessary in some cases. Rather, the transducers produce a set of outputs for a given touch condition, e.g., a location. By empirically determining a signature of this touch condition, the controller will be able to determine when this input condition subsequently occurs. Further, with a number of such conditions determined, an interpolation or statistical determination of the condition of an input determined, even if it does not identically correspond to a previously determined input condition. A lookup table is one way to store the data. Alternately, the data may be stored as coefficients of a compensation algorithm for mapping the input space into a desired output space.

The transducer pairs R1/T1 and R4/T4 provide complete coverage of the touch coordinate $\phi$ over the entire touch region.

Similarly R2/T2 and R5/T5 provide measurement of a touch coordinate u which is an equivalent to $\phi$ except that the polar axis, while still in the x-z plane, is rotated 60° with respect to the z axis. Likewise R6/T6 and R3/T3 provide a touch coordinate v which is an equivalent to $\phi$ rotated −60°. The three coordinates $\phi$, u, and v provide redundant coverage of the dome sensor. In terms of x, y, and z coordinates, $\phi$, u, and v are defined by the following relations.

$\phi = \arctan(y/x)$ $u = \arctan\{y/[(1/2)x + (\sqrt{3/2})z]\}$ $v = \arctan\{y/[(1/2)x - (\sqrt{3/2})z]\}$ The touch coordinate $\theta$ can be determined from $\phi$, u as follows.

$\theta(\phi, u) = \arctan[2\cot(u) \cdot \sin(\phi)/\sqrt{3} - \cos(\phi)/\sqrt{3}]$ Likewise, the touch coordinate $\theta$ can be determined from $\phi$, v as follows.

$\theta(\phi, v) = -\arctan[2\cot(v) \cdot \sin(\phi)/\sqrt{3} - \cos(\phi)/\sqrt{3}]$ If $\theta(\phi, u)$ and $\theta(\phi, v)$ agree, then $(\phi, u, v)$ form a self consistent triple of delay times; the meaning of self consistency of a triple is discussed above, e.g., in connection with item 2403 of FIG. 24(a). Thus, this sensor supports anti-shadowing and multiple-touch/redundancy-check algorithms.

If we define $\delta\theta = \theta$, $\delta\phi = \phi - \pi/2$, $\delta u = u - \pi/2$, and $\delta v = v - \pi 2$, then the top dome sensor corresponds to the values $\delta\theta = 0$, $\delta\phi = 0$, $\delta u = 0$, and $\delta v = 0$. Taylor expanding the above relations about the top of the sensor gives the following approximate relations.

$\delta\theta = \delta\phi/\sqrt{3} - 2\delta u/\sqrt{3}$ $\delta\theta = -\delta\phi/\sqrt{3} + 2\delta v/\sqrt{3}$ $\delta\theta = (-\delta u + 2\delta v)/\sqrt{3}$ $\delta\phi = \delta u + \delta v$ Note the similarities for the planar hexagonal sensor of FIG. 15(b) where Y is the coordinate measured by the two sensor subsystems using transducers 1502, 1511, 1508 and 1505, U is the coordinate measured by the two sensor subsystems using transducers 1504, 1501, 1510 and 1507, V is the coordinate measured by the two sensor subsystems using transducers 1512, 1509, 1506 and 1503, and the c enter of the sensor corresponds to X=Y=U=V=0.

$U = -\sqrt{3}X/2 + Y/2$ or $X = +Y/\sqrt{3} - 2U/\sqrt{3}$ $V = \sqrt{3}X/2 + Y/2$ or $X = -Y/\sqrt{3} + 2V/\sqrt{3}$ $X = (-U + V)/\sqrt{3}$ $Y = U + V$ There is a quantitative analogy between X, Y, U, and V with $\delta\theta$, $\delta\phi$, $\delta u$, and $\delta v$ in the small quasi-flat region at the top of the sensor of FIG. 21(d). In this sense, The sensor of FIG. 21(d) is a non-planar generalization of the sensor of FIG. 15(b). Similarly, there are non-planar generalizations of other planar sensors geometries.

Reflector spacing and angles can be calculated using previously discussed principles. Let us refer again to this first sensor subsystem in FIG. 21(d). For the transmit array, the reflector spacing vector is $S=2\pi n(k_t(s)-k_p(s))/|k_t(s)-k_p(s)|^2$ where $k_t(s)$ and $k_p(s)$ can be calculated from the known array trajectory $(\theta(s), \phi(s))$ given above by the following expressions.

$$k_t(s)=(2\pi/\lambda)\cdot(-\sin(\pi s/2), \sin(\Theta)\cdot\cos(\pi s/2), \cos(\Theta)\cdot\cos(\pi s/2))$$

$$k_p(s)=(2\pi\lambda')\cdot(-\cos(\phi(s))\sin(\theta(s)), -\sin(\phi(s))\sin(\theta(s)), \cos(\theta(s)))$$

Here $\lambda$ represents the wavelength of the acoustic mode traveling along the transmit array and $\lambda'$ represents the wavelength traversing the touch region.

Note that the maximum acoustic path length for the sensor subsystems is $(2\pi-2\Theta)R$. For $\Theta=20°$, this becomes 5.585*R. For Rayleigh waves at 5.53 MHz on aluminum or borosilicate glass substrates, this means the dome sensor can have a radius in excess of 10 inches. Even larger sizes arc possible if a lower operating frequency is used, or other means are provided to reduce acoustic attenuation or tolerate weaker signal amplitudes.

Therefore, an application for the hemispheric dome sensor according to this embodiment is, for example, in an interactive museum environment. For example, a 20 inch (or a ½ meter) diameter borosilicate-glass dome sensor with a reverse-projection screen laminated on the back side may be provided. Star patterns of the night sky, or a section of the Earth's globe may be projected onto the sensor. This system could support a table-top hands-on planetarium or an interactive globe exhibit. The touch surface, arrays, and transducers may be placed on the concave side of the sensor; for example, an interactive touch sensitive aquarium portal may be provided, perhaps in combination with an ultrasonic fish finding/identification system, in which the user points to sea creatures that may swim by. Many other applications can be imagined.

Example 15

FIGS. 22(a) and 22(b) provide an example which illustrates the inherent geometric flexibility of the present invention. It shows a basin which may be thought of as a flattened and otherwise distorted hemisphere with a hole in it for a drain. Such a sensor geometry may be of interest as a basin perhaps containing a liquid. Furthermore the touch sensitive surface is on the inside rather than the outside. The reflective arrays 2201, 2202, 2203, 2204, 2205, 2206 are disposed with topological similarity to the hexagonal sensor of FIG. 15(b); there are six superposed arrays, each with one transmit 2207, 2208, 2209, 2210, 2211, 2212 and one receive transducer 2213, 2214, 2215, 2216, 2217, 2218. As with the hexagonal sensor of FIG. 15(b), a third set of reflectors may be superposed on each array to support sensor subsystems involving opposite pairs of arrays.

The sides of the basin 2200 are vertical at the locations of the transducers and arrays. Thus the intersection of a horizontal plane at the level of the transducers and arrays with the basin forms a geodesic loop. The acoustic paths along the arrays follow sections of this closed loop geodesic.

For the transmit and receive arrays of each sensor subsystem, we define the path parameter "s" to be arc length of the path along the array from the transducer array divided by the total arc length of the array.

Conceptually, the geodesic paths across the touch region for value s can be determined as follows. A string is anchored on the transmit array corresponding to the value of the path length parameter s. The string is looped over the convex surface of the basin 2200 so that it intersects the receive array at the location corresponding to the path length parameter s. The string is pulled taught, and the length of the string between the arrays and the directions of the string at both arrays is observed; this determines the path length of the geodesic across the touch sensitive zone as well as the directions of the wave vectors of the geodesic where scattering takes place on the transmit and receive arrays. In practice, this conceptual scheme serves as the mathematical basis of a computer simulation algorithm that solves the acoustic path geometry. In this manner, all relevant geometric information of FIG. 20 may be determined.

If the basin 2200 is very deep, e.g. not a flattened hemisphere but rather a stretched hemisphere, then the geodesics between the arrays might not pass through the desired touch region. In the string analogy, pulling the string tight may cause the string to slip off the desired touch zone. In this case, the design engineer can either flatten the basin geometry or introduce intermediate scatterings in the acoustic path with reflective boundaries.

For any choice of acoustic modes and substrate options, the principles of FIG. 20 and the spacing-vector formula allow calculation of reflector angles and spacings. As is typical of present commercial acoustic touchscreen design methods, modulation of array reflectivity (e.g., via reflector density, reflector height, or line width) can be determined iteratively by building prototypes, observing signal uniformity (or lack thereof), and improving the modulation of array reflectivity. Means are thus available to design reflector arrays for the sensor in FIGS. 22(a) and 22(b).

As an illustrative example, consider the following choice of acoustic modes and substrate. The basin 2200 is formed of aluminum with a thickness of 1 mm which smoothly increases to a thickness of 3 mm within a centimeter of the arrays and transducers. The inside of the aluminum basin is enamel coated, with an appropriate type and thickness of enamel to support Love waves at about 5 MHz, e.g. 100 microns of lead (or other heavy metal) based enamel. For the acoustic paths across the touch region, the lowest order Love wave is used. Along the reflective arrays, e.g., a third order symmetric Lamb-type wave as modified by the presence of the enamel coating propagates. The array reflectors are formed as modulations in an otherwise smooth inside surface of the aluminum basin and may be fabricated by milling, scribing, chemical etching, photoetching, photoresist, or stamping before application of the enamel coating. The transducers (coupling to the Lamb-type waves) are wedge transducers and are bonding to the outside or convex surface of the aluminum basin. Thus, both the transducers and reflective arrays are protected from the environment in the basin 2200.

Note that for this particular choice of modes and substrate, the basin 2200 can be partially or completely filled with water and still respond to and distinguish a touch due to a finger of sinilar perturbation that provides viscous damping at the touch surface.

From the perspective of perturbation analysis algorithm design, the drain pipe hole 2219 shown in FIG. 22(b) maybe regarded as a generalized "contaminant". In this regard, note that the sensor design of FIGS. 22(a) and 22(b) has sufficient redundancy to support anti-shadowing algorithms.

After a use of the wash basin or toilet is detected, a water flow or flush is manually or automatically initiated. In this case, the acoustic sensor may be used to determine when the bowl is emptied and cease water flow when the contents are evacuated. In the case of a toilet, which operates according to a fixed cycle, a minimal cycle may be preprogrammed, detecting when such a cycle is necessary, with repetition as required to fully evacuate the bowl. Otherwise, a rate or duration of water flow may be modulated. Thus, a closed loop washing or flushing cycle control is possible.

Applications of acoustic sensors such as the above applications demand sensor designs of complex non-planar geometry as is enabled by the present invention.

Example 16

In some cases it may be advantageous to use the same spacing vector of the same reflective array for more than one sensor subsystem. This further extends the design options within the scope of this invention.

As an illustrative example, consider a reflective array along the X direction with a single set of uniformly spaced 45° reflectors on a soda-lime glass substrate. The array is illuminated by a transmit transducer which generates Rayleigh waves at either 5 MHz with or 2.5 MHz. The Rayleigh wavelength is 0.025" at 5 MHz and 0.050" at 2.5 MHz. The spacing of the reflectors along the axis of the array is 0.100", that is, four Rayleigh wavelengths at 5 MHz and two Rayleigh wavelengths at 2.5 MHz.

The spacing vector for this reflective array is S=(-0.050", 0.050"). This spacing vcctol supports 90° scattering of Rayleigh waves at 5 MHz, 90° scattering of Rayleigh waves at 2.5 MHz. and, as discussed below, for certain discrete thickness of the glass substrate, scattering of 5 MHz Rayleigh waves at 71.56° into a plate wave.

The incident wave vector for Rayleigh waves is $k_I=(2\pi/\lambda, 0)$ is evaluated as $(251.3$ inch$^{-1}, 0)$ at 5 MHz and $(125.7$ inch$^{-1}, 0)$ at 2.5 MHz. The corresponding 90° reflected wave vectors $k_R$ are given by $(0, 251.3$ inch$^{-1})$ and $(0, 125.7$ inch$^{-1})$. In the spacing vector formula, the factor $2\pi (k_I-k_R)/|k_I-k_R|^2$ is evaluated as $(0.0125", -0.0125")$ at 5 MHz and $(0.025", -0.025")$ at 2.5 MHz. The spacing vector formula $$S = 2\pi n \, (k_I-k_R)/|k_I-k_R|^2$$

is satisfied with n=-4 at 5 MHz and n=-2 at 2.5 MHz. (Because reflector spacing is a unidirectional concept, the algebraic signs of S and n are physically irrelevant.)

Now consider the case of the incident Rayleigh wave at 5 MHz scattered into a plate wave at and a scattered plate wave 71.56°. Furthermore, the thickness of the substrate is adjusted to support a 5 MHz HOHPS plate wave with a wavelength of 0.0316 inches. In this case, the reflected wave vector may be calculated to be $k_R=(62.85$ inch$^{-1}, 188.49$ inch$^{-1})$ and the spacing-vector formula factor $2\pi (k_I-k_R)/|k_I-k_R|^2$ is evaluated as $(0.0167$ inch, $-0.0167$ inch$)$. In this case, the spacing vector formula is satisfied with n=-3.

The substrate thickness "b" supporting a HOHPS wave of order "n" of wavelength $\lambda_{HOHPS}$ is given by $$b = (n/2) \cdot \lambda_{HOHPS} \cdot \lambda_{ZOHPS} / \sqrt{(\lambda_{HOHPS}^2 - \lambda_{ZOHPS}^2)}$$

where at 5 MHz $\lambda_{ZOHPS}=0.0267$ inch. For example, at 5 MHz an n=4 HOHPS wave will have a wavelength of 0.0316 inch if the glass substrate has a thickness of 0.100 inches.

Signal equalization methods become more complex when the same spacing vector is used for more than one sensor subsystem; equalizing signals for one sensor subsystem may comprise signal uniformity for another sensor subsystem. In this context, equalization techniques such as line-width modulation are of interest. Unlike varying the reflector height, varying the line width may differentially affect the scattering amplitudes for different sets of waves. Note also that signal equalization techniques may be applied to any array or reflective boundary within a sensor subsystem.

This example illustrates a particular aspect of the invention, that the same spacing vector S an array may support more than on set of waves scattered.

Example 17

In this example we consider a feature of this invention from a touch-reconstruction algorithm perspective. This invention enables redundancy checks. Redundancy checks are important to algorithms with multiple-touch capability as well as being of value in their own right for rejection of false touches. Any sensor system in which a touch may be sensed by three or more sensor subsystems may utilize algorithms with redundancy checks. Below we first consider general principles of redundancy checks and then consider specific applications to specific sensor geometries.

FIG. 24(a) illustrates the basic blocks of a redundancy-check algorithm. This algorithm can either be used to provide enhanced rejection of false touches, resolve ambiguities due to multiple touches, resolve ambiguities due to sensor geometry, or any combination of the above.

The identification of significant perturbations 2401 and determination of delay times 2402 in FIG. 24(a) are implemented using techniques discussed above. Existing commercial products use a variety of signatures to identify significant signal perturbations worthy of further processing by touch recognition algorithm: sufficient amplitude change; reproducibility of perturbation of signal with repeat burst; time duration characteristics consistent with finger touch; etc. The time delays for significant signal perturbations are also easily calculated with a variety of averaging or centroid-finding methods to assign a unique time to perturbations of limited duration. Thus, these steps correspond to the low level signal processing and intermediate level perturbation extraction components of the control.

This scope of the present invention includes use of a phase sensitive controller and associated signal processing equipment to implement this low level signal processing. With appropriate controller electronics, signal processing algorithms can utilize perturbations in phase as well as amplitude to detect and interpret perturbations of the signal; see discussion of associated with FIG. 19. In some cases, use of a phase sensitive controller enables sensor designs in which signals from more than one sensor subsystem are simultaneously received by a single receive transducer and ambiguities exist as to which perturbation is associated with which sensor subsystem; in these cases redundancy check algorithms may be used to resolve these ambiguities.

The third box of FIG. 24(a), the identification of self-consistent triples 2403, is specific to sensors that can sense a touches with three or more sensor subsystems. (More generally, as illustrated by the sensor in FIG. 28(a), it is sufficient to have three independent delay times even if provided by less than three sensor subsystems.) Here the algorithm identifies self-consistent triples of delay times, e.g., perturbations of all three received signals may be consistently interpreted, within measurement errors, as corresponding to a common location on the two-dimensional touch surface. There are many choices for the algorithm details for testing for self-consistency. One option is to convert all delay times into coordinates and then check the consistency of the coordinates. Alternatively, two delay times may be used to calculate two coordinates and hence a touch position which in turn can be used to predict the third delay time; prediction and measurement for the third delay time are compared. In some cases, It is possible to check self-consistency of delay times without ever converting delay times to coordinate values. Other options exist. The essential ingredient is a test for self-consistency of three or more delay times with a single touch position on the touch surface.

The fourth box in FIG. 24(a) represents the processing of the identified self-consistent triples into a list of zero, one, or more touch coordinates in the desired coordinate system 2404. Several self-consistent triples may correspond to a single touch; this is typical when a touch is sensed by four or more sensor subsystems. The desired coordinate system for output of touch positions need not be directly related to the natural coordinate systems of the sensor subsystems. For example, in the spherical cap sensor of FIGS. 21(a) and 21(b), the (Θ,φ) coordinate system may be used to output coordinates despite the fact that Θ is not measured directly by any of the φ, u, or v sensor subsystems.

It is possible to combine the third and fourth boxes in various ways. For example, in a sensor for which a desired touch region is reliably sensed by four sensor subsystems, one may test candidate self-consistent quadruples of delay times. A self-consistent quadruple contains four self-consistent triples of delay times. While the block diagram of FIG. 24(a) emphasizes the minimal requirement of three measurements for a redundancy check for touches on a two-dimensional surface; it is implicitly understood that algorithms with the same net effect may be employed.

For a sensor designed to measure only one coordinate of a touch, then a redundancy algorithm may be possible with self-consistent doubles of delay times. For example, a sensor containing a Rayleigh-wave X sensor subsystem and a shear-wave X sensor subsystem, a redundancy-check may be based on a requirement that both sensor subsystems measure the same value of X within errors.

Now consider the X-Y-U sensor in FIG. 13 in more detail. FIG. 23 presents schematic signals from the sensor system according to FIG. 13, having a soda-lime substrate, propagating 5.53 MHz Rayleigh waves, and a touch at a location indicated in FIG. 13, namely 5.75 inches up and 5.75 inches across from the corner of the touch region having no transducers. Approximate delay times are given in FIG. 23 for this particular case.

The X-transmit-to-X-receive signal provides an X coordinate measurement. The Y-transmit-to-Y receive provides a Y coordinate measurement. The X-transmit-to-Y-receive signal and the Y-transmit-to-X-receive signal provide a U coordinate measurement. U is related to X and Y as follows.

$$U = -\sin(\Theta)X + \cos(\Theta)Y$$

The diagonal angle is Θ=30°, or more generally the inverse tangent of the sensor's aspect ratio.

Delay times, t, for each sensor subsystem are linearly related to X, Y, or U. If the corner of the active region with no transducers is defined as the origin, then the coordinates are related to delay times as follows.

$$X = W + H/2 - Vt/2$$

$$Y = H + W/2 - Vt/2$$

$$U = -W\sin(\Theta) \cdot (W + W/\cos(\Theta) - Vt)/(W + W/\cos(\Theta) - H) \text{ for X-to-Y-receive}$$

$$U = +W\sin(\Theta) \cdot (H + W/\cos(\Theta) - Vt)/(H + W/\cos(\Theta) - W) \text{ for Y-to-X-receive}$$

V is the group velocity for the acoustic mode used. For the touch position indicated in FIG. 13, the X coordinate is reconstructed from the perturbation at 205 microseconds in the X sensor subsystem, the Y coordinate is reconstructed from the perturbation at 155 microseconds in the Y sensor subsystem, and the U coordinate is reconstructed from the perturbation at 175 microsecond in the Y-to-X-receive sensor subsystem using the second of the U expressions above.

In practice, the constants in the equation above will typically be determined from a calibration procedure in order to properly account for various electronic offsets and path length effects due to the finite width of reflector arrays. The real value of formulas like those above is to provide a means to check that empirically derived linear mapping coefficients "make sense".

The 205, 155, and 175 microsecond delay times in FIG. 23 form a self-consistent triple for the 30° X-Y-U sensor of FIG. 13. This may be verified by reconstructing the X, Y, and U coordinates from the delay times, and then testing the resulting values with the following inequality.

$$|U - \sin(\Theta)X - \cos(\Theta)Y| < \epsilon$$

where ε is the measurement tolerance and Θ=30°. The tolerance ε is adjusted to be large enough to accommodate reasonable measurement errors and uncertainties and yet small enough to reject combinations of delay times derived from more than one touch. Its numerical value depends on many factors. In many cases the optimal value of ε will be in the range from 0.1 inches to 0.5 inches.

Using the linear relations between X, Y, and U to delay times, the inequality above may be re-expressed directly in terms of delay times. It is not necessary to convert delay times to coordinates to test for self-consistency of triples of delay times.

Another variation of the self-consistency check is to determine two coordinates, say X and Y, which may then be used to determine a point on the touch surface (X,Y), which in turn is used to predict a delay time for the third sensor system, say U.

Self-consistent triples may be used to resolve ambiguities due to multiple touches. For example, consider the case in which the sensor in FIG. 13 is subjected to two touches, on at location (X, Y) and the other at (x, y). Data from the X and Y signals can be interpreted as a pair of touches at (X,y) and (x,Y) as well as a pair of touches at (X,Y) and (x,y). However, only the (X,Y) and (x,y) interpretation will lead to self-consistent triples of delay times when X, Y, and U data is combined.

If the sensor of FIG. 13 is subjected to three simultaneous touches at locations (X,Y), (x,y), and (X',Y'), then there are six ways to interpret the X and Y signals: [(X,Y), (X',Y'), (x,y)]; [(X,Y), (x,Y'), (X',y)]; [(X,y), (x,Y'), (X',Y)]; [(X,y), (X',Y'), (x,Y)]; [(X,Y'), (x,Y), (X',y)]; [(X,Y'), (X',Y), (x,y)]. Again, using U coordinate data to identify self-consistent triples of delay times will uniquely identify the three touch positions. In principle, the same principle applies to any number of simultaneous touches. In practice, the finite resolution effects and overlapping of signal perturbations will result in practical limits in the number of simultaneous touches that can be sorted out. In any case, either instead or in addition to known techniques, the present invention enhances multiple touch capability.

Multiple touches may lead to cases in which one touch "shadows" another touch. For example, consider two simultaneous touches in the sensor of FIG. 13 in which the two touches have similar X coordinates but different Y and U coordinates. For best multiple-touch performance, the preferred embodiment is to use algorithms that incorporate the anti-shadowing algorithms along with the redundancy check methods presented in this example.

If four or more sensor subsystems sense a touch, then it is possible for more than one self-consistent triple of delay times to be associated with a touch. For example, with the X-Y-U-V sensor of FIG. 14, a touch may result in four self-consistent triples involving any of the following combinations of coordinates: (X, Y, U); (X, Y, V); (X, U, V); (Y, U, V). Alternate self-consistent triples for the same touch can be associated because they all lead to the same reconstructed two-dimensional touch location.

Without the φ sensor subsystems, of the sensor of FIG. 19 would still be able to reconstruct touch positions with the u and v sensor subsystems. However, such a reduced version of the sensor in FIG. 19 would be subject to ambiguities due to sensor geometry; see "ghost" touch indicated in FIG. 19B. This ambiguity is resolved with the addition of the φ sensor subsystems and the use of self-consistent triples.

Let us look at the sensor of FIG. 19 in more detail. From the delay times, one can determine the values of the coordinates u, v, and φ which are defined to be the angle in radians about the cylindrical axis from φ=0 to the point on the transmit array where the acoustic waves are scattered. Touch positions can be reconstructed from the u and v delay times. The cylindrical coordinates (φ,z) are determined by u and v by the following relations.

$$\phi=(u+v)/2 \bmod 2\pi$$

$$z=(H/\pi R)\times\{|[(\pi+u-v) \bmod 2\pi]-|\}$$

Now consider the case were the u and v signals are simultaneously received and disentangled with a phase-sensitive controller. If the phase-sensitive controller does not have means to identify which perturbation belongs with which of the simultaneously received signals, the acoustic paths labeled u' and v' provide an alternate interpretation of the signal data, which in turn leads to the reconstruction of the ghost touch location indicated in FIG. 19(b). This is an example of a discrete touch location ambiguity. However, note that (u,v,φ) will form a self-consistent triple while (u',v',φ) will not. The ambiguity is resolved.

Example 18

A touchscreen with multiple touch capability may be utilized as a 3-D input device.

For example, consider a transparent cylindrical sensor enclosing a three dimensional display having a rotating helical sheet within the cylinder upon which pixels are projected. In this case, two coordinate axes, h and φ, are easily obtained and interpreted from a touch. However, it would be desirable to be able to acquire touch information representative of the third axis, ρ, the radial distance from the axis of the devices. With the coordinates from two simultaneous touches, $(h_1, \phi_1)$ and $(h_2, \phi_2)$, there are many choices for a mapping to the three dimensional space (h, φ, ρ), e.g., (h, φ, ρ)=$([h_1+h_2]/2, [\phi_1+\phi_2]/2, R|\phi_2-\phi_1|)$ where R is the radius of the cylinder. With three touches, there is enough information (six parameters) to control both the position and orientation of the image of a solid body in three dimensional space.

In a particular embodiment of a cylindrical sensor for such an application, a borosilicate glass cylinder is provided having a height which equals its circumference, e.g., 15 inches. At a lower portion of the cylinder, three sets of side-by-side arrays are each provided, each array having an associated transducer. A first reflective array has reflectors at 22.5°, a second reflective array has reflectors at 45°, and a third reflective array has reflectors at 67.5°. Thus, three acoustic waves are generated, two of which having paths which are ±45° with respect to a central axis of the cylinder, with other having an axis parallel to the central axis of the cylinder. On the top of the cylinder, a single transmit transducer emits a pulse on a superposed array having three sets of reflectors. In this case, a four transducer system is implemented without any reflective arrays on a side portion. This system may be used, for example, as a touch interface for three dimensional displays having a rotating helical sheet within the cylinder upon which pixels are projected.

It is noted that these dual or multiple touch analyses are a result of the availability of ambiguity resolving data and a motivation for analysis thereof, and are not limited to cylindrical touchscreen systems. Therefore, systems which are flat, spherical sections, or of other geometry may be used as three or greater dimensional inputs.

Alternatively, a third axis may be obtained by analyzing an intensity of a touch, a so-called Z-axis. This Z-axis, however, has low resolution and may be difficult to control. Thus multiple-touch capability provides a more precise and reliable 3-D input means.

Example 19

The feasibility of anti-shadowing algorithms is an outstanding feature of sensor designs in which at least portions of the touch regions is sensed by three or more sensor subsystems. This enables enhanced sensor performance in the presence of contaminants as well as adding flexibility to sensor design options.

FIG. 25(a) is a generic flow chart for an anti-shadowing algorithm. In known sensors, loss of a coordinate measurement due to shadowing results in a failure or inability to reconstruct the two-dimensional position of the touch. Here shadowing refers to the disruption of the acoustic signal passing through the touch position due to contaminants, another touch, or obstacles intrinsic in the sensor design, at a location distal from the touch.

The first two boxes 2501, 2502 in FIG. 25 are the same as for FIG. 24 and are discussed above in that connection. They will not be discussed further here.

The third box refers to the pairing up of delay times corresponding to sensor subsystems with overlapping touch regions 2503. The fourth box calculates the positions of touch 2504. The basic feature of the anti-shadowing algorithm is that good data from two sensor subsystems is sufficient to reconstruct the position of a touch on a two-dimensional surface. It is not necessary for all sensor subsystems to make successful measurements. More generally if a touch is within the acceptance of N sensor subsystems, then an anti-shadowing algorithm may "pair up" 2, 3, . . . , or N−1 delay times.

Anti-shadowing algorithms use data from a third sensor subsystem to improve touch-detection efficiency. This contrasts with the redundancy-check algorithm in which data from a third sensor subsystem is used to improve false-touch rejection. If a touch is sensed by four or more sensor subsystems, then anti-shadowing and redundancy-check features are easily combined in the same algorithm. If only three sensor subsystems are available, more complex algorithms may be used that conditionally utilize anti-shadowing and redundancy-check features.

Now let us consider anti-shadowing algorithms in the context of specific sensor geometries.

Consider the X-Y-U sensor in FIG. 13 and the associated signals of FIG. 23. In this case, three pairings can be made, each of which allows the determination of the (X,Y) coordinates of the touch. Referring now to FIG. 23, the 205 microsecond X delay and the 155 microsecond Y delay allows determination of (X,Y) as is known. However, the 205 microsecond X delay can also be combined with the 175 microsecond Y-to-X delay. In this case the missing Y coordinate can be determined by the equation $$Y = +H + (H/W) \times X - \{H / [\sqrt{(H^2 + W^2)} + H - W]\} \times V \times t$$

where V is the acoustic group velocity (assuming all modes the same) and t is the Y-to-X delay time. Similarly, if the 155 microsecond Y delay is combined with the 175 microsecond Y-to-X delay, the missing X coordinate can be determined by the following equation.

$$X = -W + (W/H) \times Y + \{W / [\sqrt{(H^2 + W^2)} + H - W]\} \times V \times t$$

If the touch is in the zone covered by the X-to-Y sensor subsystem, then the corresponding equations are as follows.

$$Y = -H + (H/W) \times X + \{H / [\sqrt{(H^2 + W^2)} + W - H]\} \times V \times t$$

$$X = +W + (W/H) \times Y - \{W / [\sqrt{(H^2 + W^2)} + W - H]\} \times V \times t$$

The X-to-Y and the Y-to-X sensor subsystems are an example of sensor subsystems that do not have overlapping touch zones. The algorithm in FIG. 25 does not attempt to pair up delay times from such pairs of sensor subsystems.

In many cases the redundancy-check algorithm of FIG. 24(a) and the anti-shadowing algorithm of FIG. 25(a) can he combined. For example, consider the X-Y-U-V sensor oFt FIG. 14, in which a touch is typically sensed by four sensor subsystems. One coordinate measurement can be lost due to shadowing, and yet three coordinate measurements will remain to support an algorithm requiring a self-consistent triple of delay times.

The cylindrical sensor of FIG. 19 also provides an application for this type of analysis. As is evident from inspection of FIG. 19(b), any or the following three coordinate pairs, (u,v). (u,φ), and (v,φ), is sufficient to determine the (r, φ) coordinates of the touch.

The spherical cap sensors of FIGS. 21(a) and 21(b) and FIGS. 21(c) and 21(d) provide other examples. In these cases, any of the three possible coordinate pairs (u, v), (u, φ), and (v, φ) is sufficient to determine the (Θ, φ) coordinates.

For the sensor of FIGS. 21(a) and 21(b), the anti-shadowing algorithm is essential to assure two-dimensional touch reconstruction for the entire touch surface. The v sensor subsystem has a blind region to between the hole and the transducers R1 and R2; in this region (Θ,φ) coordinates are reconstructed from the (u,φ) sensor subsystem pair. Similarly the u sensor has a blind region between the hole and the transducers T1 and T1; in this region (Θ,φ) coordinates are reconstructed from the (v,φ) sensor subsystem pair.

Similarly, the anti-shadowing algorithm of FIG. 25(a) can be used to optimize touch performance of polygonal sensors such as the hexagonal sensor of FIG. 15(b) and large sensors such as the large rectangular sensor of FIG. 16(a).

In general, the redundancy-check algorithm of FIG. 24(a) and the anti-shadowing algorithm of FIG. 25(a) allow one to make beneficial use of sensor designs employing redundant coordinate measurements.

Example 20

If a touch is sensed with more than one acoustic mode, then an additional characteristic beyond touch position and "Z axis" touch pressure may be determined. Such information may be used, for example, to reject false touches due to water drops on the touch surface.

FIG. 26 outlines the basic parts of a dual-mode touch characteristic rejection algorithm. The first box, delay times from different sensor subsystems for a touch are associated as a byproduct of the touch-position reconstruction algorithms 2601; more generally, the first box represents the group of delay times from different sensors that correspond to a single touch regardless of whether the touch location is actually computed. The second box represents the determination of the magnitude of the signal perturbations for the delay times associated with the touch 2602; it may be that the magnitudes of the signal perturbations have already been calculated as part of a test of perturbation significance. Here it is assumed that not all signal perturbations involve the same acoustic mode in the touch region. In the third box the signal perturbations are compared with expected characteristics, e.g. ratios of perturbation amplitudes, of valid touches 2603.

FIG. 26 illustrates the basic features of a dual-mode algorithm. In practice, the dual-mode feature may be incorporated in various ways into algorithms that reconstruct touch positions, perhaps determine touch pressure, perhaps provide anti-shadowing and multiple features, etc. The essential feature here is the comparison with expectations of the relative magnitudes of coupling of two or more acoustic modes to a touch.

As an example, consider the sensor shown in FIG. 14 for an embodiment in which the X and Y sensor subsystems sense touches with a horizontally polarized shear wave (ZOHPS HOHPS, or Love), and in which the U and V sensor subsystems sense touches with an acoustic mode with vertical particle motion at the surface, such as Rayleigh and Lamb waves. To be more specific one may, for example. use a 0.090 inch thick soda-lime substrate at an operating frequency of 5.53 MHz for which the Rayleigh wavelength is 0.0226 inches where the U and V reflector angles and spacings are given in FIG. 13(b) and FIG. 14 and the X and Y reflector spacings are integer multiples of the Rayleigh wavelength and the X and Y reflector angles are about 52.5° as needed to couple Rayleigh waves to n=4 HOHPS waves traversing the touch region.

If such a sensor is subjected simultaneously to a water drop and a finger touch, due to viscosity damping, the finger touch will result in expected amplitudes of signal perturbations in both the (X,Y) and (U,V) subsystems. However due to the weak coupling of horizontally polarized shear waves to water, the (X,Y) signal perturbations due to the water drop will be weak while the (U,V) signal perturbations will be strong. The weak (X, Y) signal for the water drop will not be interpreted as a light finger touch because the corresponding (U,V) touch is strong. The ratios of signal perturbations for the same touch thus provides a characteristic of a touch that differentiates between water drops and finger touches. With empirically determined thresholds for such ratios, the algorithm can respond to finger touches and yet reject touches from water drops.

The algorithm of FIG. 26 has other uses besides water rejection. For example, such an algorithm can be used to verify that a user is properly wearing gloves provided that the type of glove is constructed of a material that has a ratio of radiation-damping to viscosity damping characteristics that is sufficiently distinct from bare finger touches. This feature could be used, for example, to assure compliance with safety procedures for equipment where the wearing of gloves is mandatory.

Example 21

A test reflective array is provided having continuously varying reflector angles, from 45° to 56° with respect to the axis of the array. Other ranges of reflector angles may also be of interest. This array serves to produce, at various portions of the substrate, increasing reflector angles that may be experimentally tested for mode-conversion scattering at 90° of an incident Rayleigh wave to a plurality of propagation modes. A useful feature of 90° scattering is that the reflector spacing along the axis of the array depends only the in incident mode and not the reflected mode. The reflective array acts as a diffraction grating, directing waves having varying phase velocities at different positions along the arrays.

It has been found that the optimal chevron angle from the axis of propagation of an incident Rayleigh wave for scattering at right angles, for a shear wave of n=0 is about 46°, n=1 is about 47–48°, n=2 is about 48°, n=3 is about 50°, n=4 is about 52–53°, and n=5 is about 56°, for glass thickness of 0.085" to 0.090", with increasing thickness tending to smaller angles. The ratio of the phase velocity of a Raleigh wave and an n=4 HOHPS is about 0.92.

Example 22

The output of a dual-mode algorithm as represented by FIG. 26 need not be limited to a simple pass/reject judgment on the nature of the touch. The dual-mode algorithm may categorize valid touches amongst a discrete set of categories, or even provide an analog measure of a touch characteristic.

"Dual-mode" algorithms need not be limited to the use of only two distinct acoustic modes. Use of three or more acoustic modes is also within the scope of this invention. In this context "distinct acoustic modes" may refer to the same acoustic mode at a significantly different frequencies, e.g. Rayleigh waves at 2 and 5 MHz. The essential feature is that not all sensor subsystems couple to a touch in the same way.

A dual-mode algorithm with a discrete-set output has application with sensor systems used with multiple styli. For example, a set of styli may be provided in which each stylus has a tip with a unique acoustic coupling properties. The unique acoustic coupling properties may be, for example, a particular ratio of coupling strength to Rayleigh-waves via dominant leaky-wave damping mechanism to the coupling strength horizontal-shear motion via viscous damping. When a user draws on the touch surface with a stylus, the dual-mode algorithm enables determination of the particular stylus used. For example, in an electronic white-board application, different styli may correspond to different colors; depending on whether the electronic white-board is combined with a display technology, the styli may or might not also double as markers applying physical (in contrast to "electronic") ink to the touch surface.

The dual-mode algorithm may be combined with other techniques to further categorize the nature of the touch. For example, the time duration of the touch perturbation may be used to help distinguish different styli via the size of the contact area between the sensor and the stylus tip, as is considered in claim 10 of European Patent Application 9411927.7. The stylus tip may be vibrated at a signature frequency, e.g. 100 Hz, in order to modulate the magnitude of the touch perturbation is a fashion that can be recognized by a controller algorithm. These and other methods may be combined with the dual-mode algorithm to more reliability or more completely characterize the nature of a touch perturbation.

Here "stylus" generalizes to anything that results in a touch. For example, consider an acoustic sensor per this invention built into the bottom of a drip pan. More particular imagine that liquid drops are sensed by both ZOHPS and flexural (lowest-order anti-symmetric Lamb) waves. The ratio of ZOHPS to flexural perturbation magnitudes is larger for a high viscosity oil drop than a low viscosity gasoline drop.

As an example of an analog output of a dual-mode algorithm, consider again the above drip-pan application. The ratio of ZOHPS signal perturbation, a measure of viscosity, to the flexural wave perturbation, a measure of leaky-wave attenuation which is weakly dependent on viscosity, is a measure of viscosity. Hence with a dual-mode algorithm, this invention supports viscosity measurement. It is known that blood-count is strongly correlated with blood viscosity, so a "drip pan" blood-count sensor may provide a portable sensor with fast response; in this case the sensor substrate may be a glass slide and the operating frequency may be above 5 MHz to reduce size and increase resolution.

In a blood drop viscosity measurement system, the reflective arrays may be formed as a screened frit on the glass slide or as an etched or ground structure. However, where the slide is disposable, the transducers may be provided separately and as a part of a permanent fixture. Thus, the transducers are pressed tightly against the glass during testing to couple the acoustic waves, without a permanent adhesive bond.

Example 23

Figure 32:
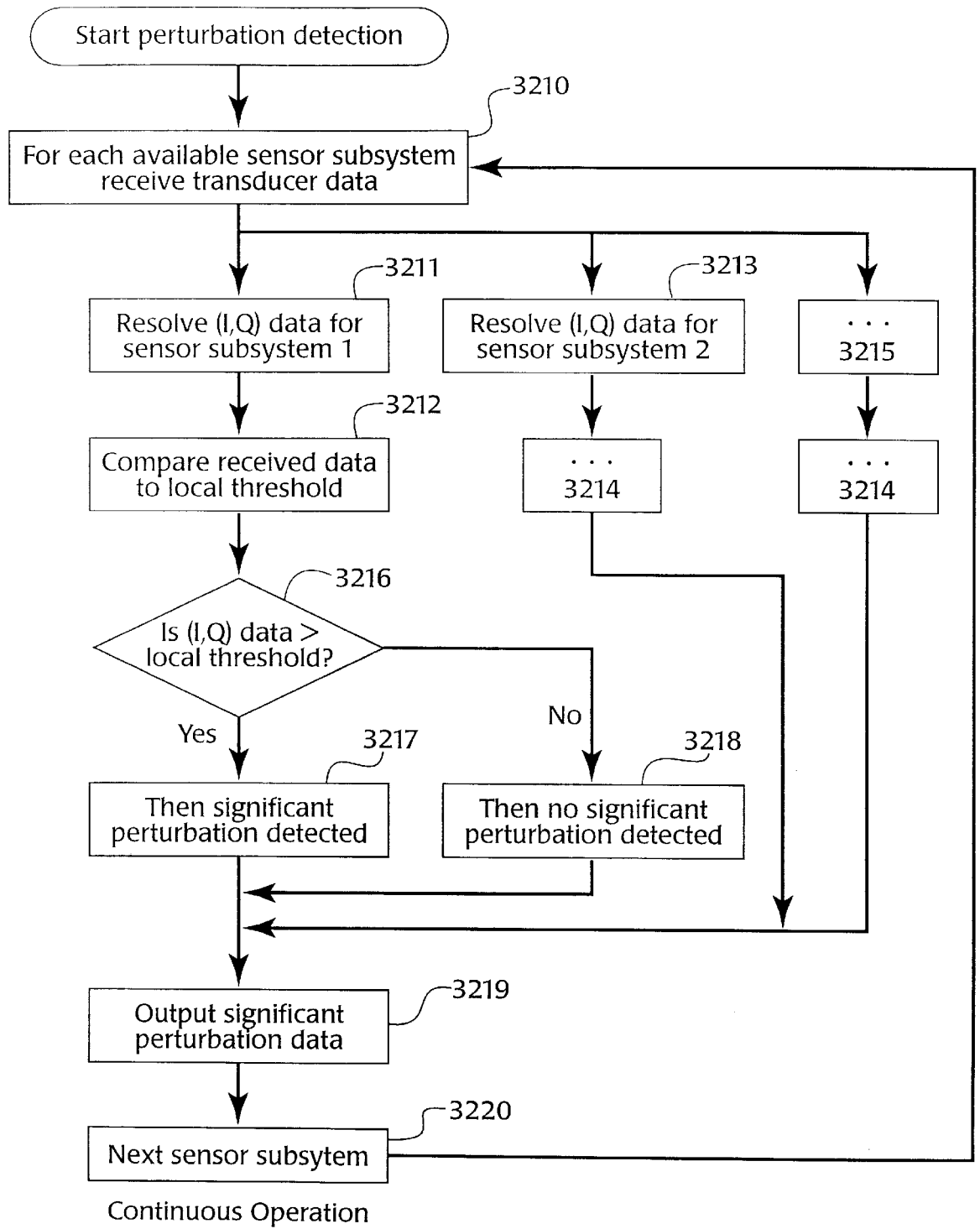
FIGS. 32(a)(1), 32(a)(2), 32(b), and 32(c) show flow diagrams of portions of a sensor system control sequence demonstrating many aspects of the present invention.
Figure 32:
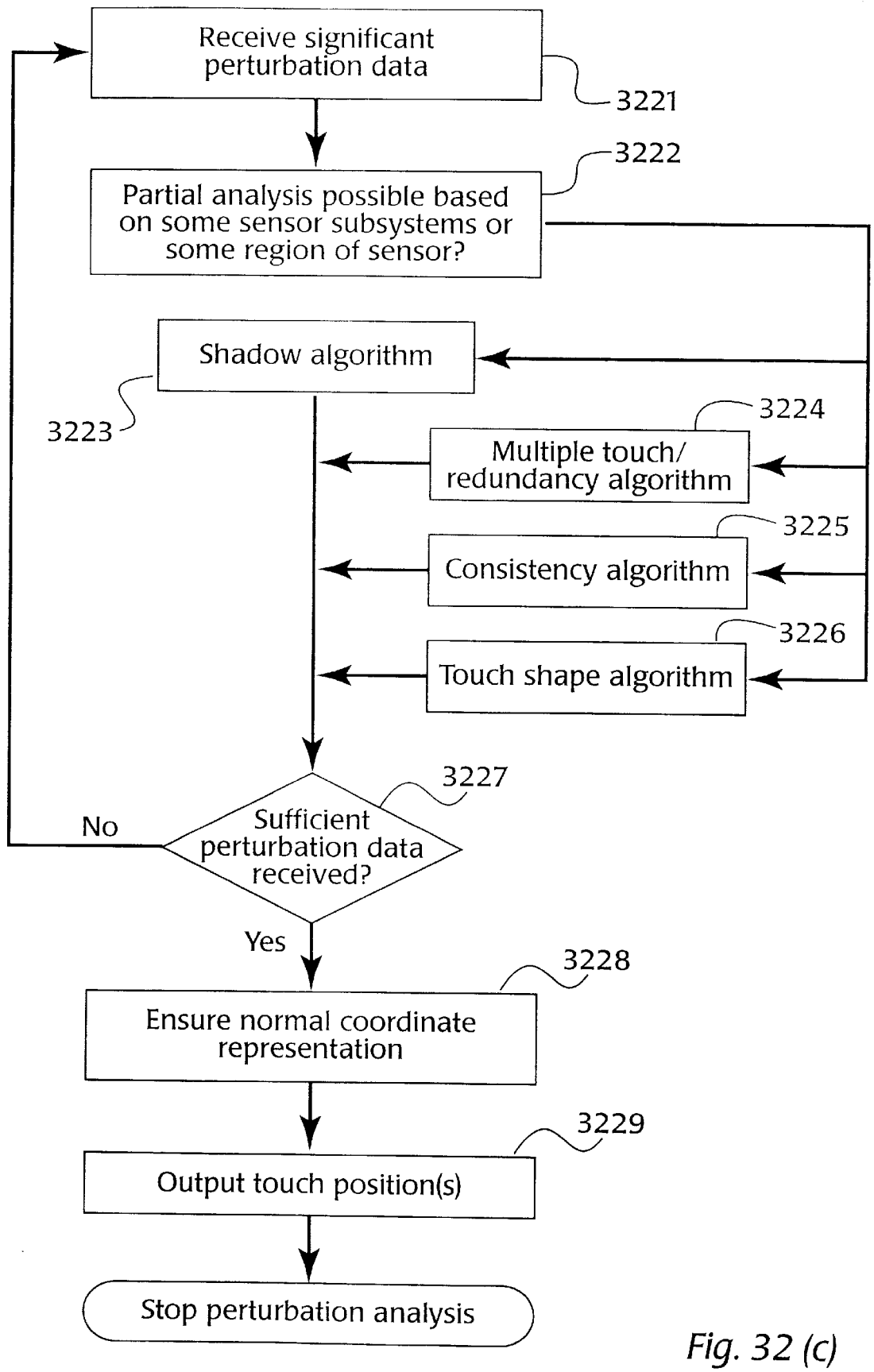

As shown in FIGS. 32(*a*)(1) and 32(*b*)(2), an adaptive threshold determination scheme may be implemented with regional variations to optimize the sensitivity of the touchscreen without causing undue errors. This adaptive threshold scheme has two slightly different aspects. First, during initialization, the system rapidly acquires sufficient data to allow perturbation detection. Then, after initialization, the threshold is adaptively updated, excluding portions of the sensor for which significant perturbations are detected.

Thus, the system initially seeks to determine a baseline input 3201, presumably in the absence of touch, for each available subsystem. During initialization, the system may also detect and ignore significant transient perturbations which may be due, for example, to premature touches, and thus the processing scheme for the first and second aspects of the adaptive baseline processing may be merged. The baseline characteristics are stored 3202. It is noted that this baseline characteristic data is generally stored separately for each sensor subsystem of the device. Based on the stored baseline characteristics for each sensor subsystem, a statistical analysis of the normal variations, instability and noise may be made, which may provide a basis for setting a margin between the normal baseline and a threshold 3203. The threshold may vary based on a signal space of the sensor subsystem, based on the baseline stability in a given region of the sensor or time delay after transducer excitation 3204. In a normal operational mode, the baseline is determined 3206, without reference to detected perturbations 3205, and adaptively updated 3207. In addition, the baseline stability characteristics 3208 and threshold 3209, which may each vary based on a position or region of the sensor, and for each available sensor subsystem, are also adaptively updated.

According to the present invention, a single emitted acoustic wave may give rise to a plurality of received signals, representing different transducer subsystems. Therefore, as shown in FIG. 32(*b*), a received signal may be analyzed for resolution of information relating to a plurality of sensor subsystems 3211, 3213, 3215. The system will generally sequentially measure the signals from each available sensor subsystem 3210. However, in some cases, available redundancy may allow the sensor to operate in the absence of data from one or more sensor subsystems. Further, at any given point in time, sufficient data may be available for certain analyses, even though a complete mapping of the sensor for each subsystem is not complete.

If the received signal is above the threshold for a given position and subsystem 3212, which, for example in a phase sensitive receiver embodiment, is evaluated 3216 as $\sqrt{((\Delta I)^2 + (\Delta Q)^2)}$—Threshold (position, subsystem)>0, further analysis ensues 3217. Otherwise, no perturbation is deemed detected 3218, and the system continues to receive and analyze further data, e.g., from the next sensor subsystem 3220. On the other hand, if the data from a sensor subsystem is superthreshold, a significant perturbation is detected, and this information passed 3219 to higher level, baseline analysis, or other algorithms.

As shown in FIG. 32(*c*), after data for some or all available sensor subsystems is obtained from the perturbation detection algorithm 3221, a determination may be made whether sufficient data is available to proceed with analysis 3222, which may differ for the various algorithms. Further analysis of the perturbations according to the present invention may then be performed, as appropriate, including an anti-shadow algorithm 3223, a multiple touchiredundancy algorithm 3224, and a consistency algorithm 3225. Normally, the size and shape of a perturbation will also be analyzed 3226, to allow an optimal output coordinate to be calculated. If sufficient perturbation data is received and analyzed 3227, which as stated above need not include all the data, or data from each sensor subsystem, then a further process ensures that a coordinate representation of the perturbation(s) are normalized into a desired output coordinate space 3228. The actual normalization or coordinate transformation may be performed at various points in the process, and indeed various portions of the process may operate in different spatial representations of the perturbation position(s). The normalized coordinate representations are then output 3229. The perturbation analysis is a continuous process, analyzing each significant perturbation. Thus, the processes set forth in FIGS. 32(*a*)(1), 32(*a*)(2), 32(*b*) and 32(*c*) may proceed independently and asynchronously, except where data from one process is required for operation of the other process.

The present invention therefore extends the field of acoustic touchscreens by describing such systems which innovate the mechanical construction, receiver electronics and or logical processing systems, for the purpose of providing, among other advantages, increased flexibility in packaging and configuration, improved performance, and the ability to process multiple perturbations simultaneously. It should be understood that the preferred embodiments and examples described herein are for illustrative purposes only and are not to be construed as limiting the scope of the present invention, which is properly delineated only in the appended claims.

What is claimed is:

1. A substrate for an acoustic touch sensor system comprising:

an acoustically transmissive medium having a surface with a touch sensitive region having at least one side;

at least two reflective arrays, disposed parallel to one another and on the same side of the touch sensitive region, together having a two dimensional Fourier transform with at least two useful spacing vector components.

2. The substrate according to claim 1, wherein said two useful spacing vector components are for waves scattering at different angles.

3. The substrate according to claim 1, wherein said two useful spacing vector components are for waves of differing frequencies.

4. The substrate according to claim 1, wherein said two useful spacing vector components include at least one acoustic wave mode conversion.

5. The substrate according to claim 1, wherein said reflective arrays are superposed.

6. An acoustic sensor comprising:

an acoustically transmissive medium, having at least one surface adapted for sensing proximity of an object;

at least two sets of acoustically reflective elements formed on said medium, each set of elements having at least two elements and forming a respective reflective array having at least one useful spacing vector component of its two-dimensional Fourier transform, a spacing vector of a first reflective array being non-orthogonal and non-identical to a spacing vector of a second reflective array.

7. The sensor according to claim 6, wherein said two useful spacing vector components are for waves scattering at different angles.

8. The sensor according to claim 6, wherein said two useful spacing vector components are for waves of differing frequencies.

9. The sensor according to claim 6, wherein said two useful spacing vector components include at least one acoustic wave mode conversion.

10. The sensor according to claim 6, wherein said reflective arrays are superposed.

11. The sensor according to claim 6, wherein said reflective arrays are not disposed coaxial or perpendicular relative to each other.

12. The sensor according to claim 6, wherein said medium comprises glass.

13. The sensor according to claim 6, wherein said reflective elements comprise raised acoustically reflective material formed on a surface of said medium.

14. The sensor according to claim 6, further comprising an electronic control adapted to receive and distinguish acoustic waves corresponding to a spacing vector of said first reflective array and a spacing vector of said second reflective array to detect a characteristic of the object.

15. The sensor according to claim 6, further comprising an electronic control system for receiving acoustic waves corresponding to a spacing vector of said first reflective array and a spacing vector of said second reflective array, said electronic control system analyzing said received acoustic waves in acoustic wave phase sensitive manner.

16. The sensor according to claim 6, further comprising an electronic control adapted to receive and distinguish acoustic waves corresponding to a spacing vector of said first reflective array being different from a spacing vector of said second reflective array to detect the object.

17. A touch sensor comprising:

an acoustic wave transmissive medium having a surface, at least a portion of said surface being adapted for sensing a proximity of an object; and an array, associated with said medium, having a plurality of spaced elements for scattering portions of an incident acoustic wave as waves each having a different propagation vector than said incident acoustic wave, and passing other portions unscattered, said array being situated along a path, said array having associated propagation vectors of scattered portions of the acoustic wave which are not substantially perpendicular to the incident acoustic wave over the array, said path being distinct from a segment parallel and adjacent to a side of a rectangular region of a small solid angle section of a sphere.

18. A method of forming an acoustic sensor comprising:

providing an acoustically transmissive medium having at least one surface adapted for sensing proximity of an object;

forming on the medium an array, having a plurality of spaced elements for scattering portions of an incident acoustic wave as waves each having a different propagation vector than said incident acoustic wave, and passing other portions unscattered, said array being situated along a path, said array having associated propagation vectors of scattered portions of the acoustic wave which are not substantially perpendicular to the incident acoustic wave over the array, said path being distinct from a segment parallel and adjacent to a side of a rectangular region of a small solid angle section of a sphere.

19. The method according to claim 14, wherein said forming step comprises depositing acoustically reflective material on a surface of the medium.

\* \* \* \* \*